United States Patent
Kaneko et al.

(10) Patent No.: US 8,618,537 B2
(45) Date of Patent: Dec. 31, 2013

(54) SEMICONDUCTOR DEVICE AND METHOD FOR MANUFACTURING THE SAME

(75) Inventors: Kishou Kaneko, Kanagawa (JP); Naoya Inoue, Kanagawa (JP); Yoshihiro Hayashi, Kanagawa (JP)

(73) Assignee: Renesas Electronics Corporation, Kawasaki-shi, Kanagawa (JP)

(*) Notice: Subject to any disclaimer, the term of this patent is extended or adjusted under 35 U.S.C. 154(b) by 166 days.

(21) Appl. No.: 13/067,386

(22) Filed: May 27, 2011

(65) Prior Publication Data

US 2011/0309353 A1 Dec. 22, 2011

(30) Foreign Application Priority Data

Jun. 22, 2010 (JP) ................................. 2010-142003
Jan. 20, 2011 (JP) ................................. 2011-010002

(51) Int. Cl.
*H01L 29/10* (2006.01)

(52) U.S. Cl.
USPC ............... 257/43; 257/E29.296; 257/E21.477

(58) Field of Classification Search
USPC ............................. 257/43, E21.477, E29.296
See application file for complete search history.

(56) References Cited

U.S. PATENT DOCUMENTS

| 2010/0051936 | A1  | 3/2010 | Hayashi et al. |
| 2010/0065837 | A1  | 3/2010 | Omura et al. |
| 2010/0148171 | A1* | 6/2010 | Hayashi et al. ................. 257/43 |

FOREIGN PATENT DOCUMENTS

| JP | 2008-166716 A    | 7/2008 |
| JP | 2010-021170 A    | 1/2010 |
| WO | WO 2008/069255 A1 | 6/2008 |

OTHER PUBLICATIONS

Gang Xiong et al. "Control of p- and n-type conductivity in sputter deposition of undoped ZnO", App. Phys. Lett., vol. 80, No. 7, Feb. 18, 2002.
Minkyu Kim et al. "High mobility bottom gate InGaZnO thin film transistors with SiOx etch stopper", App. Phys. Lett., vol. 90, 212114(2007).
Hisato Yabuta et al. "High mobility thin-film transistors with InGaZnO channel fabricated by room temperature rf-magnetron sputtering", App. Phys. Lett., vol. 89, 112123(2006).
Chang Jung Kim et al. "Highly Stable Ga2O3-In2O3-ZnO TFT for Active-Matrix Organic Light-Emitting Diode Display Application", IEEE Electron Devices Meeting, IEDM '06, Technical Digest, session 11.6, 2006.
M. Ofuji et al. "Integrated circuits based on amorphous indium-gallium-zinc-oxide-channel thin-film transistors", ECS Transactions, 3(8)293-300(2006).
Elvira M. C. Fortunato et al. "Wide-bandgap high-mobility ZnO thin-film transistors produced at room temperature", App. Phys. Lett., vol. 85, No. 13, Sep. 27, 2004.
Jae Chul Park et al. "High performance amorphous oxide thin film transistors with self-aligned top-gate structure", IEDM. Tech. Dig, session 8.4, pp. 191-194(2009).

* cited by examiner

*Primary Examiner* — Timor Karimy
(74) *Attorney, Agent, or Firm* — McGinn IP Law Group, PLLC

(57) ABSTRACT

A semiconductor device includes, in a first region over a semiconductor substrate, a first insulating layer, a first wiring, a second insulating layer, a third insulating layer, and a via and a second wiring embedded in the second insulating layer and the third insulating layer through a barrier metal, and includes, in a second region, the first insulating layer, a gate electrode, the second insulating layer, a semiconductor layer located, the third insulating layer, and a first electric conductor and a second electric conductor embedded in the third insulating layer so as to sandwich the gate electrode in a position overlapped with the semiconductor layer in a plan view through a barrier metal and coupled to the semiconductor layer through the barrier metal.

21 Claims, 51 Drawing Sheets

| OXYGEN CONCENTRATION (%) | 12% | 16% | 20% |
|---|---|---|---|
| MOBILITY $\mu_H$ (cm$^2$/Vs) | 25.9 | 7.95 | 13.5 |
| CARRIER DENSITY (cm$^{-3}$) | $2.23 \times 10^{17}$ | $1.17 \times 10^{19}$ | $5.28 \times 10^{19}$ |

FIG. 23
WITHOUT ANNEALING
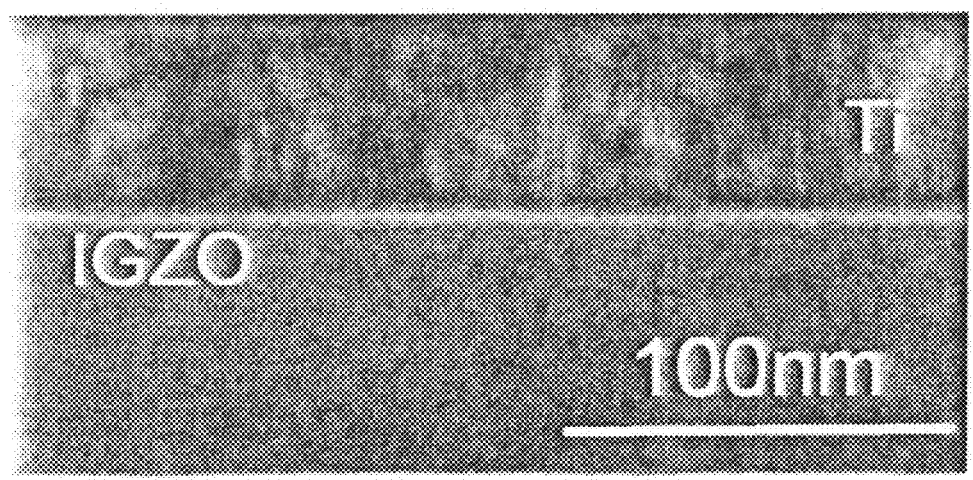
WITH ANNEALING

FIG. 26A
HM-SiO2 PROCESS
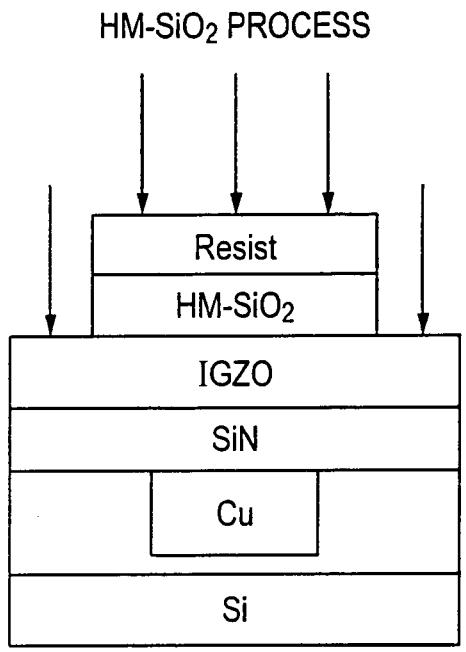
FIG. 26B
IGZO CHANNEL ETCHING PROCESS USING HM-SiO2
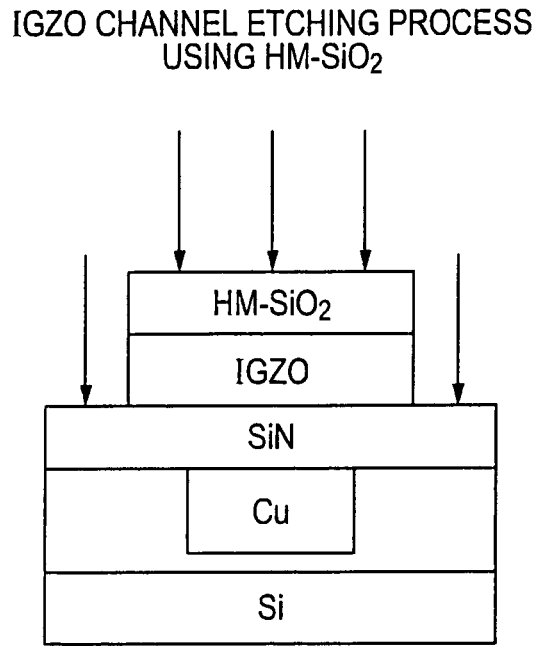
FIG. 27
| STRUCTURE | GAS COMPOSITION (sccm) | SELECTIVITY |
|---|---|---|
| (1) HM-SiO2 / IGZO (AT HM PROCESS) | $CF_4/Ar = 90/45$ | 17 |
| (2) IGZO / HM-SiO2 (AT IGZO PROCESS) | $Cl_2/BCl_3/N_2 = 40/20/40$ | 1.7 |
| (3) IGZO / SiN (AT IGZO PROCESS) | $Cl_2/BCl_3/N_2 = 40/20/40$ | 1.6 |

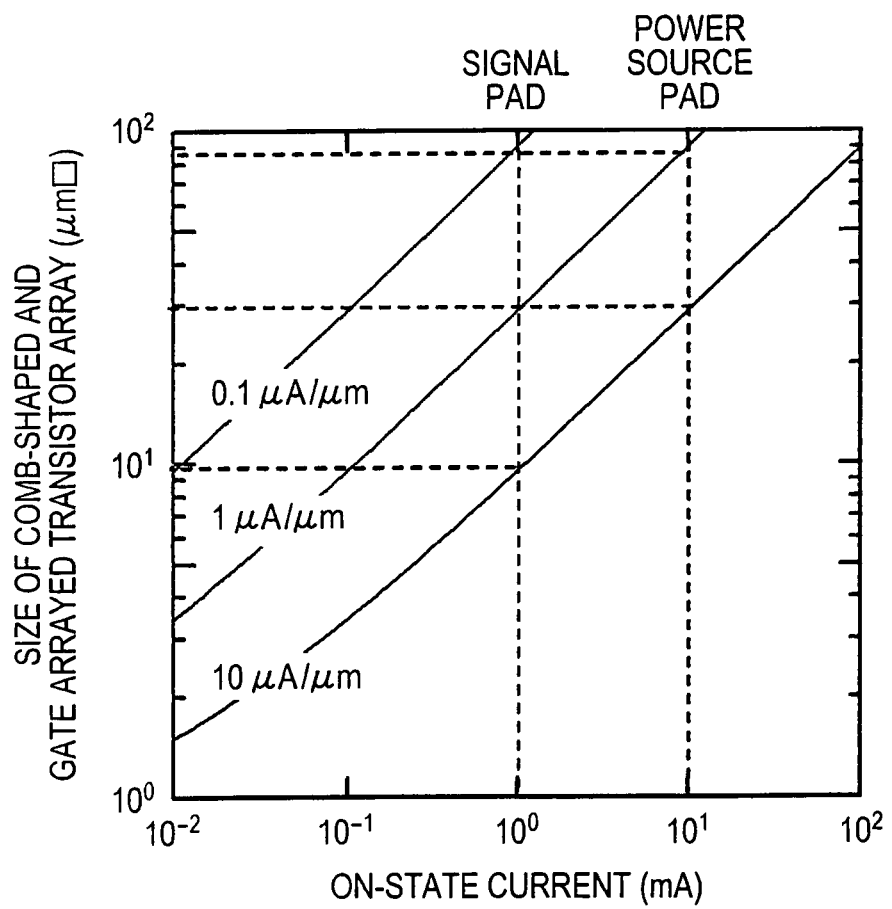

OVERLAP 0.16 μm

OVERLAP 0 μm

OVERLAP −0.16 μm

THIS DISTANCE DETERMINES BREAKDOWN VOLTAGE. SINCE THE CLOSEST DISTANCE IN THE ABOVE TWO STRUCTURES CORRESPONDS TO SiN FILM THICKNESS AND THE DISTANCE IS NOT DIFFERENT, THE BREAKDOWN VOLTAGE IS NOT CHANGED WHEN DESIGNS ARE DIFFERENT.

SEMICONDUCTOR DEVICE AND METHOD FOR MANUFACTURING THE SAME

CROSS-REFERENCE TO RELATED APPLICATIONS

The disclosure of Japanese Patent Application No. 2010-142003 filed on Jun. 22, 2010 and No. 2011-10002 filed on Jan. 20, 2011 each including the specification, drawings and abstract is incorporated herein by reference in its entirety.

BACKGROUND

The present invention relates to a semiconductor device and a method for manufacturing the same.

A common semiconductor device has a structure in which a semiconductor element such as a transistor is formed over a semiconductor substrate and multiple wiring layers are formed over this transistor. In such a semiconductor device, layout of the semiconductor element formed over the semiconductor substrate is designed based on functions required for the semiconductor device.

In recent years, as described in Japanese Patent Application Laid-Open Publication No. 2008-166716; Japanese Patent Application Laid-Open Publication No. 2010-021170; "Control of p- and n-type conductivity in sputter deposition of undoped ZnO", Gang Xiong and other five researchers, App. Phys. Lett., Vol. 80, No. 7, 18 Feb. 2002; "High mobility bottom gate InGaZnO thin film transistors with SiOx etch stopper", Minlyu Kim and other eight researchers, App. Phys. Lett., Vol. 90, 212114 (2007); "High mobility thin-film transistors with InGaZnO channel fabricated by room temperature rf-magnetron sputtering", Hisato Yabuta and other eight researchers, App. Phys. Lett., Vol. 89, 112123 (2006); "Highly Stable $Ga_2O_3$—$In_2O_3$—ZnO TFT for Active-Matrix Organic Light-Emitting Diode Display Application", Chang Jung Kim and other nine researchers, IEEE Electron Devices Meeting, IEDM '06, Technical Digest, session 11.6, 2006; "Integrated circuits based on amorphous indium-gallium-zinc-oxide-channel thin-film transistors", M. Ofuji and other eight researchers, ECS Transactions, 3(8)293-300 (2006); "Wide-bandgap high-mobility ZnO thin-film transistors produced at room temperature", Elvira M. C. Fortunato and other six researchers, App. Phys. Lett., Vol. 85, No. 13, 27 Sep. 2004; and "High performance amorphous oxide thin film transistors with self-aligned top-gate structure", Jae Chul Park and other eighteen researchers, IEDM. Tech. Dig., session 8.4, pp. 191-194 (2009), formation of a thin-film transistor using a compound semiconductor layer has been studied.

SUMMARY

If functions of a semiconductor device can be changed without changing layout of a semiconductor element formed over a semiconductor substrate, plural types of semiconductor devices having functions different from each other can be manufactured using the same semiconductor substrate. In this case, manufacturing cost of the semiconductor device can be reduced. On the other hand, there is a certain limit to changing functions of the semiconductor device only when configuration of a wiring layer is changed, because only wirings, capacitance elements, fuses and the like are formed in the wiring layer over the semiconductor substrate. Therefore, the functions of the semiconductor device can be substantially changed without changing the layout of the semiconductor elements formed over the semiconductor substrate, if an element having new functions can be formed in the wiring layer.

According to one aspect of the present invention, a semiconductor device includes, in a first region over a semiconductor substrate: a first insulating layer located over the semiconductor substrate a first wiring embedded into the surface of the first insulating layer; a second insulating layer located over the first insulating layer; a third insulating layer located over the second insulating layer; and a via and a second wiring embedded into the second insulating layer and the third insulating layer through a barrier metal and coupled to the first wiring, and further comprising, in a second region over the semiconductor substrate: the first insulating layer located over the semiconductor substrate; a gate electrode embedded into the surface of the first insulating layer; the second insulating layer located over the first insulating layer; a semiconductor layer located over the second insulating layer; the third insulating layer located over the semiconductor layer; and a first electric conductor and a second electric conductor embedded into the third insulating layer so as to sandwich the gate electrode in a position overlapped with the semiconductor layer in a plan view through a barrier metal and coupled to the semiconductor layer through the barrier metal is provided.

In addition, according to another aspect of the present invention, a method for manufacturing a semiconductor device, includes the steps of: forming a first insulating layer over a semiconductor substrate; embedding a conductive material into the first insulating layer to form a first wiring and a gate electrode; forming a second insulating layer over the first insulating layer after the step above; selectively forming a semiconductor layer in a region overlapped with the gate electrode in a plan view over the second insulating layer; forming a third insulating layer over the semiconductor layer and the second insulating layer; embedding a conductive material into the third insulating layer through a barrier metal so as to sandwich the gate electrode in a position overlapped with the semiconductor layer in a plan view to form a first electric conductor and a second electric conductor coupled to the semiconductor layer through the barrier metal, and at the same time, embedding a conductive material into the second insulating layer and the third insulating layer through a barrier metal to form a via and a second wiring coupled to the first wiring through the barrier metal is provided.

Moreover, a method for manufacturing a semiconductor device includes the steps of: forming a first insulating layer over a semiconductor substrate; embedding a conductive material into the first insulating layer to form a first wiring and a gate electrode; forming a second insulating layer over the first insulating layer after the step above; forming a semiconductor layer over the second insulating layer; selectively forming a hard mask comprising one or more of SiN, $SiO_2$ and SiCOH in a region overlapped with the gate electrode in a plan view over the semiconductor layer; and performing dry etching of the semiconductor layer using the hard mask as a mask is provided.

In the semiconductor device of the present invention, the semiconductor element is formed in the same layer of the wiring layer and the semiconductor element can function as a transistor acting as a switching element. Accordingly, functions of the semiconductor device can substantially be changed without changing the layout of the semiconductor element formed over the semiconductor substrate.

According to the present invention, an element having the new functions can be provided in the wiring layer. As a result, functions of the semiconductor device can be substantially changed without changing the layout of the semiconductor element formed over the semiconductor substrate.

BRIEF DESCRIPTION OF THE DRAWINGS

FIG. 23 is a diagram describing operation and effect of the semiconductor device of the present embodiment;

FIGS. 26A and 26B are diagrams describing operation and effect of the semiconductor device of the present embodiment;

FIG. 27 is a diagram describing operation and effect of the semiconductor device of the present embodiment;

FIG. 35 is a diagram describing operation and effect of the semiconductor device of the present embodiment;

DETAILED DESCRIPTION

Embodiments of the present invention will be described in detail with reference to the drawings. All of the structural drawings below schematically show embodiments of the present invention. Unless otherwise stated, dimensions of the structures according to the present invention are not determined by ratios of component parts on the drawings. Similar signs are numbered to similar component parts and descriptions are arbitrarily omitted.

First Embodiment

Figure 1:
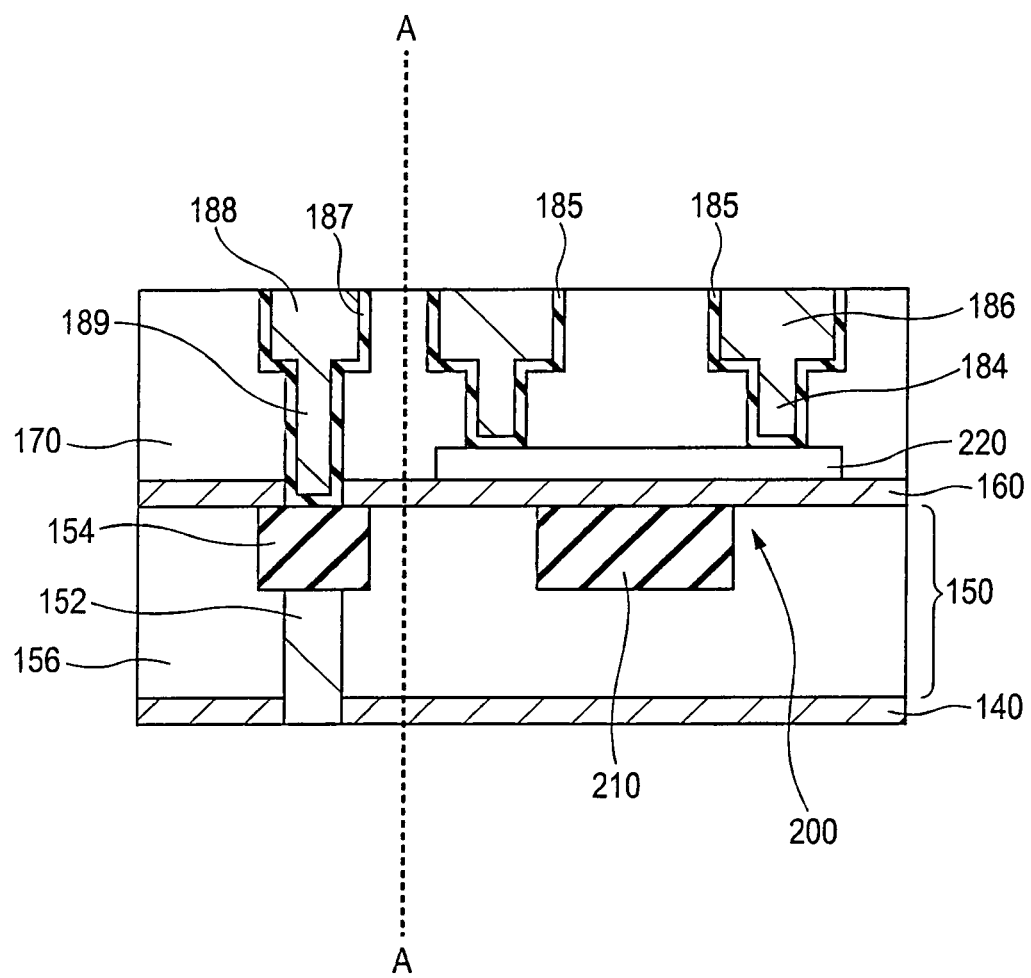
FIG. 1 is a cross-sectional diagram schematically showing one example of the semiconductor device of the present embodiment.
Figure 2:
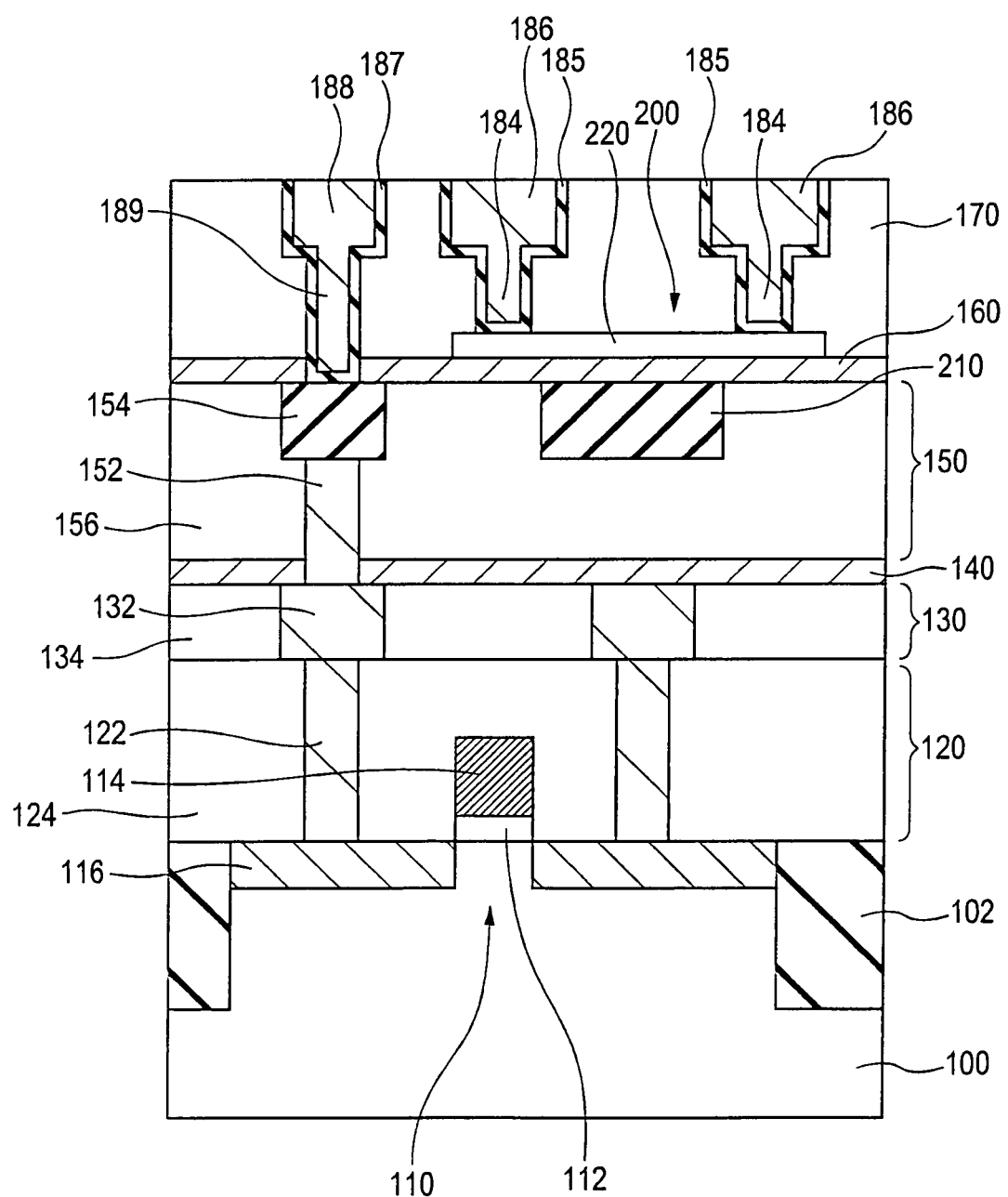
FIG. 2 is a cross-sectional diagram schematically showing one example of the semiconductor device of the present embodiment.
Figure 3:
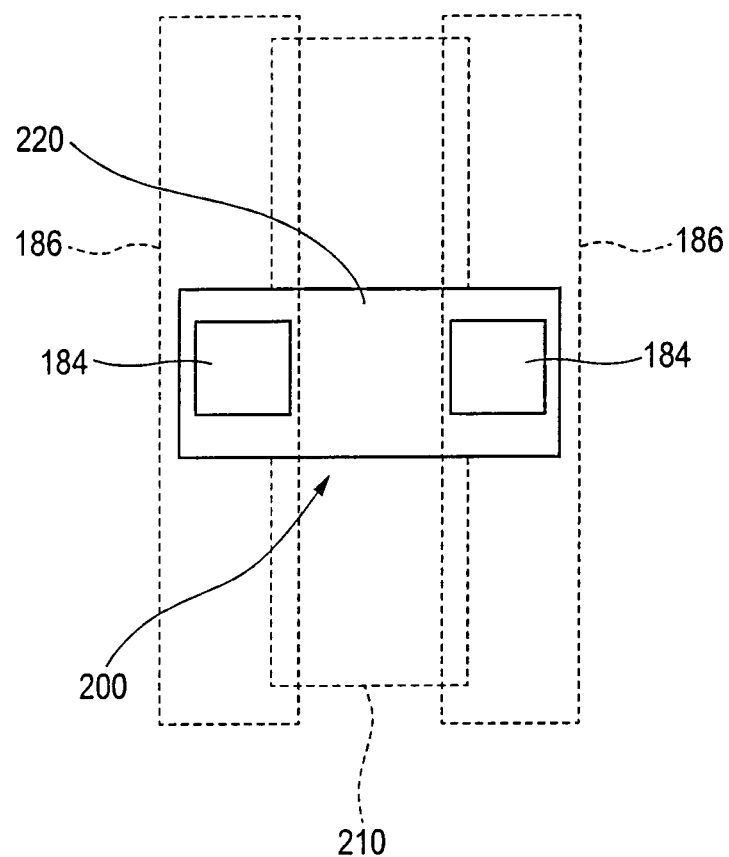
FIG. 3 is a plain diagram schematically showing one example of the semiconductor element which the semiconductor device of the present embodiment has.

FIG. 2 is one example of a cross-sectional diagram of a semiconductor device according to the first embodiment. FIG. 1 is one example of an expanded cross-sectional diagram of a substantial part of FIG. 2, and is a diagram showing a configuration of a semiconductor element 200 which the semiconductor device shown in FIG. 2 has. FIG. 3 is one example of a plan diagram showing a plan layout of the semiconductor element 200.

As shown in FIG. 1, the semiconductor device of this embodiment includes, in a first region (a left-side region from a dash line of A-A), a first insulating layer 156 located over a semiconductor substrate 100 (not shown in FIG. 1), a first wiring 154 embedded into the surface of the first insulating layer 156 and a via 152 coupled to the first wiring 154. In the aforementioned region, the semiconductor device of this embodiment comprises a second insulating layer 160 located over the first insulating layer 156 and a third insulating layer 170 located over the second insulating layer 160, and further includes a via 189 and a second wiring 188 embedded into the second insulating layer 160 and the third insulating layer 170 through a barrier metal 187 and coupled to the first wiring 154.

In addition, the semiconductor device of this embodiment includes, in a second region (a right-side region from the dash line of A-A in FIG. 1), the first insulating layer 156 located over the semiconductor substrate 100 (not shown in FIG. 1); a gate electrode 210 embedded in a surface of the first insulating layer 156; the second insulating layer 160 located over the first insulating layer 156; a semiconductor layer 220 located over the second insulating layer 160; and the third insulating layer 170 located over the semiconductor layer 220. In the aforementioned region, the semiconductor device of this embodiment includes a first electric conductors 184, 186 and a second electric conductors 184, 186 embedded into the third insulating layer 170 so as to sandwich the gate electrode 210 in a position overlapped with the semiconductor layer 220 in a plan view through a barrier metal 185. The first electric conductors 184, 186 and the second electric conductors 184, 186 are coupled to the semiconductor layer 220 through the barrier metal 185.

Here, the semiconductor element 200 shown in the second region (the right-side region from the dash line of A-A in FIG. 1) functions as a transistor. More specifically, the semiconductor element 200 has the semiconductor layer 220, a gate insulating film (the second insulating layer 160) and the gate electrode 210. Moreover, the barrier metal 185 coupled to the semiconductor layer 220 include a source electrode and a drain electrode. A region sandwiched between two regions coupled to each of two barrier metals 185 over the semiconductor layer 220 is a semiconductor channel region.

The first insulating layer 156 is, for example, a low dielectric constant insulating layer having lower dielectric constant (for example, a relative dielectric constant is 2.7 or lower) than that of silicon oxide. For the low dielectric constant insulating layer, for example, carbon-containing films such as a SiOC(H) film and SiLK (registered trademark); a HSQ (hydrogen silsesquioxane) film, a MHSQ (methylated hydrogen silsesquioxane) film, a MSQ (methyl silsesquioxane) film or a porous film thereof can be used.

The first wiring 154 and the gate electrode 210 are formed in the same layer as shown FIG. 1. The first wiring 154 and the gate electrode 210 can be comprised of the same material. Moreover, the first wiring 154 and the gate electrode 210 can be formed by the same treatment. For example, Cu can be used for the first wiring 154 and the gate electrode 210 as a main component, and the first wiring 154 and the gate electrode 210 can be embedded into the first insulating layer 156 by the same treatment using a damascene method. A width of the gate electrode is, for example, 50 nm or more and 500 nm or less.

The second insulating layer 160 functions as a diffusion prevention film as well as the gate insulating film which is described above. The second insulating layer 160 is provided over the approximately whole surface of the first wiring layer 150. The second insulating layer 160 as described above is, for example, a SiN film, a $SiO_2$ film or a SiCN film and a thickness thereof is 10 nm or more and 50 nm or less.

A thickness of the semiconductor layer 220 is, for example, 50 nm or more and 300 nm or less. The semiconductor layer 220 has an oxide semiconductor layer such as InGaZnO (IGZO), InZnO (IZO), ZnO, ZnAlO or ZnCuO. The semiconductor layer 220 may be a single-layer structure of the above-described oxide semiconductor layer, or may be a stacked structure of the above-described oxide semiconductor layer and other layers. As an example of the latter case, there is a stacked structure of $IGZO/Al_2O_3/IGZO/Al_2O_3$ in the order from the top. The semiconductor layer 220 may be a polysilicon layer or an amorphous silicon layer. A region coupled to the barrier metal 185 over the semiconductor layer 220 (hereinafter referred to as a "contact region") may be treated with reduction plasma (for example, hydrogen plasma) or nitrogen-containing plasma (for example, ammonia plasma). When the former treatment is performed, an oxygen defect region is formed in the contact region, while, when the latter treatment is performed, nitrogen is selectively introduced to the contact region. As a result, contact resistance to the barrier metal 185 is reduced.

The third insulating layer 170 is the low dielectric constant insulating layer as described above or an oxidized film of silicon.

The barrier metal 185 and the barrier metal 187 can be comprised of the same material. Moreover, the barrier metal 185 and the barrier metal 187 can be formed by the same treatment. As materials for the barrier metal, for example, Ti, Ta, Ru, W, nitrides thereof and oxides thereof are possibly included. The barrier metal 185 and the barrier metal 187 may be a single layer comprised of these materials or a stacked layer made by stacking two or more layers. Examples of the stacked layers include a stacked structure such as TiN (an upper layer)/Ti (an lower layer) or TaN (an upper layer)/Ta (an lower layer).

The via 189, the second wiring 188, the first electric conductors 184, 186 and the second electric conductors 184, 186 can be comprised of the same material. Moreover, these can be formed by the same treatment. The aforementioned material possibly includes, for example, Al, Cu or the like. A part shown as 184 of the first electric conductors 184, 186 and the second electric conductors 184, 186 may have a larger diameter than that of the via 189. In an example shown in this diagram, the part shown as 184 is completely overlapped with the semiconductor layer 220 in a plan view. However, the part may be partially overlapped with the semiconductor layer 220 in a plan view.

Planar shapes of the first electric conductors 184, 186 and the second electric conductors 184, 186 are not particularly limited. For example, the part shown as 184 in the diagram may be formed similar to the via 189 in the first region and the part shown as 186 may be formed similar to the second wiring 188 in the first region. The first electric conductors 184, 186 and the second electric conductors 184, 186 form a source and a drain of the semiconductor element 200 through the barrier metal 185. The first electric conductors 184, 186 and the second electric conductors 184, 186 do not completely penetrate the second insulating layer 160. On the contrary, the via 189 in the first region completely penetrates the second insulating layer 160.

A combination of materials for the first electric conductors 184, 186 and the second electric conductors 184, 186 and the barrier metal 185 is not particularly limited, and every combination can be selected. For example, the first electric conductors 184, 186 and the second electric conductors 184, 186 include Al or Cu and the barrier metal 185 includes one or more element or compound of Ti, Ta, Ru, W and nitrides or oxides thereof.

Subsequently, configuration of other parts of the semiconductor device of this embodiment will be described using FIG. 2.

As shown in FIG. 2, the semiconductor element 110 of a MOS transistor type (the on-substrate element) is formed in the semiconductor substrate 100. The semiconductor element 110 functions as a transistor or a capacitance element, and includes the gate insulating film 112, the gate electrode 114 and an impurity region 116 which is a source and a drain. An element region where the semiconductor element 110 is formed is separated by an element isolation film 102. At least a part of the semiconductor element 110 is overlapped with the semiconductor layer 220 in a plan view. The semiconductor element 110 may be electrically coupled to the semiconductor element 200 (a wiring layer element) through a wiring. The aforementioned precondition is similar to all of embodiments described below.

In an example shown in FIG. 2, a contact layer 120 and a wiring layer 130 are formed between the first wiring layer 150 and the semiconductor substrate 100. The wiring layer 130 is located over the contact layer 120. The contact layer 120 has an insulating layer 124 and a contact 122, and the wiring layer 130 has an insulating layer 134 and a wiring 132. The wiring 132 is coupled to the semiconductor element 110 through the contact 122. The wiring 132 is coupled to the first wiring 154 through the via 152 formed in the first insulating layer 156.

The insulating layer 124 is, for example, a silicon oxide layer, and the insulating layer 134 is, for example, the low dielectric constant insulating layer as described above. A diffusion prevention film 140 such as a SiCN film is formed between the wiring layer 130 and the first wiring layer 150. The semiconductor element 110 is electrically coupled to a semiconductor element 200.

Subsequently, a method for manufacturing the semiconductor device according to this embodiment will be described using FIGS. 2, 4A, 4B and 5.

First, as shown in FIG. 2, the element isolation film 102 is formed in the semiconductor substrate 100, and then the gate insulating film 112, the gate electrode 114 and the impurity region 116 are further formed in this order. Subsequently, the contact layer 120, the wiring layer 130 and the diffusion prevention film 140 are formed. Until these steps, these components can be realized according as related arts.

Figure 4A:
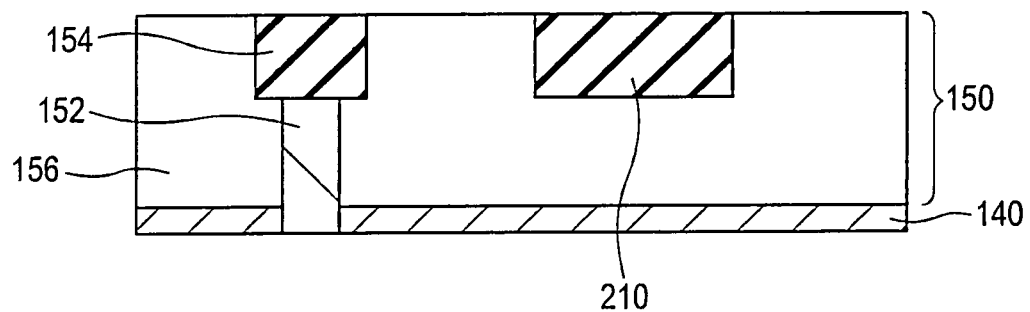
FIGS. 4A and 4B are cross-sectional diagrams schematically showing one example of a manufacturing process of the semiconductor device of the present embodiment.

Thereafter, as shown in FIG. 4A, the first insulating layer 156 is formed over the diffusion prevention film 140 (a first insulating layer formation step). Subsequently, the via 152, the first wiring 154 and the gate electrode 210 are embedded into the first insulating layer 156 using a single damascene method or a dual damascene method (a first embedding step). Thus, the first wiring layer 150 is formed. Thereafter, the second insulating layer 160 is formed over the first wiring layer 150 using, for example, a plasma CVD method (a second insulating layer formation step). As described above, since the second insulating layer 160 functions as the diffusion prevention film as well as functions as the gate insulating film, the layer is formed over the whole surface of the first wiring layer 150.

Figure 4B:
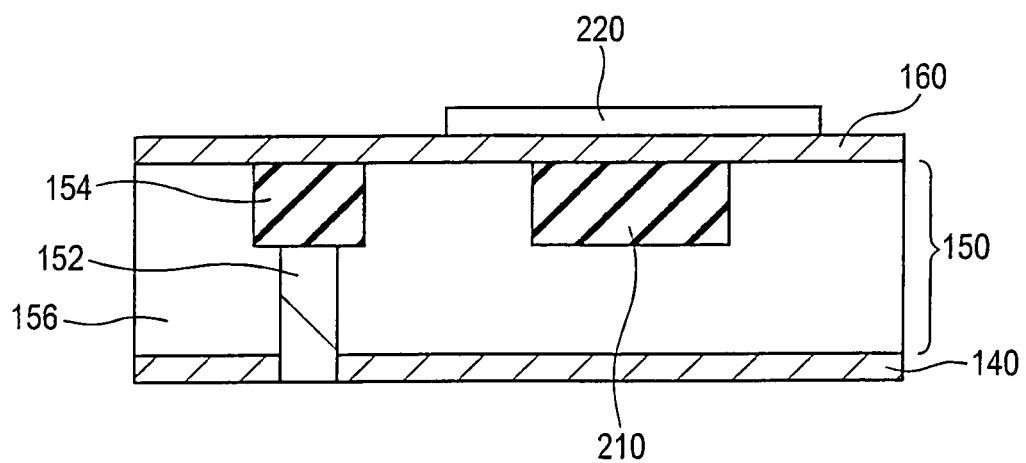

Subsequently, a state shown in FIG. 4B is obtained in a manner that a semiconductor layer is formed over the whole surface of the second insulating layer 160, and this semiconductor layer is selectively removed by etching using a mask film (a selective semiconductor layer formation step). The semiconductor layer 220 is provided at the location overlapped with the gate electrode 210 in a plan view. A method for forming the semiconductor layer provided over the whole surface of the second insulating layer 160 is not particularly limited. The semiconductor layer can be formed by, for example, a sputtering method when the semiconductor layer includes an oxide semiconductor layer such as InGaZnO, InZnO, ZnO, ZnAlO or ZnCuO. At this time, the semiconductor substrate 100 is heated at a temperature of 400° C. or lower. When the semiconductor layer is a polysilicon layer or an amorphous silicon layer, the semiconductor layer can be formed by, for example, the plasma CVD method.

Figure 5:
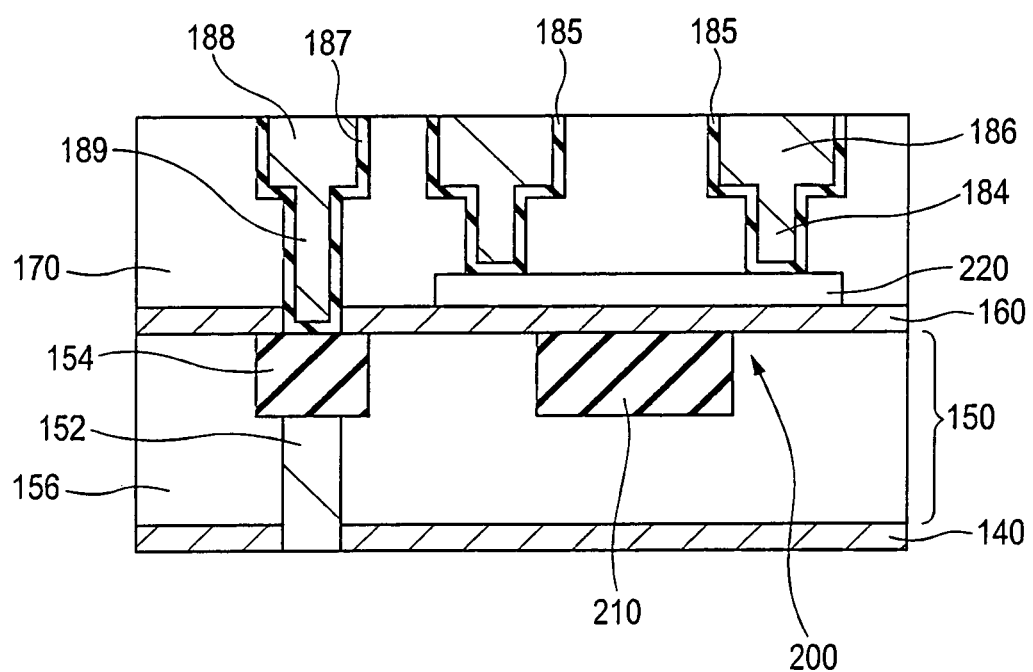
FIG. 5 is a cross-sectional diagram schematically showing one example of a manufacturing process of the semiconductor device of the present embodiment.

Subsequently, the third insulating layer 170 is formed over the second insulating layer 160 and the semiconductor layer 220 (a third insulating layer formation step). Subsequently, the first electric conductors 184, 186 and the second electric conductors 184, 186 are embedded into the third insulating layer 170 through the barrier metal 185, and at the same time, the via 189 and the second wiring 188 are embedded through the barrier metal 185. Thereby, a state shown in FIG. 5 is obtained (a second embedding step). The barrier metal 185 and the barrier metal 187 can be formed by the same treatment. Moreover, the first electric conductors 184, 186, the second electric conductors 184, 186, the via 189 and the second wiring 188 can be formed by the same treatment. For example, a barrier metal is formed over the approximately whole surface of the third insulating layer 170 and then a conductive material is embedded into an opening part. Subsequently, the barrier metal 185, the barrier metal 187, the first electric conductors 184, 186, the second electric conductors 184, 186, the via 189 and the second wiring 188 may be formed in a manner that the barrier metal and the conductive material selectively remain in the opening part by CVD or etch back.

A contact region of the semiconductor layer 220 may be treated with reduction plasma (for example, hydrogen plasma) or nitrogen-containing plasma (for example, ammonia plasma). For example, the opening part which is embedded with the first electric conductors 184, 186 and the second electric conductors 184, 186 are formed in the third insulating layer (a first step), and then the semiconductor layer 220 exposed at the bottom surface of the opening part is treated with the reduction plasma (for example, hydrogen plasma) or the nitrogen-containing plasma (for example, ammonia plasma) (a second step). Thereafter, the conductive material may be embedded into the opening part through the barrier metal (a third step). A source and a drain can be formed depending on a design of the opening part by selectively performing the plasma treatment to the opening part.

Subsequently, operation and effect of this embodiment will be described.

(1) The semiconductor element 200 of this embodiment functions as a transistor acting as a switching element. Accordingly, functions of the semiconductor device can be substantially changed without changing the layout of the semiconductor elements formed on the semiconductor substrate.

(2) In a thin-film transistor using a compound semiconductor layer, the means for forming a source and a drain is, for example, possibly a means in which the source and the drain is formed by performing plasma treatment to the compound semiconductor layer using a gate electrode formed over the compound semiconductor layer as a mask. However, in the case of the aforementioned means, a real dimension of a channel formed in the compound semiconductor layer is different from a designed dimension, and, as a result, transistor properties expected to be obtained from a design value may not be obtained. On the contrary, in the semiconductor device of this embodiment, a transistor structure having a channel dimension just as designed can be formed, because the source and the drain is formed by the barrier metal 185 contacted to the semiconductor layer 220. In addition, when plasma treatment is performed to the semiconductor layer 220, the plasma treatment is not performed by using the gate electrode covering a channel region as a mask, but performed by using the third insulating layer 170 which opens only a region where the semiconductor layer 220 and the barrier metal 185 is contacted. Therefore, large difference of the real dimension of the channel from the designed dimension can be suppressed.

(3) In this embodiment, the second insulating layer 160 has a function as a diffusion prevention film. Accordingly, a need for separately providing a gate insulating film and a diffusion prevention film of the semiconductor element 200 is eliminated. As a result, the semiconductor device can be produced in reduced cost, because the number of process can substantially be reduced. Consequently, increase in production cost of the semiconductor device can be suppressed and the semiconductor device can be formed in lower cost.

(4) In this embodiment, since the gate electrode 210 of the semiconductor element 200 is provided in the same layer as the first wiring 154 of the first wiring layer 150, the gate electrode 210 and the first wiring 154 can be formed by the same process. Accordingly, increase in the production cost of the semiconductor device can be suppressed.

(5) In this embodiment, when the semiconductor layer 220 is formed, heating temperature of the semiconductor substrate 100 can be set to 400° C. or lower. Accordingly, thermal damage to the wiring layer located under the semiconductor layer 220 can be suppressed. Thus, a low dielectric constant insulating film and a copper wiring can be used as a wiring layer.

(6) In this embodiment, the semiconductor elements 110 and 200 are at least partially overlapped with each other in a plan view. Accordingly, an integration rate of the semiconductor device can increase.

The embodiment of the present invention is described above with reference to the drawings. However, these are exemplifications of the present invention, and various configurations other than the configuration described above can be employed. For example, it is preferable that the first wiring 154 and the gate electrode 210 are copper wirings and are embedded into the first insulating layer 156 using the damascene method. However, at least one of the wirings located in the other wiring layer, for example, the wiring 132 and the second wiring 188 may be formed by using other metal materials (for example, Al or an Al alloy). In this case, the vias 152, 189 are also formed by the metal materials other than copper. For example, the wiring 132, the first wiring 154, the via 152 and the gate electrode 210 may be formed with copper or a copper alloy, and the second wiring 188 and the via 189 located in an upper layer above the semiconductor element 200 may be formed with Al or an alloy such as AlCu.

FIG. 1 is illustrated so that the second wiring 188, the via 189, the first electric conductors 184, 186 and the second electric conductors 184, 186 are embedded through the barrier metals 185, 187, while the contact 122, the wiring 132, the via 152, the first wiring 154 and the gate electrode 210 are embedded without a barrier metal. However, the contact 122, the wiring 132, the via 152, the first wiring 154 and the gate electrode 210 may also be embedded through a barrier metal. The aforementioned precondition is similar to all of drawings.

Second Embodiment

Figure 6:
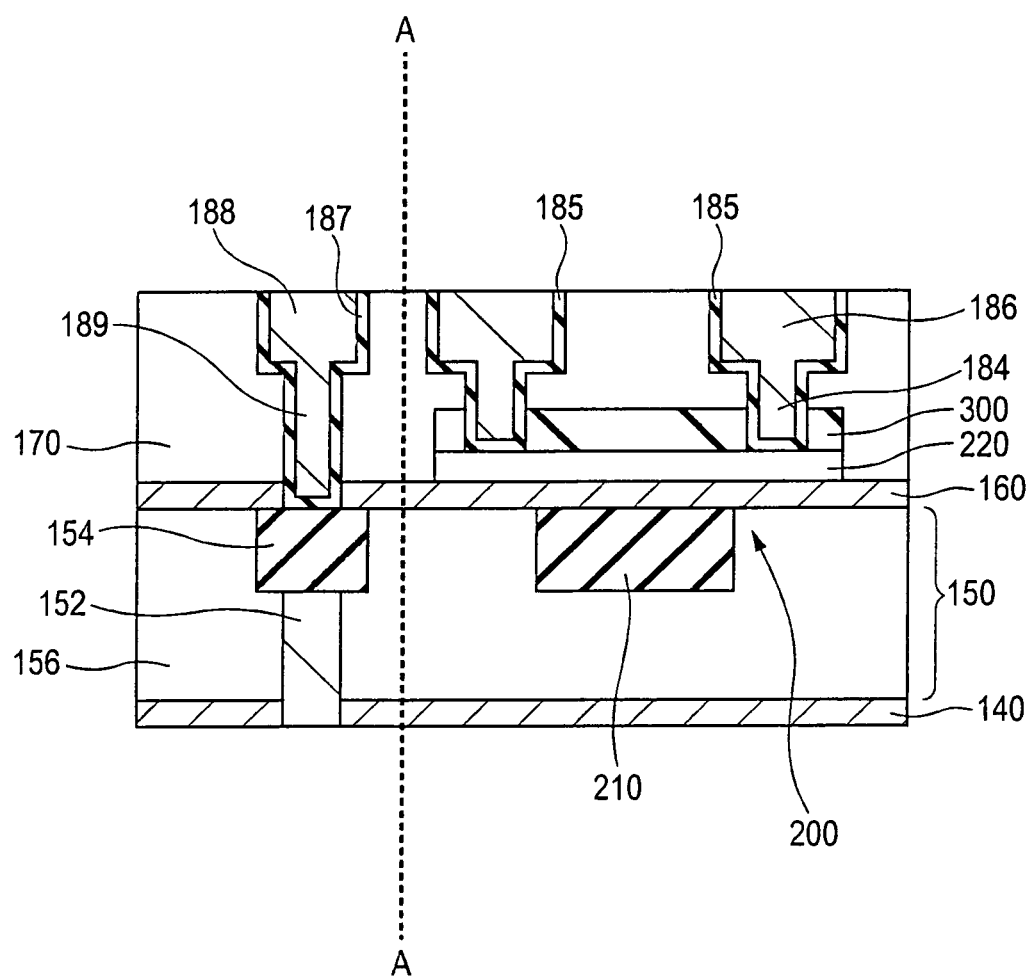
FIG. 6 is a cross-sectional diagram schematically showing one example of the semiconductor device of the present embodiment.

FIG. 6 is one example of a cross-sectional diagram of a semiconductor device according to the second embodiment. FIG. 6 is one example of an expanded cross-sectional diagram of a substantial part of FIG. 7, and is the diagram showing a configuration of a semiconductor element 200 which the semiconductor device shown in FIG. 7 hag.

A semiconductor device of this embodiment is different from the semiconductor device of the first embodiment in that a hard mask 300 is provided over the semiconductor layer 220. Other configurations are similar to those of the semiconductor device of the first embodiment.

The hard mask 300 can be comprised of one or more of SiN, $SiO_2$ and SiCOH. The hard mask 300 may be a single layer or a stacked structure. For example, the hard mask 300 may be a stacked structure containing two or more of a SiN-containing layer, a $SiO_2$-containing layer and a SiCOH containing layer. Before these layers are formed, an oxidation state of the surface of the semiconductor layer 220 is stabilized with plasma treatment into which oxidizing gas such as oxygen and $N_2O$ is introduced in-situ, and then the film of the hard mask 300 may be formed over the treated semiconductor layer with a CVD (Chemical Vapor Deposition) method.

The hard mask 300 and the semiconductor layer 220 may have approximately the same planar shape. Here, "approximately the same planar shape" means that an outer profile of the hard mask 300 and an outer profile of the semiconductor layer 220 when they are seen in a plan view is approximately the same and each outer profile is overlapped with each other when they are seen in a plan view. This configuration is realized by processing the semiconductor layer 220 by etching treatment using the hard mask 300 as a mask.

The first electric conductors 184, 186 and the second electric conductors 184, 186 penetrate the hard mask 300 and are coupled to the semiconductor layer 220 through the barrier metal 185.

The hard mask 300 over the semiconductor layer 220 functions as a protection film that protects the semiconductor channel from a process atmosphere. The hard mask has a function of protecting a semiconductor channel layer from reduction action, plasma damage and the like when the insulating layer, wiring layer and the like is formed on the semiconductor layer 220. The hard mask also can maintain semiconductor properties without causing process deterioration of the channel layer of the semiconductor layer 220 when the semiconductor element 200 is formed in a multi-layer film.

The semiconductor device of this embodiment is processed in a state of providing the hard mask 300 over the semiconductor layer and the semiconductor layer 220 is formed. Thereby, the microfabrication of the semiconductor layer 220 by dry etching becomes possible.

Subsequently, a method for manufacturing the semiconductor device according to this embodiment will be described using FIGS. 7 to 13.

Figure 8:
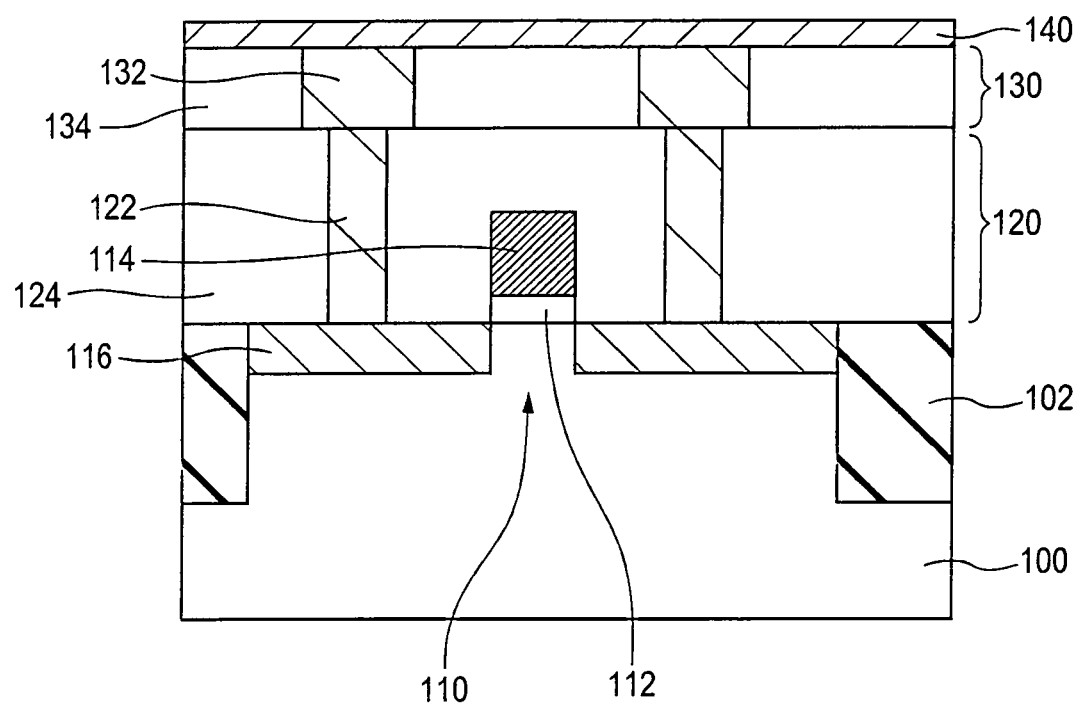
FIG. 8 is a cross-sectional diagram schematically showing one example of a manufacturing process of the semiconductor device of the present embodiment.

First, as shown in FIG. 8, an element isolation film 102 is formed in the semiconductor substrate 100, and then the gate insulating film 112, the gate electrode 114 and the impurity region 116 are further formed in this order. Subsequently, the contact layer 120, the wiring layer 130 and the diffusion prevention film 140 are formed. Until these steps, these components can be realized according as related arts.

Figure 9:
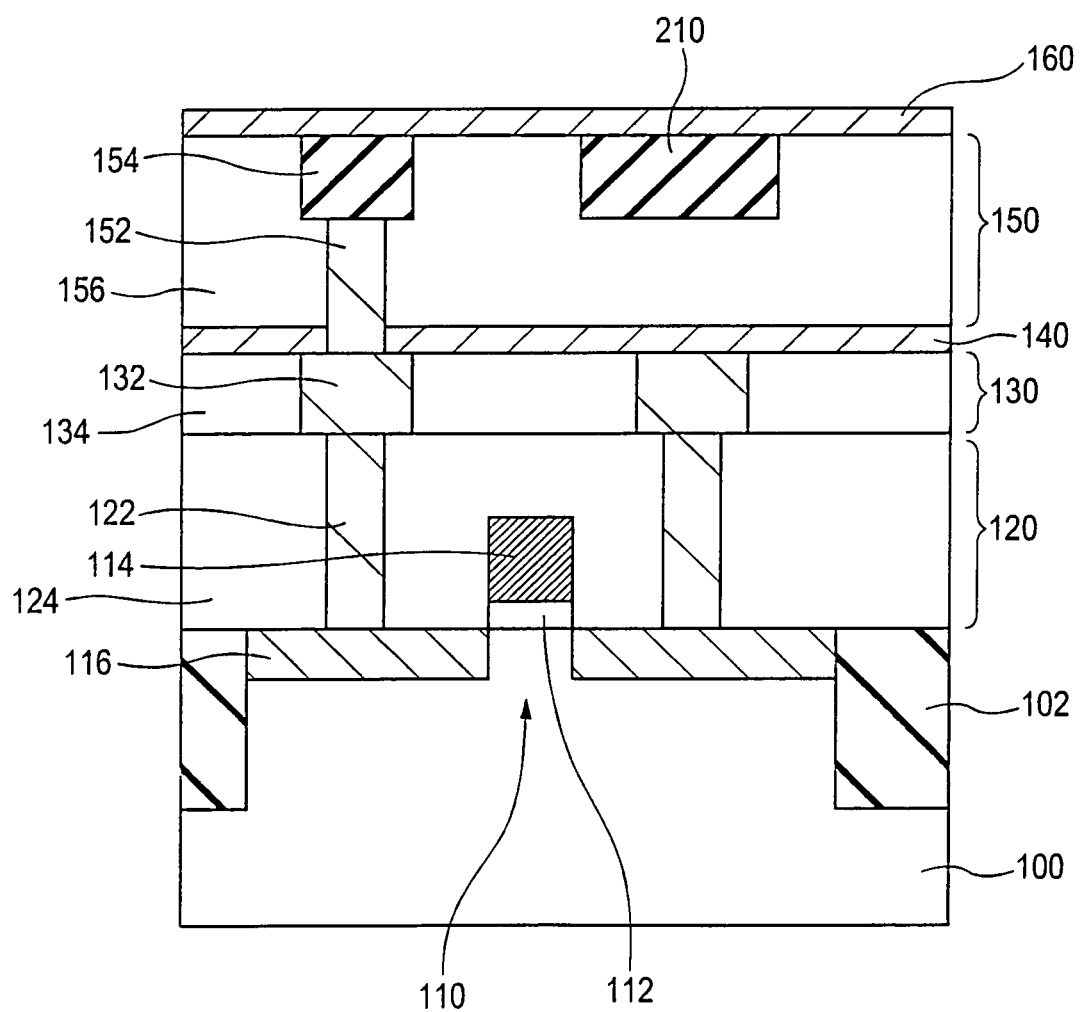
FIG. 9 is a cross-sectional diagram schematically showing one example of a manufacturing process of the semiconductor device of the present embodiment.

Thereafter, as shown in FIG. 9, the first insulating layer 156 is formed over the diffusion prevention film 140 (a first insulating layer formation step). Subsequently, the via 152, the first wiring 154 and the gate electrode 210 are embedded into the first insulating layer 156 using a single damascene method or a dual damascene method (a first embedding step). Thus, the first wiring layer 150 is formed. Thereafter, the second insulating layer 160 is formed over the first wiring layer 150 using, for example, a plasma CVD method (a second insulating layer formation step). Since the second insulating layer 160 functions as the diffusion prevention film as well as functions as the gate insulating film, the layer is formed over the whole surface of the first wiring layer 150.

Figure 10:
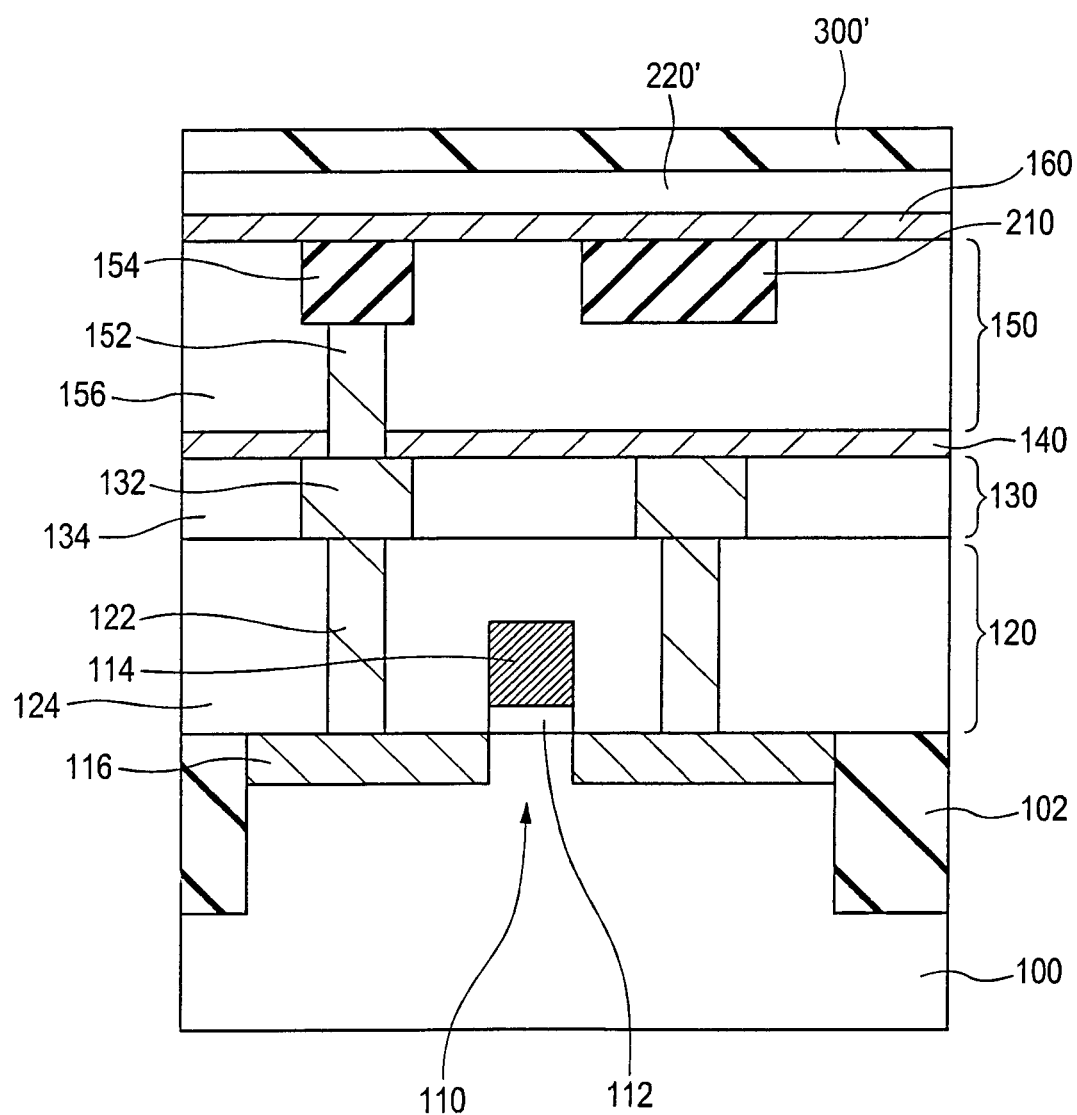
FIG. 10 is a cross-sectional diagram schematically showing one example of a manufacturing process of the semiconductor device of the present embodiment.

Subsequently, as shown in FIG. 10, a semiconductor layer 220' is formed over the whole surface of the second insulating layer 160 (a semiconductor layer formation step). The semiconductor layer 220' is an InGaZnO layer, an InZnO layer, a ZnO layer, a ZnAlO layer or a ZnCuO layer, and formed by, for example, a sputtering method. At this time, the semiconductor substrate 100 is heated at a temperature of 400° C. or lower, preferably 300° C.

Subsequently, a hard mask 300' is formed over the semiconductor layer 220' (a hard mask formation step). When the semiconductor layer 220' is, for example, an oxide semiconductor such as an InGaZnO layer, an InZnO layer, a ZnO layer, a ZnAlO layer or a ZnCuO layer, an oxidation state of the surface of the semiconductor layer 220' is stabilized with plasma treatment into which oxidizing gas such as oxygen and $N_2O$ is introduced in-situ, and then the hard mask 300' may be formed with a plasma CVD method under an oxidation atmosphere. By this means, the semiconductor properties of the semiconductor layer 220' can be protected. More specifically, the semiconductor layer 220 can be protected from the reduction atmosphere, plasma damage and the like at the time of formation, when the insulating layer and the wiring layer are formed over the semiconductor layer 220 and the hard mask 300 after processing. When an SiN insulating film is directly formed over the semiconductor layer 220' with a CVD using $SiH_4$ gas or $NH_3$ gas, a film having much oxygen defect is formed because the oxygen in the semiconductor layer 220' is reduced by $SiH_4$ plasma or $NH_3$ plasma, or the semiconductor properties may deteriorate due to formation of an deteriorated layer in the semiconductor layer 220' by plasma damage. The semiconductor layer 220 is protected from a direct reduction atmosphere and plasma damage, and the formation of oxygen defect in the semiconductor layer 220 and the plasma damage can be prevented in a manner that the hard mask having an insulating property is formed over the semiconductor layer 220' so as not to deteriorate the semiconductor properties of the semiconductor layer 220' and the insulating layer and the wiring layer is sequentially formed over the semiconductor layer 220 and the hard mask 300. Consequently, loss of the semiconductor properties of the semiconductor element in a multi-layer wiring can be prevented.

Figure 11:
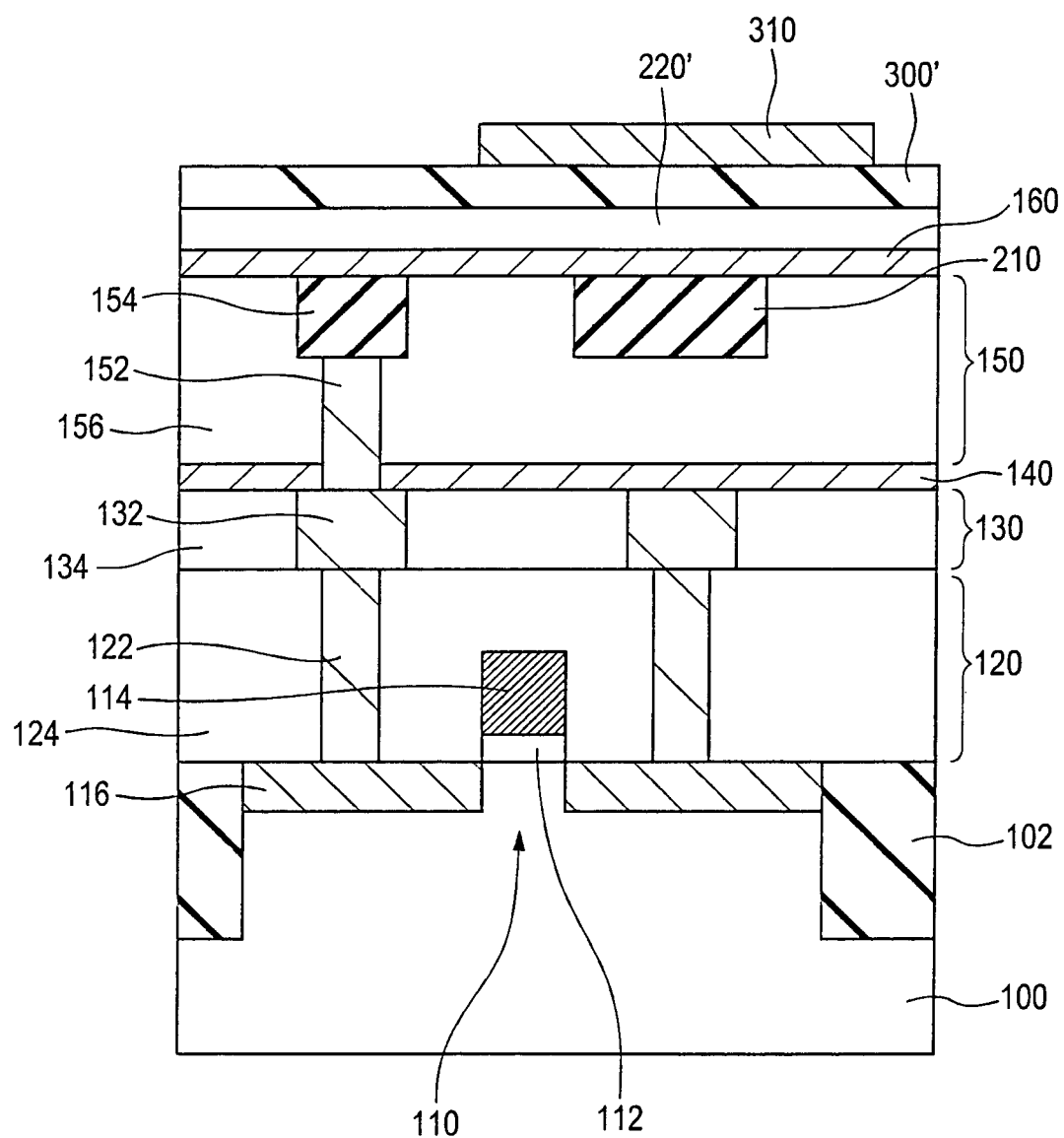
FIG. 11 is a cross-sectional diagram schematically showing one example of a manufacturing process of the semiconductor device of the present embodiment.
Figure 12:
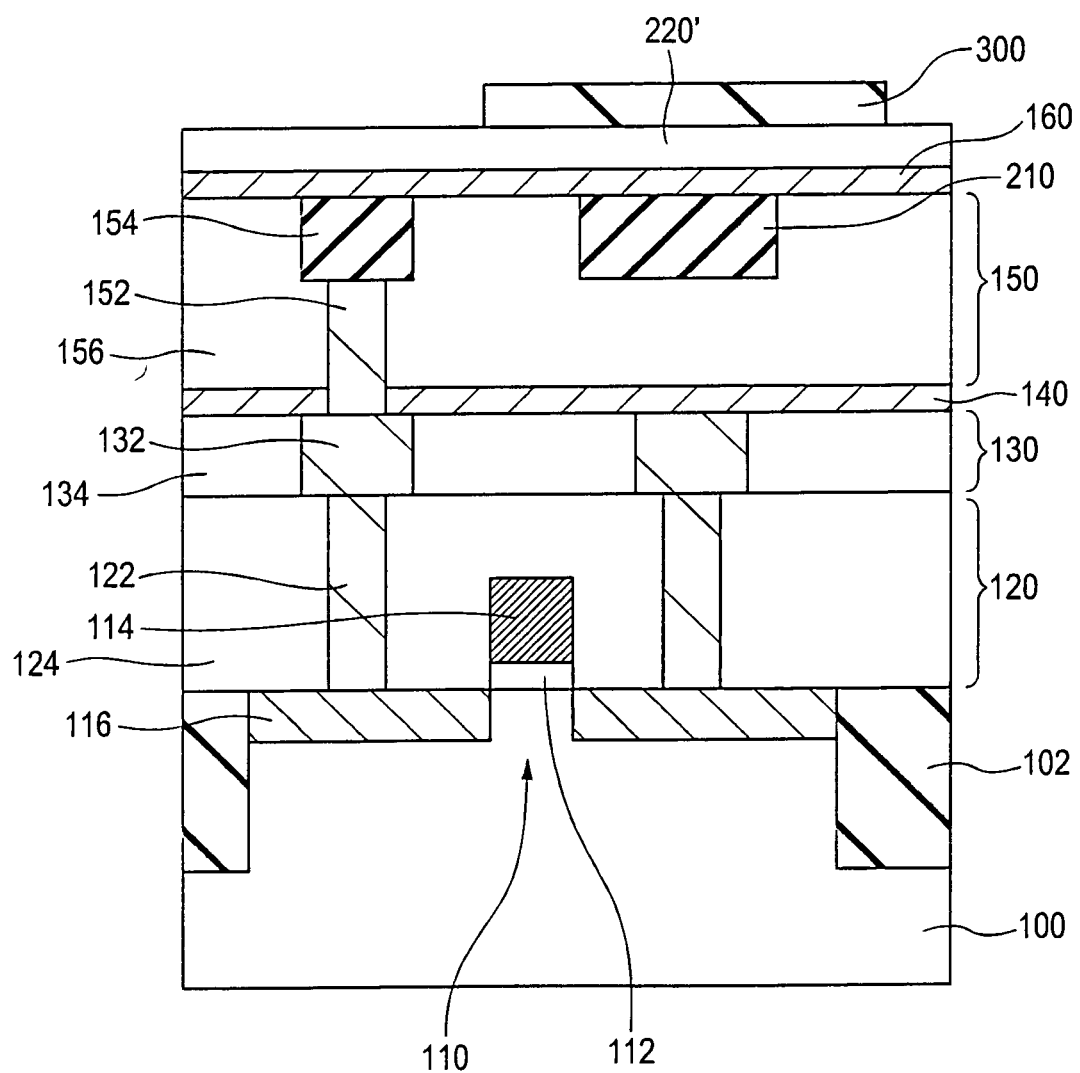
FIG. 12 is a cross-sectional diagram schematically showing one example of a manufacturing process of the semiconductor device of the present embodiment.

Back to FIG. 10, after the hard mask 300' is formed over the semiconductor layer 220', a resist pattern 310 is formed over the hard mask 300' as shown in FIG. 11. Thereafter, a state shown in FIG. 12 can be obtained by patterning the hard mask 300' and then removing the resist pattern 310.

Figure 13:
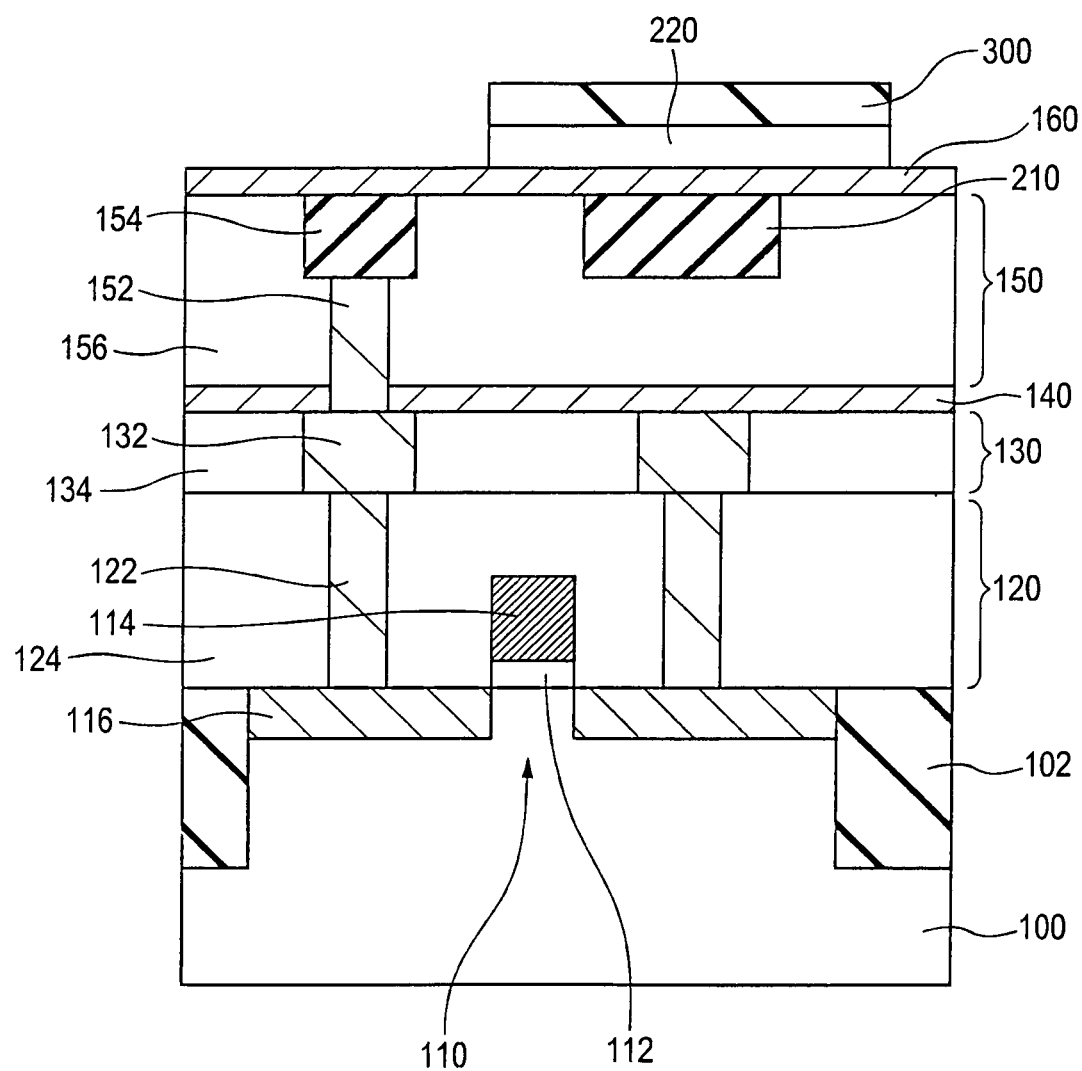
FIG. 13 is a cross-sectional diagram schematically showing one example of a manufacturing process of the semiconductor device of the present embodiment.

Subsequently, as shown in FIG. 13, the patterned semiconductor layer 220 is formed by processing the semiconductor layer 220' with dry etching using the patterned hard mask 300 as a mask (a dry etching step). The semiconductor layer 220 may be formed without removing the resist pattern 310 after patterning the hard mask 300'. This dry etching may be performed by using, for example, mixed gas containing $Cl_2$, $BCl_3$ and $N_2$. When this mixed gas is used, the dry etching described above can be performed in sufficient precision. This etching gas is just one example, and not limited thereto. As described above, according to the dry etching of the semiconductor layer 220' using the hard mask 300, microfabrication of the semiconductor layer 220' is possible, with preventing the loss of the semiconductor properties and a microscopic oxide semiconductor element can be formed in a wiring layer of LSI which becomes more microscopic.

Figure 7:
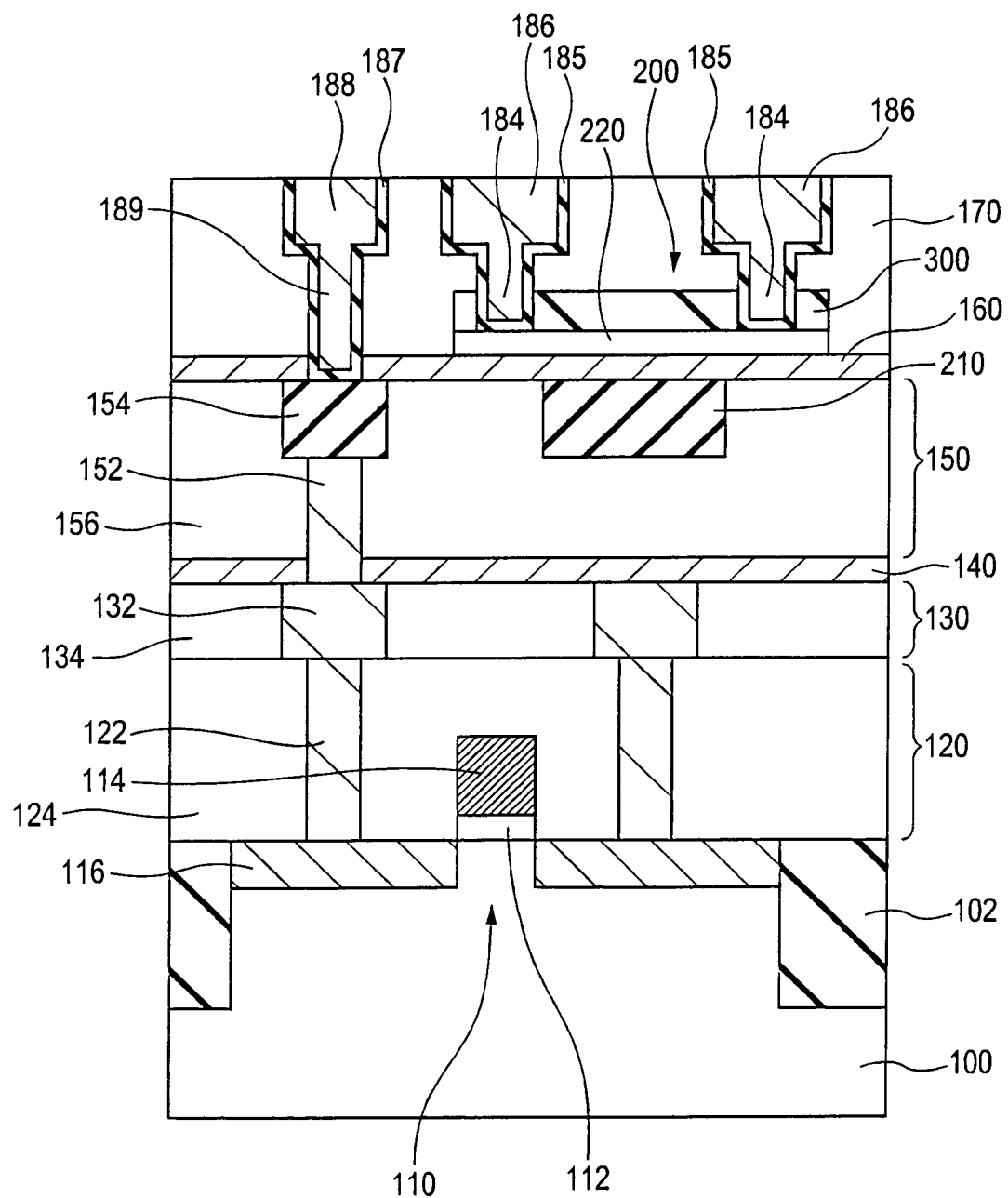
FIG. 7 is a cross-sectional diagram schematically showing one example of the semiconductor device of the present embodiment.

Subsequently, the third insulating layer 170 is formed over the second insulating layer 160 and the hard mask 300 (a third insulating layer formation step). Then, the first electric conductors 184, 186 and the second electric conductors 184, 186 are embedded into the third insulating layer 170 and the hard mask 300 through the barrier metal 185 and, at the same time, the via 189 and the second wiring 188 are embedded into the third insulating layer 170 through the barrier metal 187. Thereby, a state shown in FIG. 7 is obtained (a second embedding step). The barrier metal 185 and the barrier metal 187 can be formed by the same treatment. Moreover, the first electric conductors 184, 186, the second electric conductors 184, 186, the via 189 and the second wiring 188 can be formed by the same treatment.

A contact region of the semiconductor layer 220 may be treated with reduction plasma (for example, hydrogen plasma) or treated with nitrogen-containing plasma (for example, ammonia plasma). For example, an opening part which is embedded with the first electric conductors 184, 186 and the second electric conductors 184, 186 is formed in the third insulating layer 170 and the hard mask 300 (a first step), and then the semiconductor layer 220 exposed at the bottom surface of the opening part is treated with the reduction plasma (for example, hydrogen plasma) or the nitrogen-containing plasma (for example, ammonia plasma) (a second step). Thereafter, the conductive material may be embedded to the opening part through the barrier metal (a third step). A source and a drain can be formed depending on the design of the opening part by selectively treated with the plasma to the opening part.

Subsequently, operation and effect of this embodiment will be described. The semiconductor device of this embodiment brings about operation and effect in addition to the operation and effect described in the first embodiment.

According to this embodiment, since the hard mask 300 comprised of an insulating material which does not deteriorate the semiconductor properties of the semiconductor layer 220 is formed over the semiconductor layer 220, reduction action, plasma damage and the like to the semiconductor layer 220 can be suppressed when the wiring layer and the insulating layer are formed over the semiconductor layer 220 and the hard mask 300. Consequently, deterioration of the semiconductor properties of the semiconductor element in a multi-layer wiring can be prevented. More specifically, according to this embodiment, the semiconductor element 200 can be formed in the multi-layer wiring layer and the semiconductor element 200 functions as a transistor which is a switching element.

Third Embodiment

Figure 14:
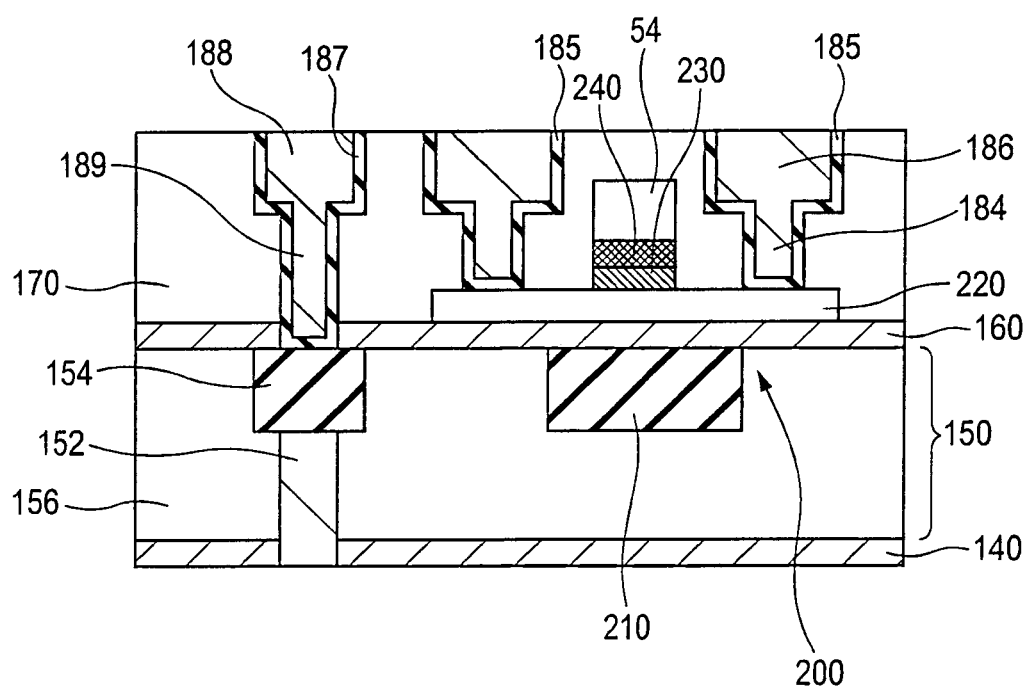
FIG. 14 is a cross-sectional diagram schematically showing one example of the semiconductor device of the present embodiment.

FIG. 14 is one example of a cross-sectional diagram of a semiconductor device according to the third embodiment, and the diagram which corresponds to FIG. 1 in the first embodiment.

A semiconductor device of this embodiment has a similar configuration to the semiconductor device according to the first embodiment, except in that the device has a trap film 230 and a back gate electrode 240 over the semiconductor layer 220. The trap film 230 and the back gate electrode 240 are overlapped with a channel region of the semiconductor layer 220 in a plan view. In the example shown in this drawing, a mask pattern 54, which is used when the back gate electrode 240 is formed, remains over the back gate electrode 240. The mask pattern 54 is, for example, a silicon oxide film, but may be a silicon nitride film or a silicon carbonitride film. A contact (not shown) coupled to the back gate electrode 240 penetrates the mask pattern 54.

The trap film 230 is, for example, an SiN film, and has a thickness of 5 nm or more and 50 nm or less. The back gate electrode 240 is, for example, a TiN film. The back gate electrode 240 is electrically coupled to a wiring (not shown) in the same layer of the second wiring 188 through, for example, the contact which is not shown.

In this embodiment, the semiconductor element 200 can functions as a memory element as well as a transistor. In the former case, the semiconductor element 110 may be a part of a selector circuit of the semiconductor element 200.

Figure 32:
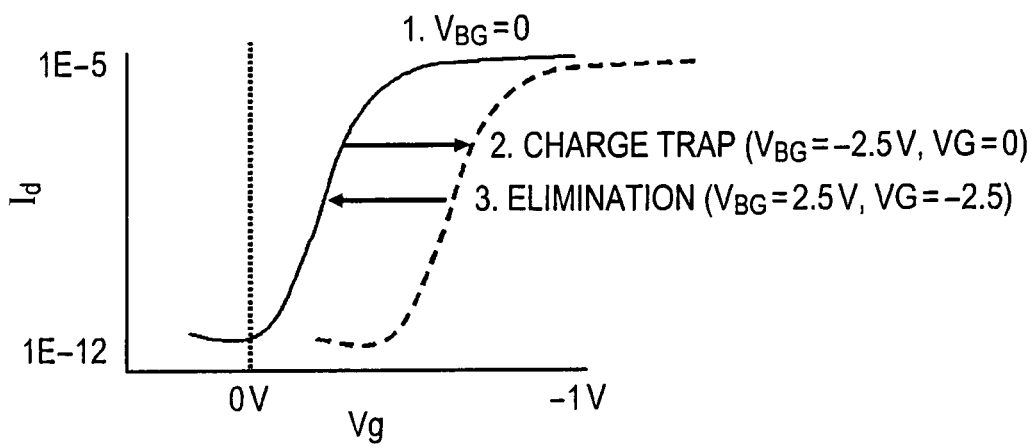
FIG. 32 is a diagram describing operation and effect of the semiconductor device of the present embodiment.

FIG. 32 is a graph describing the principle in which the semiconductor element 200 functions as the memory element. When the semiconductor element 200 functions as the memory element, charges (for example, holes) may be injected (trapped) to the trap film 230 or the injected charge may be removed. This is because a threshold voltage ($V_{th}$) at the time that the semiconductor element 200 functions as a transistor varies according to the presence or absence of the charge injected into the trap film 230.

Specifically, in an initial state (information is not written in the semiconductor element 200), a voltage of the back gate electrode 240 ($V_{BG}$) is set to equal to zero. When information is written in the semiconductor element 200, negative voltage (for example, −2.5 V) is applied to the back gate electrode 240 and voltage of the gate electrode 210 ($V_G$) is set to equal to zero. Consequently, holes are injected to the trap film 230 and the threshold voltage of the semiconductor element 200 is sifted to the negative side.

When information is deleted from the semiconductor element 200, positive voltage (for example, +2.5 V) is applied to the back gate electrode 240 and negative voltage (for example, −2.5 V) is applied to the gate electrode 210. Consequently, the holes injected into the trap film 230 are removed and the threshold voltage of the semiconductor element 200 is restored to the initial value.

When the semiconductor element 200 is not used as a memory element but used as a transistor, a threshold voltage of the transistor can also be changed by injecting charges to the trap film 230.

Subsequently, a method for manufacturing the semiconductor device according to this embodiment will be described using FIGS. 14 to 16. The method for manufacturing the semiconductor device is similar to the method in the first embodiment until the formation of the second insulating layer 160 over the first wiring layer 150. Therefore, description of those steps are omitted.

Figure 15A:
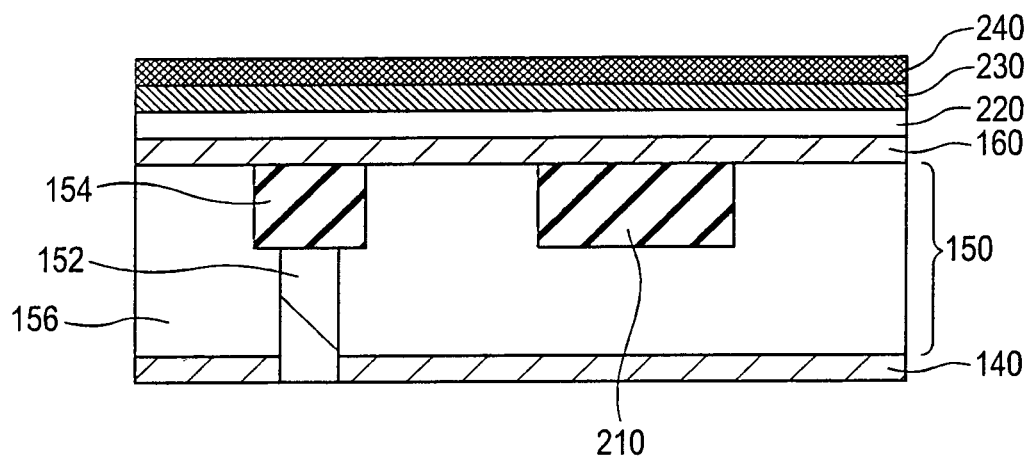
FIGS. 15A and 15B are cross-sectional diagrams schematically showing one example of a manufacturing process of the semiconductor device of the present embodiment.
Figure 16:
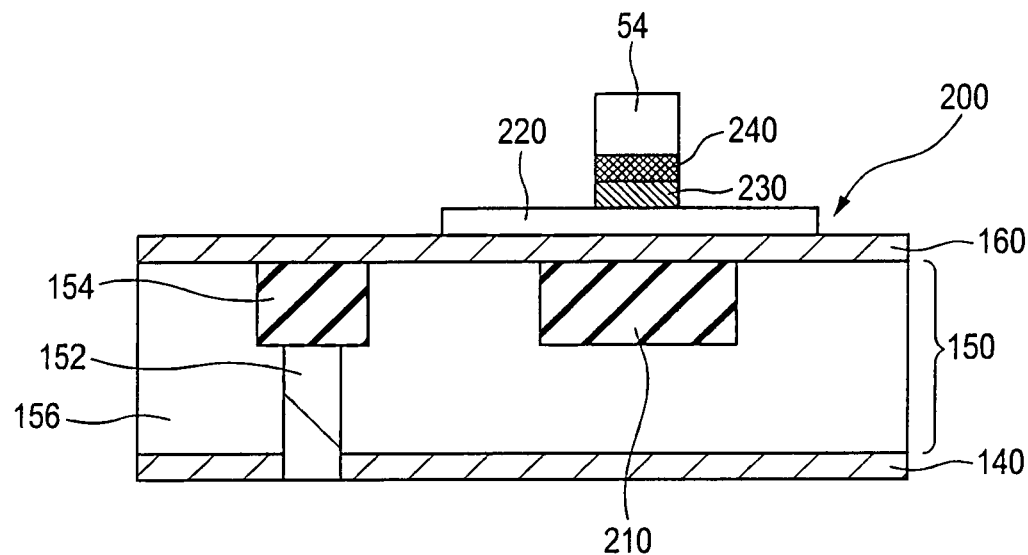
FIG. 16 is a cross-sectional diagram schematically showing one example of a manufacturing process of the semiconductor device of the present embodiment.

As shown in FIG. 15A, after forming the second insulating layer 160 (a second insulating layer formation step), the semiconductor layer 220 is firstly formed over the second insulating layer 160 (a semiconductor layer formation step). Subsequently, the trap film 230 and the back gate electrode 240 are formed over the semiconductor layer 220. The trap film 230 is formed by, for example, a plasma CVD method, and the back gate electrode 240 is formed by, for example, a sputtering method.

Figure 15B:
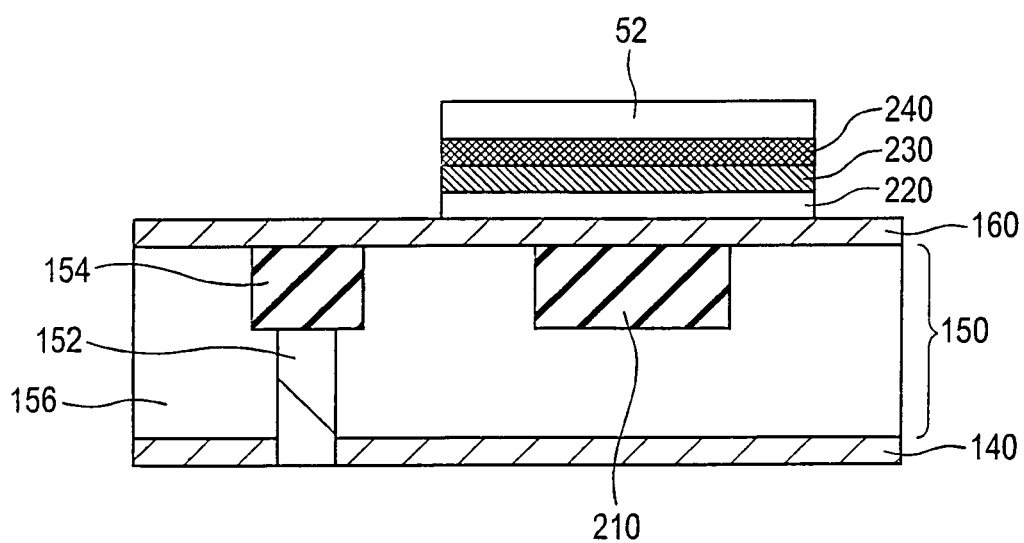

Subsequently, as shown in FIG. 15B, the mask pattern 52 is formed over the back gate electrode 240, and the back gate electrode 240, the trap film 230 and the semiconductor layer 220 are dry etched by using the mask pattern 52 as a mask. Thereby, the semiconductor layer 220 is patterned so as to be the semiconductor element 200. Shapes of the back gate electrode 240 and the trap film 230 is approximately the same as the shape of the semiconductor layer 220.

Subsequently, the mask pattern 52 is removed. Subsequently, the mask pattern 54 is formed over the back gate electrode 240. The mask pattern 54 is formed in a manner that a silicon oxide film, for example, is formed and the silicon oxide film is selectively removed. The mask pattern 54 may be formed by removing other films such as a silicon nitride film and silicon carbonitride film. Subsequently, the trap film 230 and the back gate electrode 240 are dry etched by using the mask pattern 54 as a mask. Thereby, as shown in FIG. 16, the trap film 230 and the back gate electrode 240 are patterned so as to be the semiconductor element 200.

Subsequently, the third insulating layer 170 is formed over the second insulating layer 160, the semiconductor layer 220 and the mask pattern 54 (a third insulating layer formation step). Subsequently, the first electric conductors 184, 186 and the second electric conductors 184, 186 are embedded into the third insulating layer 170 through the barrier metal 185 and, at the same time, the via 189 and the second wiring 188 are embedded through the barrier metal 187. Thereby, a state shown in FIG. 14 is obtained (a second embedding step). Here, the barrier metal 185 and the barrier metal 187 can be formed by the same treatment. Moreover, the first electric conductors 184, 186, the second electric conductors 184, 186, the via 189 and the second wiring 188 can be formed by the same treatment.

A contact region of the semiconductor layer 220 may be treated with reduction plasma (for example, hydrogen plasma) or treated with nitrogen-containing plasma (for example, ammonia plasma). For example, an opening part which is embedded with the first electric conductors 184, 186 and the second electric conductors 184, 186 is formed in the third insulating layer 170 (a first step), and then the semiconductor layer 220 exposed at a bottom surface of the opening part is treated with the reduction plasma (for example, hydrogen plasma) or the nitrogen-containing plasma (for example, ammonia plasma) (a second step). Thereafter, the conductive material may be embedded to the opening part through the barrier metal (a third step). A source and a drain can be formed depending on the design of the opening part by selectively treated with the plasma to the opening part.

In the semiconductor device of this embodiment, the hard mask 300 which is described the second embodiment can also be provided over the semiconductor layer 220. In such a case, a stacked body comprised of the trap film 230, the back gate electrode 240 and the mask pattern 54 are provided so as to penetrate the hard mask 300.

A similar effect to the effect of the first embodiment and the second embodiment can be obtained in this embodiment. The semiconductor element 200 can be used as a memory element.

Fourth Embodiment

Figure 17:
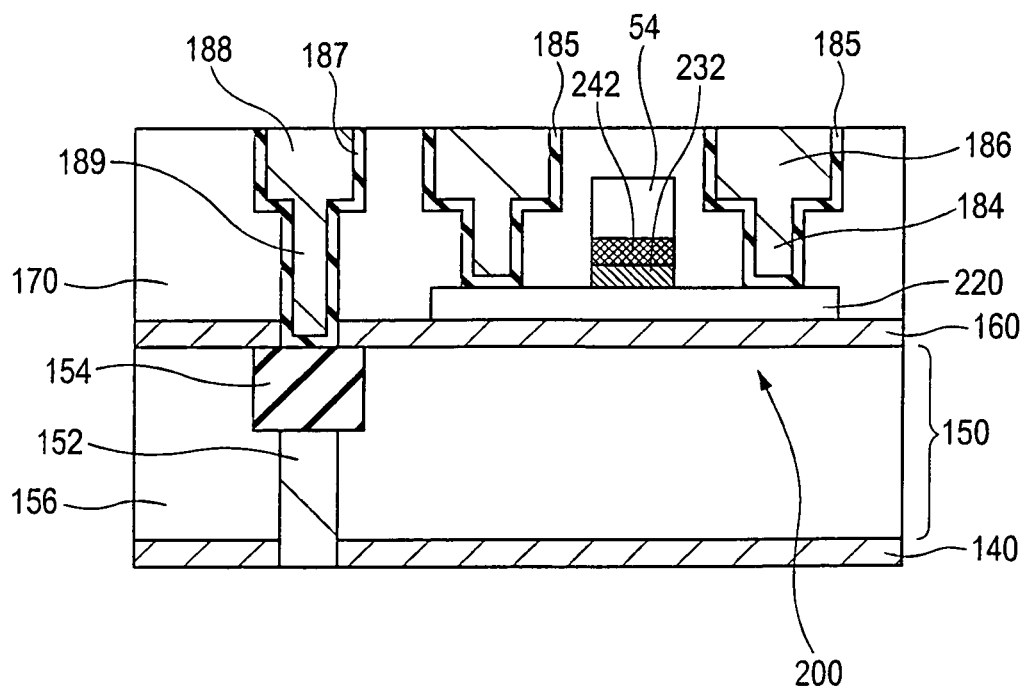
FIG. 17 is a cross-sectional diagram schematically showing one example of the semiconductor device of the present embodiment.

FIG. 17 is one example of a cross-sectional diagram of a semiconductor device according to the fourth embodiment, and the diagram which corresponds to FIG. 1 in the third embodiment.

A semiconductor device of this embodiment has a similar configuration to the semiconductor device according to the third embodiment, except in that the gate electrode 210 is not provided and a gate insulating film 232 and a gate electrode 242 is located over the semiconductor layer 220.

The gate insulating film 232 has a similar configuration to the trap film 230 in the third embodiment and the gate electrode 242 has a similar configuration to the back gate electrode 240 in the third embodiment.

A diffusion prevention film 162 is provided over the first wiring layer 150. A configuration of the diffusion prevention film 162 is similar to the configuration of the second insulating layer 160 in the third embodiment.

A method for manufacturing the semiconductor device according to this embodiment is similar to the method for manufacturing the semiconductor device according to the third embodiment, except in that the gate electrode 210 is not formed when the first wiring 154 is formed.

In the semiconductor device of this embodiment, the hard mask 300 which is described in the second embodiment can also be provided over the semiconductor layer 220. In such a case, a stacked body comprised of the gate insulating film 232, the gate electrode 242 and the mask pattern 54 is provided so as to penetrate the hard mask 300.

A similar effect to the effect of the first embodiment and the second embodiment can be obtained in this embodiment. The semiconductor element 200 can be used as a memory element.

Fifth Embodiment

Figure 33:
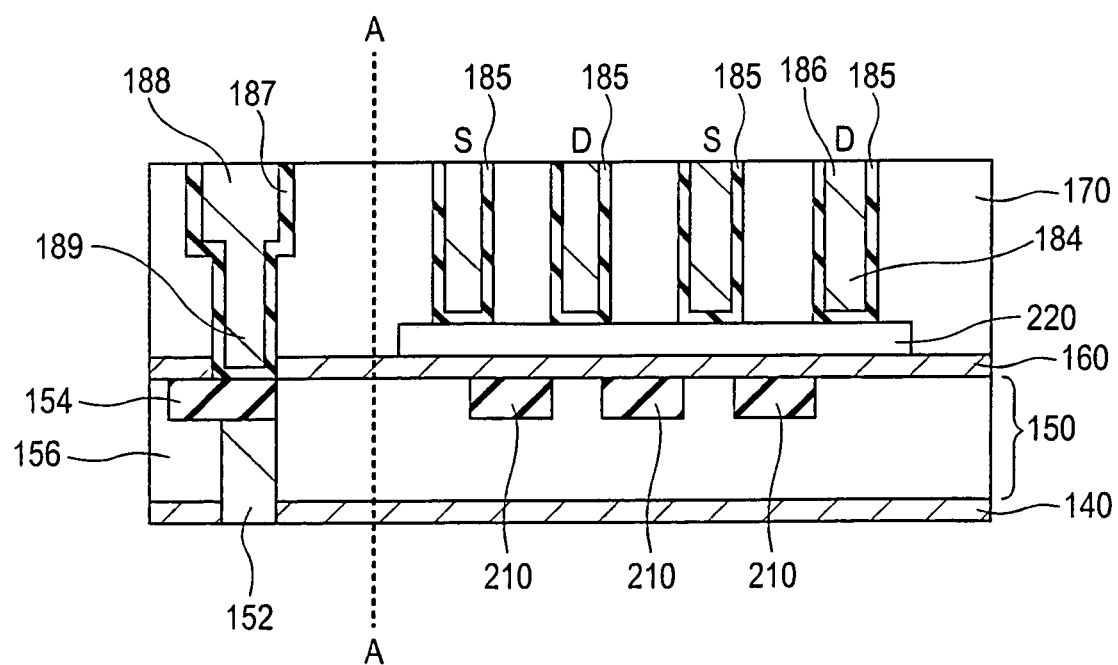
FIG. 33 is a cross-sectional diagram schematically showing one example of the semiconductor device of the present embodiment.

FIG. 33 is one example of a cross-sectional diagram of a semiconductor device according to the fifth embodiment, and the diagram which corresponds to FIG. 1 in the first embodiment.

This embodiment is different from the first embodiment in that multiple gate electrodes 210 are coupled to a single semiconductor layer through the second insulating layer 160 (the gate insulating film), and the multiple first electric conductors 184, 186 and the multiple second electric conductors 184, 186 are embedded into the third insulating layer 170 so as to sandwich each of the gate electrodes 210 in a plan view. The multiple first electric conductors 184, 186 and the multiple second electric conductors 184, 186 are coupled to the semiconductor layer 220 through the barrier metal 185.

Although not shown, the hard mask 300 may provided over the semiconductor layer 220 according as the configuration of the second embodiment. In addition, although not shown, a stacked body comprised of the trap film 230, the back gate electrode 240 and the mask pattern 54 is provided over the semiconductor layer 220 according as the configuration of the third embodiment. Moreover, although not shown, the multiple gate electrodes 210 are not provided, and alternatively the stacked body comprised of the gate insulating film 232, the gate electrode 242 and the mask pattern 54 is provided over the semiconductor layer 220 and between the multiple first electric conductors 184, 186 and the multiple second electric conductors 184, 186 shown as a source (S) and a drain (D) in FIG. 33 according as the configuration of the fourth embodiment.

The semiconductor device of this embodiment can be manufactured according as the method for manufacturing described from the first embodiment to the fourth embodiment. When the method for manufacturing in the second embodiment is used, a transistor having dense microchannel can be formed by a dry process using the hard mask 300.

According to the semiconductor device of this embodiment as described above, on-state current per area can be effectively increased. A wiring transistor can be used as an I/O (Input/Output) signal switch and a power source switch by forming them in underlayer wiring of a signal pad and a power source pad.

Subsequently, as one example of the semiconductor device of this embodiment, a comb-shaped gate transistor using multiple gates will be described.

Figure 34A:
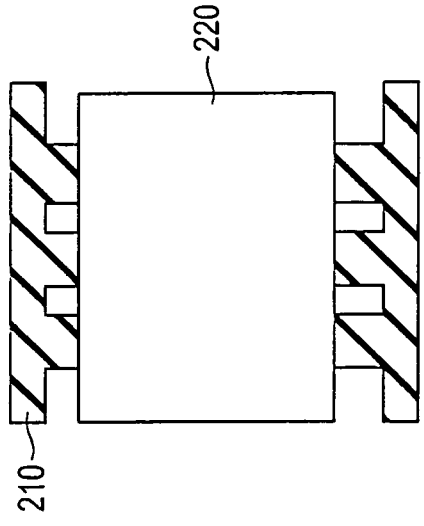
FIGS. 34A, 34B, 34C, 34D are schematic plane diagrams illustrating one example of the semiconductor element which the semiconductor device of the present embodiment has.
Figure 34B:
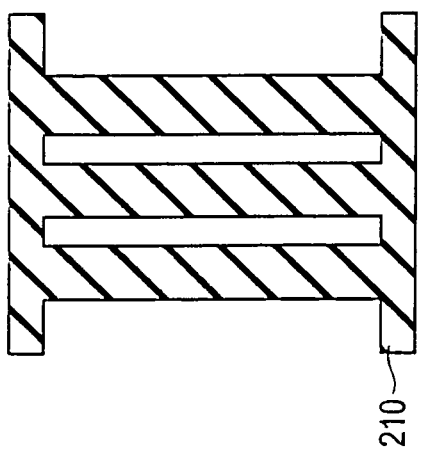
Figure 34C:
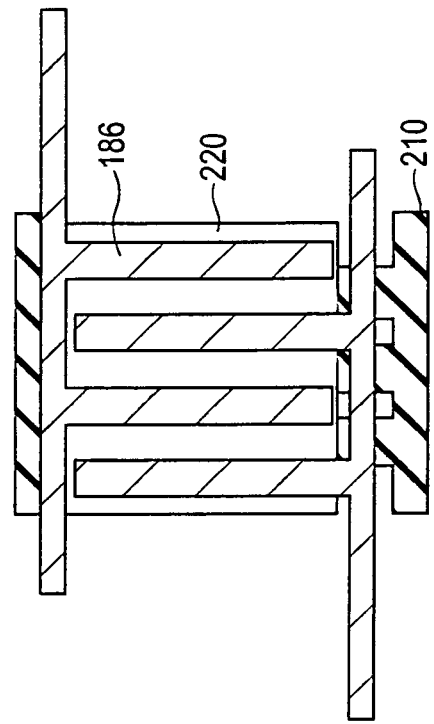
Figure 34D:
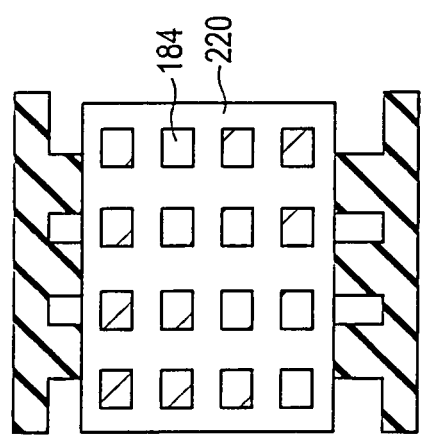

First, one example of a schematic plan diagram of the comb-shaped gate transistor is shown in FIGS. 34A, 34B, 34C and 34D. FIG. 34A is one example of a schematic plan diagram of the gate electrode 210. FIG. 34 B is one example of a schematic plan diagram showing the semiconductor layer 220 overlapped over the gate electrode 210. FIG. 34C is one example of a schematic plan diagram showing a part of the first electric conductor and the second electric conductor which are shown by a reference numeral of 184 overlapped over the diagram shown in FIG. 34B. FIG. 34D is one example of a schematic plan diagram showing a part of the first electric conductor and the second electric conductor which are shown by a reference numeral of 186 overlapped over the diagram shown in FIG. 34C.

In the comb-shaped gate transistor shown in FIG. 23D, since a gate and a S/D contact can be densely formed, on-state current per area can be effectively increased. This leads to realization of an element having a smaller area and a higher on-state current, and a wiring switch having small size and high performance can be realized.

When the comb-shaped gate transistor is arranged in a planar shape (a square) as shown in FIGS. 34A, 34B, 34C and 34D, a relation between an area thereof and an on-state current is shown in FIG. 35. Lines in FIG. 35 is plotted for each property in the cases of Ion equals to 0.1 $\mu A/\mu m$, 1 $\mu A/\mu m$ and 10 $\mu A/\mu m$, when the comb-shaped gate transistor has a gate length of 0.46 $\mu m$, a effective channel length of 0.4 $\mu m$ and a gate pitch of 0.8 $\mu m$. Particularly, when Ion equals to 10 $\mu A/\mu m$, a wiring switch having a very high on-state current of 1 mA when an area of the comb-shaped gate transistor corresponds to a signal pad (10 $\mu m$ square) and 10 mA when the area corresponds to a power source pad (30 $\mu m$ square) can be formed.

Sixth Embodiment

Figure 36:
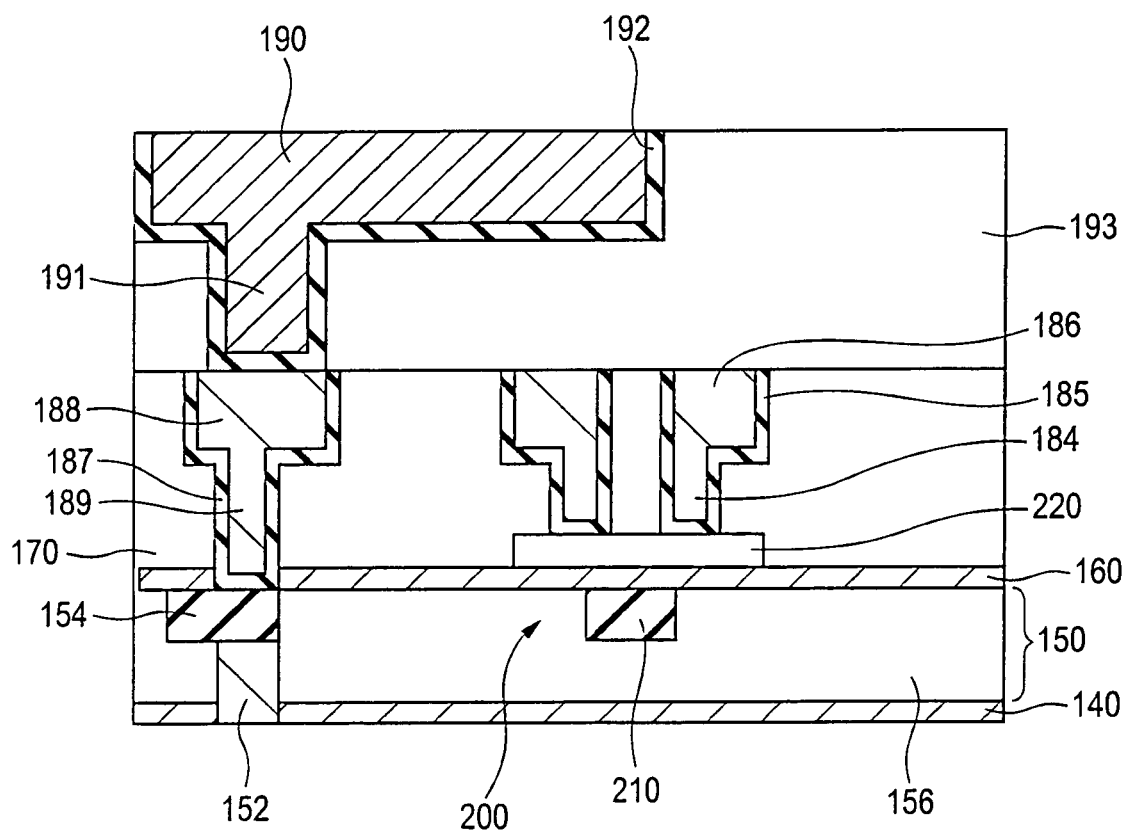
FIG. 36 is a cross-sectional diagram schematically showing one example of the semiconductor device of the present embodiment.
Figure 37:
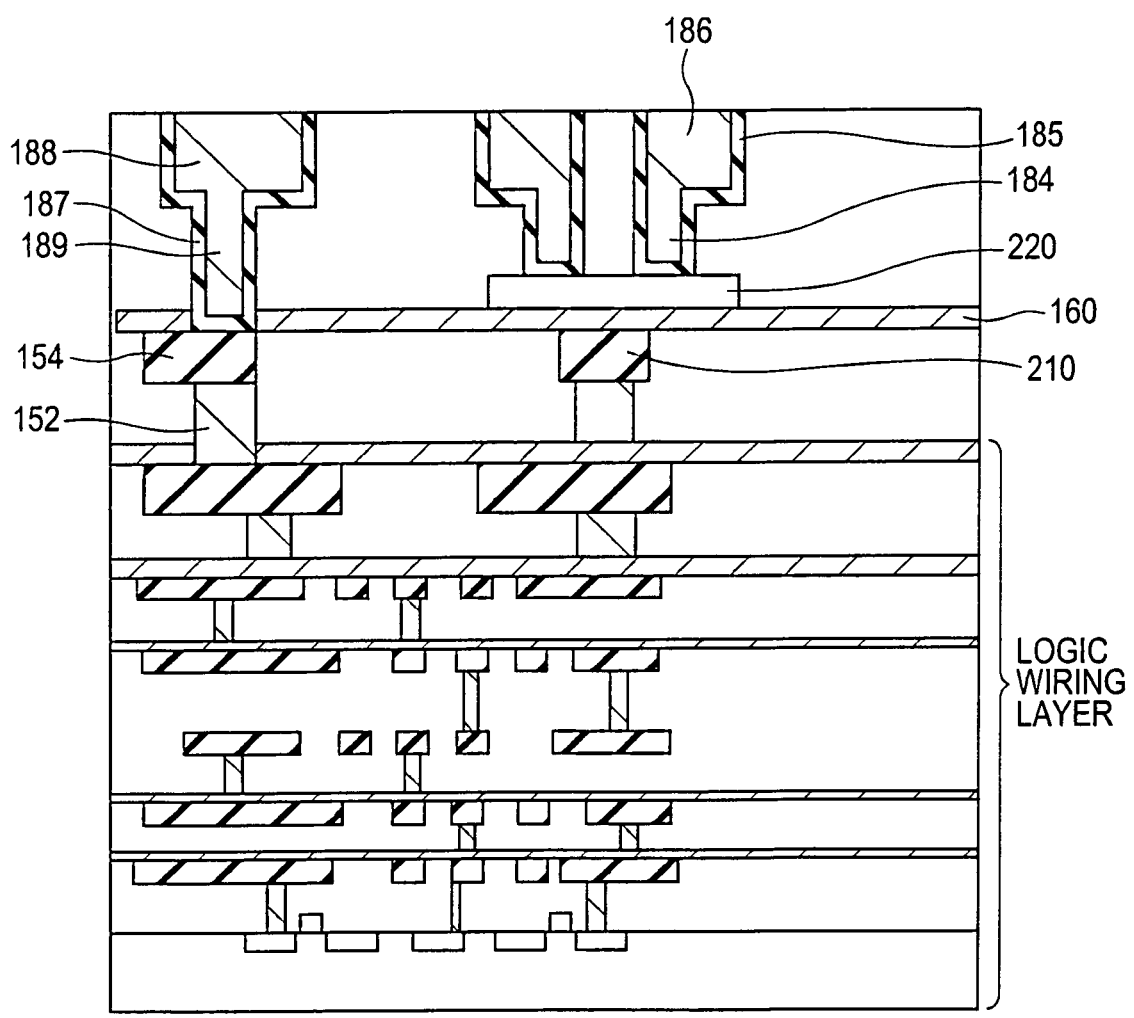
FIG. 37 is a cross-sectional diagram schematically showing one example of the semiconductor device of the present embodiment.

FIG. 36 is one example of a cross-sectional diagram of a semiconductor device according to the sixth embodiment, and the diagram which corresponds to FIG. 1 in the first embodiment. FIG. 37 is one example of a cross-sectional diagram of a semiconductor device including a structure shown in FIG. 36.

Figure 38:
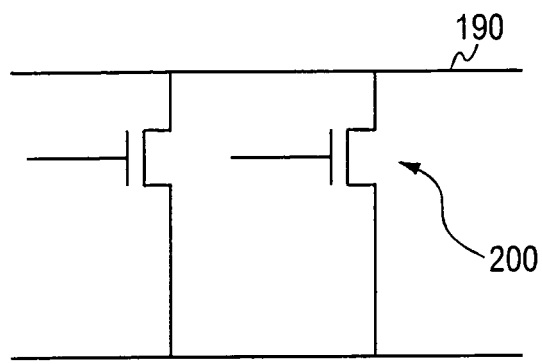
FIG. 38 is a diagram describing operation and effect of the semiconductor device of the present embodiment.

The semiconductor device shown in FIG. 36 has a wiring layer which embeds a third wiring 190 and a via 191 comprised of, for example, Al into an insulating layer 193 through a barrier metal 192 (for example, Ti) located further upper layer over the semiconductor device shown in FIG. 1. More specifically, the semiconductor device of this embodiment is formed by forming a wiring transistor (a semiconductor element 200) to an Al wiring of an upper layer pad (a third wiring 190) and a Cu wiring of the underlayer of the Al wiring of the pad. The third wiring 190 is used as, for example, a power source line or a signal line. The third wiring 190 is coupled to the first electric conductors 184, 186 and the second electric conductors 184, 186 through a contact which is not shown. The gate electrode 210 is coupled to the wiring in the underlayer through the contact which is not shown. One example of the semiconductor device in which the gate electrode 210 is coupled to the wiring in the underlayer is shown in FIG. 37. According to the semiconductor device having such a structure, as shown in FIG. 38, the device can operate as a switch which can flexibly switch a power source, a signal I/O line and a logic wiring.

Figure 58:
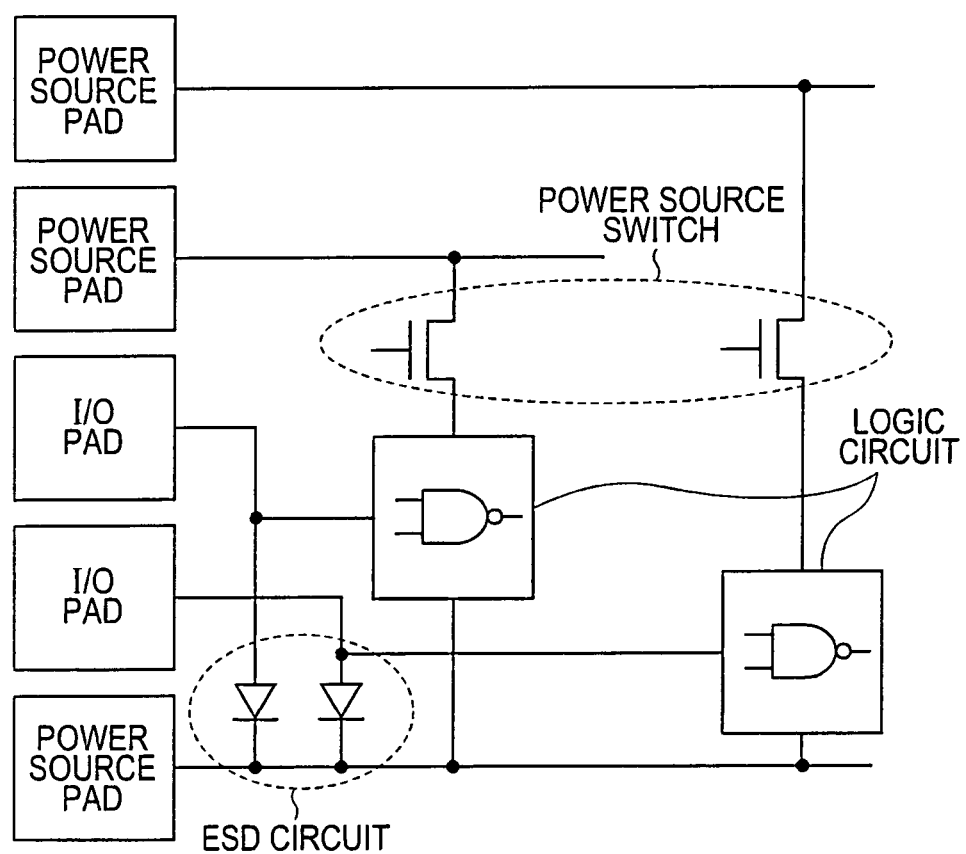
FIG. 58 is a diagram describing an application example of the semiconductor device of the present embodiment.

Subsequently, an application example of the semiconductor device of this embodiment will be described using FIG. 58. As described above, the semiconductor device of this embodiment can operate as a switch which can flexibly switch a power source pad, an I/O pad and a logic wiring. In addition, the semiconductor device of this embodiment can be used as a diode such as an ESD protecting element.

Although not shown, the hard mask 300 may provided over the semiconductor layer 220 according as the configuration of the second embodiment. In addition, although not shown, a stacked body comprised of the trap film 230, the back gate electrode 240 and the mask pattern 54 is provided over the semiconductor layer 220 according as the configuration of the third embodiment. Moreover, although not shown, the multiple gate electrodes 210 are not provided, and alternatively the stacked body comprised of the gate insulating film 232, the gate electrode 242 and the mask pattern 54 is provided over the semiconductor layer 220 and between the multiple first electric conductors 184, 186 and the multiple second electric conductors 184, 186 shown as a source (S) and a drain (D) in FIG. 33 according as the configuration of the fourth embodiment. In addition, both of the third wiring layer 190 and the via 191 may be a Cu wiring.

Seventh Embodiment

Figure 49A:
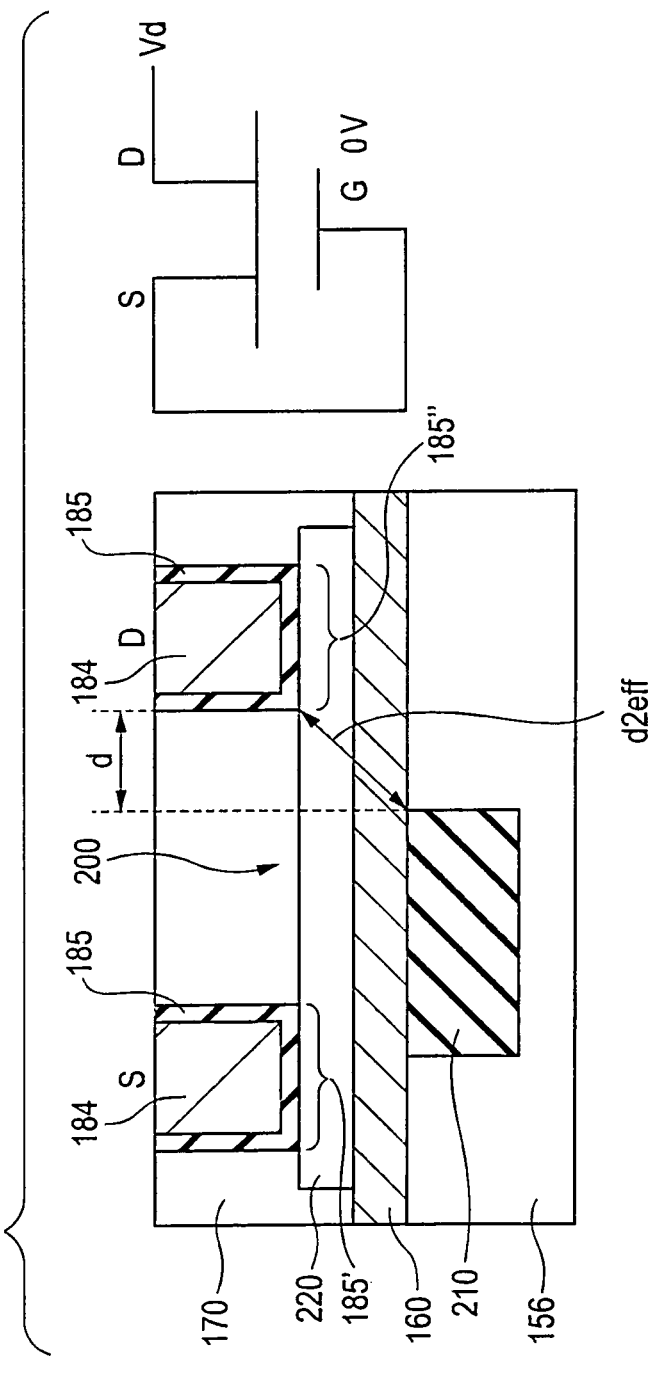
FIGS. 49A and 49B are cross-sectional diagrams schematically showing one example of the semiconductor device of the present embodiment.
Figure 49B:
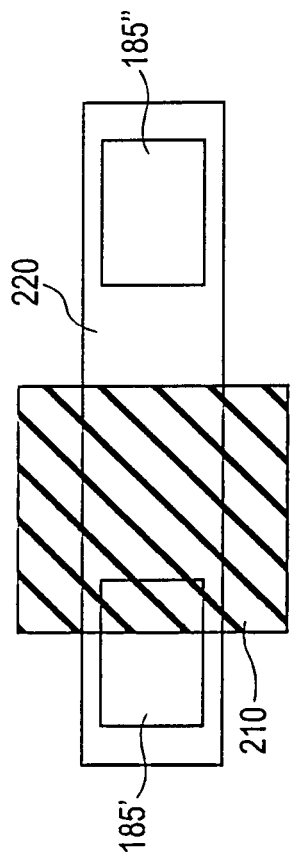

FIG. 49A is one example of a cross-sectional diagram extracting a substantial part of a semiconductor device according to the seventh embodiment. FIG. 49B is one example of a plan diagram extracting the semiconductor layer 220 and the gate electrode 210. Here, FIG. 49B shows a contact region of the semiconductor layer 220 and the barrier metal 185 (a first contact region 185' and a second contact region 185"). A configuration of the semiconductor device of this embodiment is similar to any one of the configurations of the first, the second, the third, the fifth and the sixth embodiments, except a positional relation between the gate electrode 210, and the first contact region 185' and the second contact region 185".

AS shown in FIGS. 49A and 49B, the gate electrode 210 may be overlapped with the first contact region 185' and may not be overlapped with the second contact region 185" in a plan view. Also, the gate electrode 210 may be overlapped with the second contact region 185" and may not be overlapped with the first contact region 185' in a plan view. As described above, when the gate electrode 210 has a configuration in which the electrode is overlapped with one of the first contact region 185' and the second contact region 185" and is not overlapped with the other, the gate electrode 210 is preferably overlapped with the contact region (the first contact region 185' or the second contact region 185") to which voltage is not applied (to be 0 V) in a plan view. The gate electrode 210 may also have a configuration in which the electrode is not overlapped with both of the first contact region 185' and the second contact region 185" in a plan view.

Figure 50A:
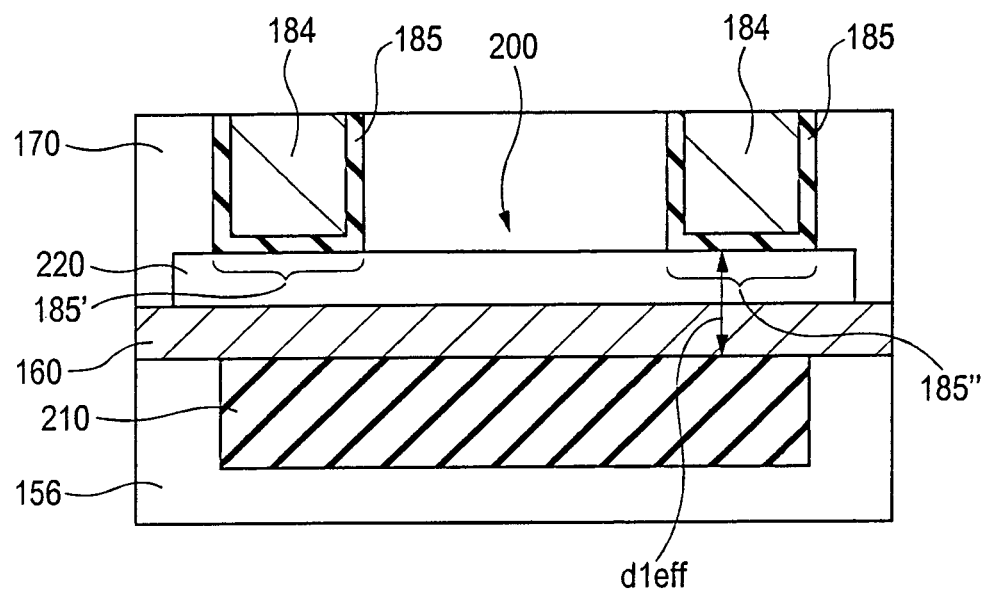
FIGS. 50A and 50B are cross-sectional diagrams schematically showing one example of the semiconductor device of the present embodiment.
Figure 50B:
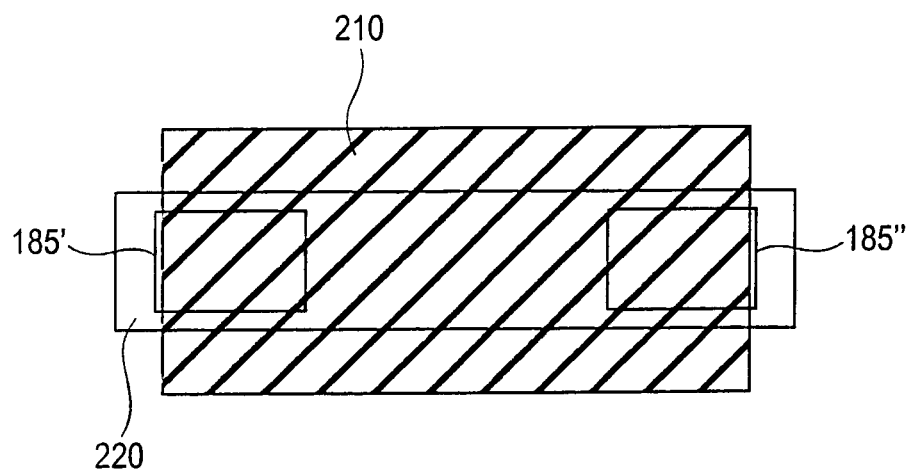

Subsequently, operation and effect of the semiconductor device of this embodiment will be described. As shown in FIGS. 50A and 50B, when the gate electrode 210 is overlapped with both of the first contact region 185' and the second contact region 185" in a plan view, this structure is a structure to which potential difference between the gate electrode 210 and the first contact region 185' (or the second contact region 185") is directly applied, and breakdown voltage of the device (the semiconductor element 200) is determined by a breakdown electric field intensity of the gate insulating film (the second insulating layer 160). In other words, a breakdown voltage of the device is determined by the breakdown electric field intensity of the gate insulating film (the second insulating layer 160), in other words, the breakdown voltage of the gate insulating film (the second insulating layer 160). In order to enhance the breakdown voltage of the gate insulating film itself, for example, a method of thickening of the gate insulating film (the second insulating layer 160) is possibly used. However, since this method results in decrease in a gate capacity, on-state current of the transistor may decrease.

Consequently, the semiconductor device of this embodiment improves the breakdown voltage of the device (the semiconductor element 200) by reducing an electric field intensity at the edge of the gate, without thickening the film thickness of the gate insulating film (the second insulating layer 160). For example, as shown in FIG. 49B, a distance from the gate electrode 210 to the first contact region 185' (or the second contact region 185") which is not overlapped with the gate electrode 210 in a plan view, more specifically, as shown in the diagram, a distance ($d_{2\mathit{eff}}$) from the edge of the gate electrode 210 to the edge of the first contact region 185' (or the second contact region 185") which is not overlapped with the gate electrode 210 in a plan view can be longer than a distance ($d_{1\mathit{eff}}$) from the gate electrode 210 having a structure shown in FIG. 50A to the first contact region 185' (or the second contact region 185"). Consequently, the electric field intensity at the edge of the gate can be reduced.

In other words, according to the semiconductor device of this embodiment, the breakdown voltage of the device (the semiconductor element 200) can be controlled by adjusting the distance ($d_{2\mathit{eff}}$) from the edge of the gate electrode 210 to the edge of the first contact region 185' (or the second contact region 185") which is not overlapped with the gate electrode 210 in a plan view.

When the gate electrode 210 has a configuration in which the electrode is overlapped with one of the contact region in the first contact region 185' and the second contact region 185" (the first contact region 185' or the second contact region 185") to which voltage is not applied (to be 0 V) and is not overlapped with the other in a plan view, the gate capacity can be increased at the part in which the gate electrode 210 and the contact region (the first contact region 185' or the second contact region 185") are overlapped and decrease in the on-state current of the transistor can be suppressed, except that the electric field intensity at the edge of the gate can be reduced as described above.

When the semiconductor device of this embodiment has the multiple semiconductor elements 200, the element having a configuration in which the gate electrode 210 is not overlapped with at least one of the first contact region 185' and the second contact region 185" in a plan view as shown in FIGS. 49A and 49B, and the element having a configuration in which the gate electrode 210 is overlapped with both of the first contact region 185' and the second contact region 185" in a plan view as shown in FIGS. 50A and 50B may be included among the semiconductor elements 200.

When the semiconductor device of this embodiment has the gate electrode 210 which has the multiple semiconductor elements 200 which is not overlapped with at least one of the first contact region 185' and the second contact region 185" in a plan view, the element having a configuration in which the gate electrode 210 is overlapped with one of the first contact region 185' and the second contact region 185" and not overlapped with the other in a plan view as shown in FIGS. 49A and 49B, and the element having a configuration in which gate electrode 210 is not overlapped with both of the first contact region 185' and the second contact region 185" in a plan view as shown in FIGS. 50A and 50B may be included among the semiconductor elements 200.

The semiconductor device in which the gate electrode 210 is not overlapped with either the first contact region 185' or the second contact region 185" can be used for, for example, a configuration of a semiconductor device in which high voltage is applied to only one of a source and a drain and a high breakdown voltage property is required. In such a case, the on-state current can be enhanced by overlapping the other of the first contact region 185' or the second contact region 135" with the gate electrode 210.

The semiconductor device in which both of the first contact region 185' and the second contact region 185" are not overlapped with the gate electrode 210 can be used for, for example a configuration of a semiconductor device in which high voltage is applied to both of a source and a drain and a high breakdown voltage property is required.

The semiconductor device in which both of the first contact region 185' and the second contact region 185" are overlapped with the gate electrode 210 can be used for, for example a configuration of a semiconductor device in which there is a need to further enhance the on-state current as well as breakdown voltage of the device which can be realized by adjusting the SiN film thickness and the like satisfies the required properties.

A method for manufacturing the semiconductor device of this embodiment can be realized according as the method in the first, the second, the third, the fifth and the sixth embodiments.

More specifically, in the second embedding step, the state after embedding may be set in such a state that at least one of the first contact region 185' and the second contact region 185" is not overlapped with the gate electrode in a plan view.

As another example, in a first embedded step, a first gate electrode and a second gate electrode are formed, and in a second embedded step, the state after embedding may be set in such a state that at least one of a first contact region and a second contact region of each barrier metal coupled to each of the first electric conductor and the second electric conductor sandwiching the first gate electrode and the semiconductor layer is not overlapped with the first gate electrode in a plan view and both of the first contact region and the second contact region of each barrier metal coupled to each of the first electric conductor and the second electric conductor sandwiching the second gate electrode and the semiconductor layer are overlapped with the second gate electrode in a plan view.

Eighth Embodiment

Figure 52B:
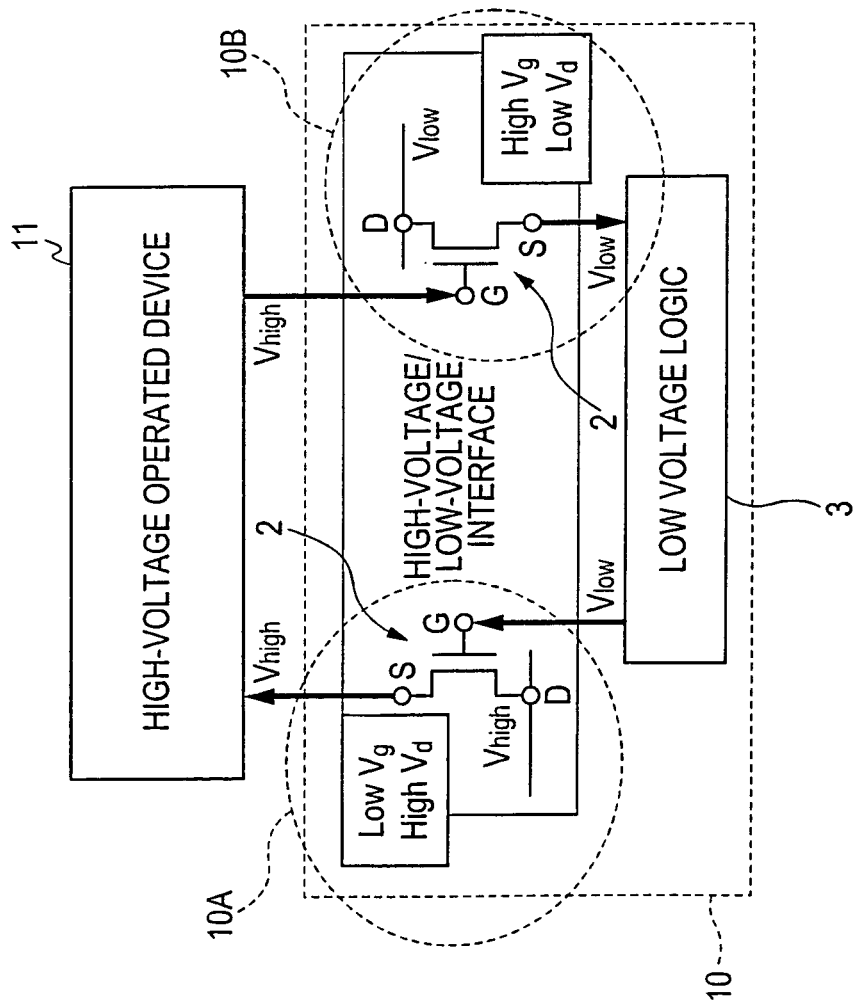
FIGS. 52A and 52B are diagrams describing an application example of the semiconductor device of the present embodiment.

In FIG. 52B, a cross-sectional diagram which extracts a substantial part of a semiconductor device 10 of this embodiment and schematically shows the part.

As shown in FIG. 52B, the semiconductor device 10 of this embodiment has an on-substrate element 1. The on-substrate element 1 has an on-substrate gate electrode formed over a semiconductor substrate through a gate insulating film and a source and a drain formed by injecting impurity to the semiconductor substrate. The on-substrate element is formed on the surface of a Si substrate.

The semiconductor device 10 of this embodiment has a multi-layer wiring layer formed in a upper layer of the on-substrate element 1. The on-substrate element 1 and a part of the multi-layer wiring layer form a logic circuit 3.

The semiconductor device 10 of this embodiment has a wiring layer element 2 in the multi-layer wiring layer. The wiring layer element 2 is an element which is formed in the second region described in the first to the seventh embodiments, for example, an element which is formed in the right-side region from the dash line of A-A in FIG. 1. More specifically, the wiring layer element 2 has the gate electrode, the second insulating layer, the semiconductor layer, the barrier metal, the first electric conductor and the second electric conductor. A configuration of the wiring layer element 2 shown in FIG. 52B is just one example, and every configuration described in the first to the seventh embodiments can be applicable.

The on-substrate element 1 and the wiring layer element 2 are electrically coupled each other through the multi-layer wiring layer.

Figure 52A:
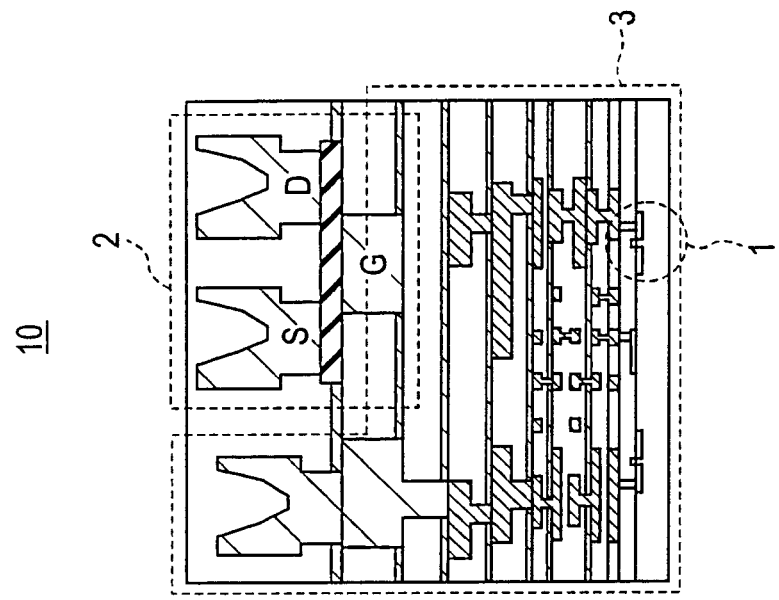

Subsequently, the diagram for illustrating one example of application method of the semiconductor device 10 of this embodiment shown in FIG. 52B is shown in FIG. 52A. The application method will be described below.

The semiconductor device 10 is, for example, an LSI chip and is coupled to an external device 11. The external device 11 includes not only a semiconductor device such as electronic device for automotive use but also a motor, a transmitter/receiver, a sensor and the like, and any device may be applicable as long as the device is required to be operated in higher voltage than voltage for operating the logic circuit 3 (hereinafter referred to as "logic circuit voltage"). Hereinafter, voltage for operating the device 11 is referred to as "device voltage". Such a device 11 exchanges signals and the like in higher voltage than the logic circuit voltage with the semiconductor device 10.

On the other hand, when device voltage higher than the logic circuit voltage is directly inputted to the logic circuit 3, an element forming the logic circuit will be broken. Consequently, the wiring layer element 2 acts as an intermediate of signals having different voltage level. For example, when a signal is supplied from the logic circuit 3 to the device 11, as shown in 10A, a drain of the wiring layer element 2 is coupled to a high voltage power source (a power source which supplies the voltage higher than the logic circuit voltage), and the drain is coupled so that an input signal supplied from the logic circuit 3 is inputted to the gate of the wiring layer element 2. By this input signal, electric current is supplied from the high voltage power source to the device 11 through the wiring layer element 2 and the device 11 is operated.

On the other hand, when the signal is supplied from the device 11 to the logic circuit 3, as shown in 10B, a high voltage signal transmitted from the device 11 to the semiconductor device 10 is inputted to the gate of the wiring layer element 2 having high breakdown voltage. In this case, the drain side of the wiring layer element 2 is coupled to a low voltage power source (a power source which supplies the voltage lower than the device voltage). Electric current is supplied from the low voltage power source to the logic circuit 3 and the signal is transmitted by the high voltage signal inputted from the device 11 through the wiring layer element 2.

As described above, the wiring layer element 2 acts as converting a low voltage signal from the logic circuit 3 into a high voltage signal for operating the device 11 or converting the high voltage signal inputted from the device 11 into the low voltage signal for inputting the low voltage signal to the logic circuit 3.

The logic circuit 3 is preferably operated at low voltage in order to decrease electric power consumption, and the device 11 has characteristics of operating in higher voltage than this low voltage. When the logic circuit 3 is operated at 1 V, the device 11 is, for example, operated at 3.3 V or operated at 5 V. The breakdown voltage of the wiring layer element 2 can be set to 50 V or more. Consequently, operation voltage of the device 11 can be a high voltage of 10 V to 20 V, which is used in an automotive device, a liquid crystal driver or the like. Moreover, a 40-V class or, optionally, a 100-V class device can be operated.

As described above, the semiconductor device 10 of this embodiment has a function which is performed as a switching operation by the first signal inputted from the on-substrate element 1 (included in the logic circuit 3) electrically coupled to a gate electrode in the first wiring layer element 2 to the aforementioned gate electrode, and supplies higher than the voltage of the first signal to the first device 11 electrically coupled to the first wiring layer element 2 by the aforementioned switching operation.

In such a semiconductor device 10 of this embodiment, as shown in 10A in FIG. 52A, a first electric conductor (a drain) of the first wiring layer element 2 is electrically coupled to a first voltage power source which supplies higher voltage than the voltage of the first signal, and a second electric conductor (a source) of the first wiring layer element 2 is electrically coupled to the first device 11.

The second wiring layer element 2 of the semiconductor device 10 of this embodiment has a function which is performed as a switching operation by the second signal inputted from the second device 11 electrically coupled to a gate electrode in the second wiring layer element 2 to the aforementioned gate electrode, and supplies voltage lower than the voltage of the second signal to the on-substrate element 1 in the logic circuit 3 by the aforementioned switching operation.

In such a semiconductor device 10 of this embodiment, as shown in 10B in FIG. 52A, the first electric conductor (the drain) of the first wiring layer element 2 is electrically coupled to a second voltage power source which supplies lower voltage than the voltage of the second signal, and the second electric conductor (the source) of the second wiring layer element 2 is electrically coupled to the on-substrate element 1.

In the semiconductor device 10 of this embodiment, when the wiring layer element 2 is formed as the configuration described in the seventh embodiment, the first contact region of the barrier metal contacting to the first electric conductor (the drain) and the semiconductor layer may not be overlapped with the gate electrode in a plan view. The second contact region of the barrier metal contacting to the second electric conductor (the source) and the semiconductor layer may be overlapped with the gate electrode in a plan view.

Although the low voltage power source and the high voltage power source are illustrated in the semiconductor device 10 in FIG. 52A, these power sources may be provided out of the semiconductor device 10.

EXAMPLES

Various experimental results will be described below when an InGaZnO layer is used for a semiconductor layer. The inventors of the present invention confirm that, when an InZnO layer, a ZnO layer, a ZnAlO layer or a ZnCuO layer is used in the semiconductor layer, a similar experimental result is obtained.

First Example

First, InGaZnO films were formed by using RF magnetron sputtering. The film-forming conditions are as follows. Power: 2 kW, Pressure: 3.0 mTorr, Sputter Gas: Ar+oxygen=25 sccm, Substrate Temperature: 300° C., Oxygen Concentration: 0% to 24%. The films were formed over 8-inch Si substrates.

Figures 18, 19:
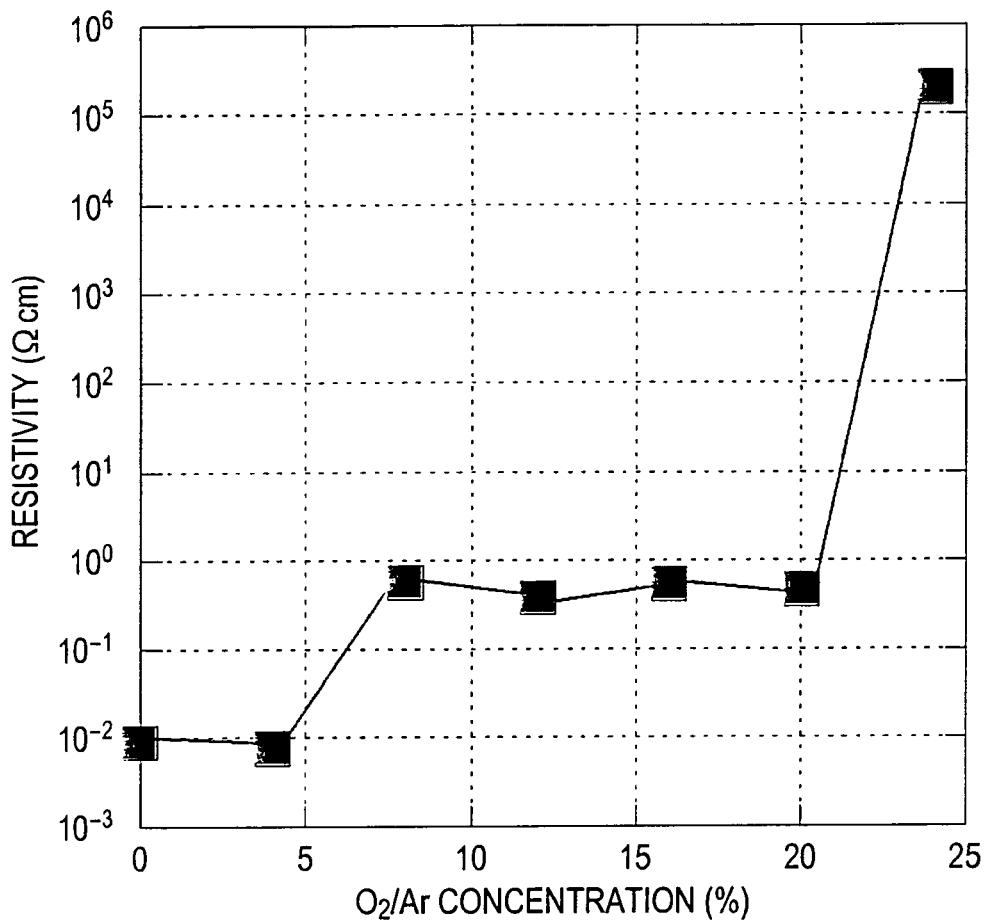
FIG. 18 is a diagram describing operation and effect of the semiconductor device of the present embodiment.
FIG. 19 is a diagram describing operation and effect of the semiconductor device of the present embodiment.

A measured result of oxygen concentration dependence of electric property when the films are a bilayer films of InGaZnO (film thickness: 100 nm)/$SiO_2$ (film thickness: 100 nm) formed over the Si substrates and In is used for electrodes is shown in FIG. 18. It is found that resistivity of InGaZnO is significantly changed depending on a ratio of Ar and oxygen as the sputter gas. When the oxygen concentration is low ($O_2$/Ar concentration: 0% and 4%), the resistivity is decreased because oxygen defects tend to be introduced to the sputter films and the defects act as leak paths. On the contrary, the films show an insulation property under the condition of excessive oxygen. This result indicates that, when InGaZnO is exposed to direct reduction atmosphere, resistance thereof substantially decreases. Thereby, semiconductor properties are lost.

Figure 20:
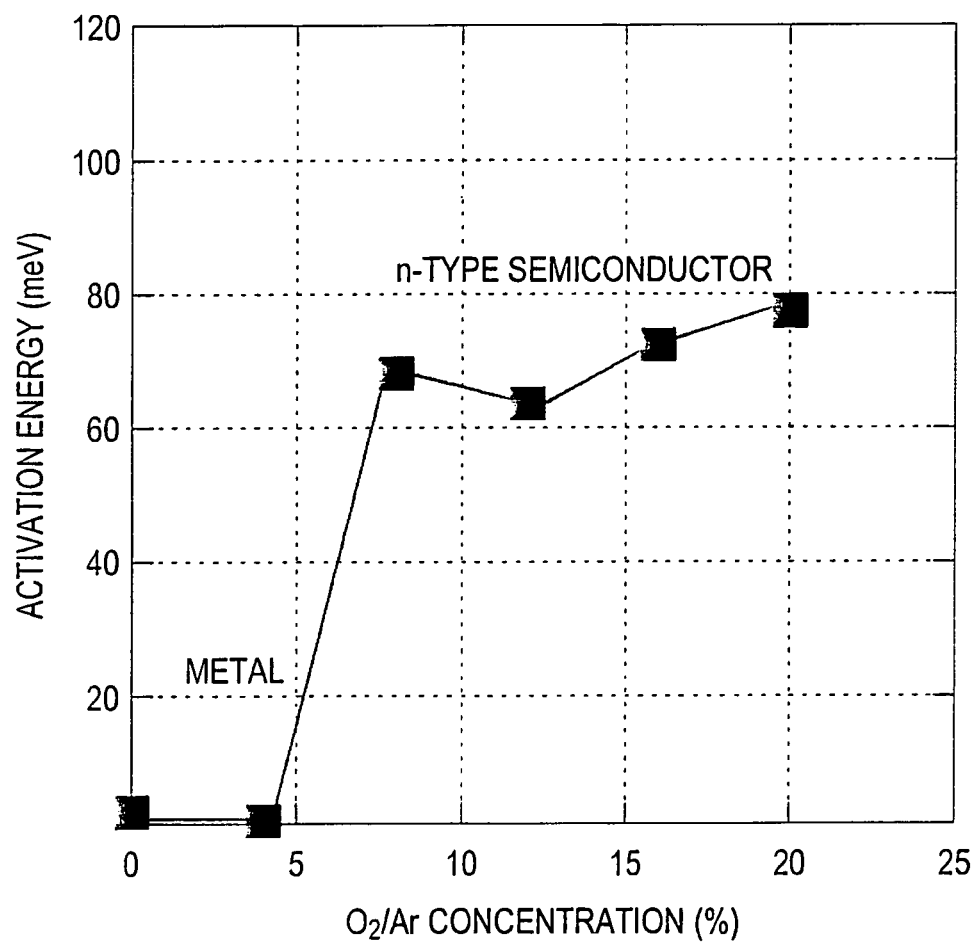
FIG. 20 is a diagram describing operation and effect of the semiconductor device of the present embodiment.

Subsequently, a result in which activation energy is calculated from temperature dependence of sheet resistance when samples of the bilayer films of InGaZnO (film thickness: 100 nm)/$SiO_2$ (film thickness: 100 nm) formed over the Si substrates is shown in FIG. 20. The films show a metallic property when an $O_2$/Ar concentration is 0% and 4%, an n-type semiconductor property having activation energy of 60 meV to 80 meV when the $O_2$/Ar concentration is 8% to 20%, and an insulating property when the $O_2$/Ar concentration is 24%. Referring to oxygen concentration dependence of resistivity of the InGaZnO films in FIG. 18, the films having high leak in low oxygen concentration conditions ($O_2$/Ar concentration: 0% and 4%) are metal and a film having a condition of excessive oxygen ($O_2$/Ar concentration: 24%) is an insulating material. Consequently, it is found that desired semiconductor properties are obtained by controlling the oxygen concentration.

In addition, a result of hole effect measurement for films of InGaZnO (film thickness: 100 nm)/$SiO_2$ (film thickness: 100 nm) having oxygen concentrations of 12%, 16% and 20% among the measured samples of FIG. 20 is shown in FIG. 19. These InGaZnO films show semiconductor properties. The films having a mobility of 7 $cm^2$/Vs or higher and 26 $cm^2$/Vs or lower and a carrier concentration of $2\times10^{17}$ $cm^{-3}$ or higher and $6\times10^{19}$ $cm^{-3}$ or lower are obtained.

Form the measurement results of the above-described resistivity and semiconductor properties, it is found that InGaZnO is not functioned as a semiconductor when the oxygen defects are high in the InGaZnO films. Consequently, when an insulating film is formed under reduction atmosphere to the InGaZnO film having n-type semiconductor properties, the oxygen defects of InGaZnO are increased. As a result, InGaZnO looses semiconductor properties thereof by the formation of the insulating film.

Second Example

Subsequently, a SiN film (film thickness: 50 nm) is formed over InGaZnO (film thickness: 50 nm) by a plasma CVD method using $SiH_4$ gas and $NH_3$ gas. A contact with InGaZnO is formed by dry etching to the SiN film. A result of measuring resistivity of the InGaZnO is described. A film-forming condition of the InGaZnO film were similar to the conditions in the first example. The oxygen concentration was set to 8%.

Figure 21:
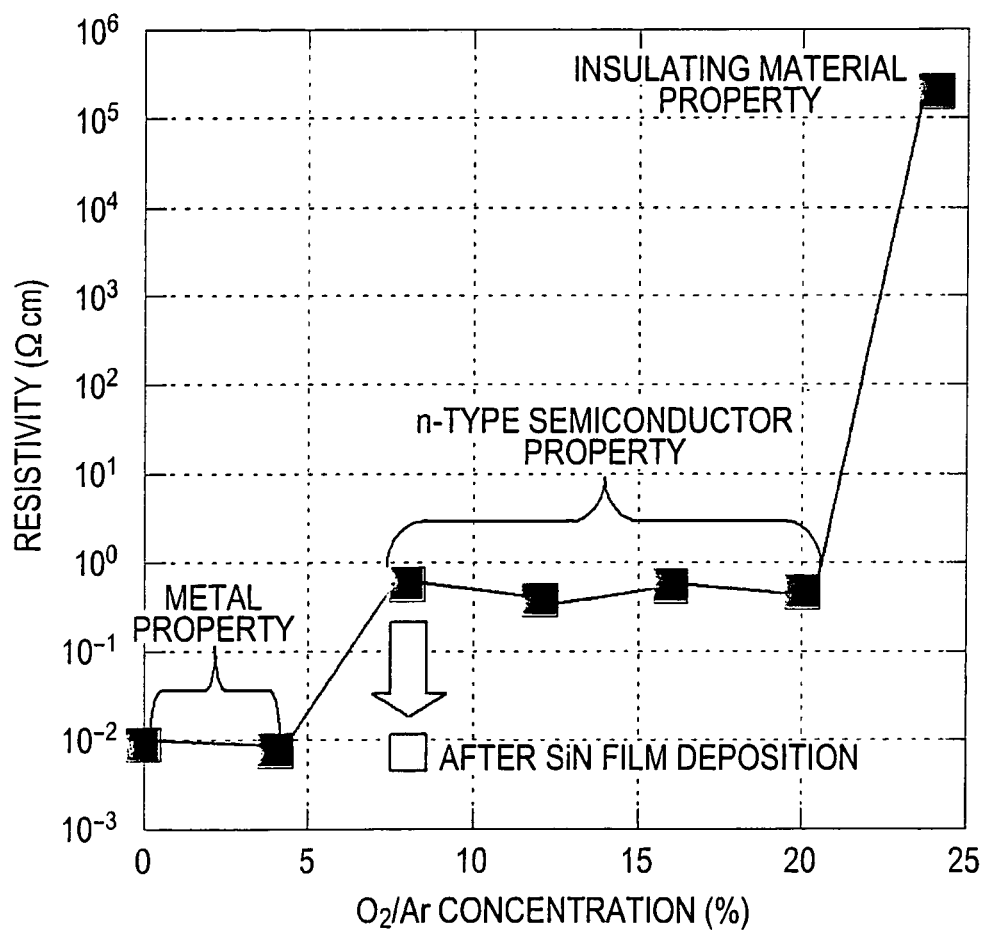
FIG. 21 is a diagram describing operation and effect of the semiconductor device of the present embodiment.

The resistivity of the InGaZnO in a film structure of SiN (film thickness: 50 nm)/InGaZnO (film thickness: 50 nm) is shown in FIG. 21. From the diagram, the resistivity is decreased in 2 to 3 digits by forming the SiN over the InGaZnO. This is possibly because the InGaZnO is reduced by the $SiH_4$ gas and the $NH_3$ gas at the time of CVD film formation of the SiN film. Consequently, the film becomes a metallic film having many oxygen defects. This result means that, when a semiconductor element in a multi-layer wiring using the InGaZnO as a semiconductor channel layer is formed, the InGaZnO finally looses its function as the channel layer with forming a insulating layer and a wiring layer over the InGaZnO.

On the contrary, the inventors confirms that, when a hard mask which does not deteriorate semiconductor properties is formed over InGaZnO, a semiconductor layer can be protected from reduction at the time of forming an insulating film and a wiring layer and plasma damage. Consequently, loss of the semiconductor properties of a semiconductor element using InGaZnO in a multi-layer wiring can be prevented. It is possibly preferable that, when InGaZnO is used as a semiconductor channel in the multi-layer wiring, oxidation treatment preventing reduction of InGaZnO or enhancing anti-reduction property is performed and a film having low reduction action is used as a hard mask over the InGaZnO.

Third Example

When a semiconductor element in a multi-layer wiring using the InGaZnO as a semiconductor channel layer is formed, formation of an ohmic contact with InGaZnO is very important. The semiconductor device of the present invention does not provide an additional process for forming the ohmic contact. The formation of the barrier metal 187 of the via 189 in the first region (see FIG. 1) and the formation of the barrier metal 185 in the second region are preformed at the same time. Consequently, the number of process can be decreased.

Figure 22:
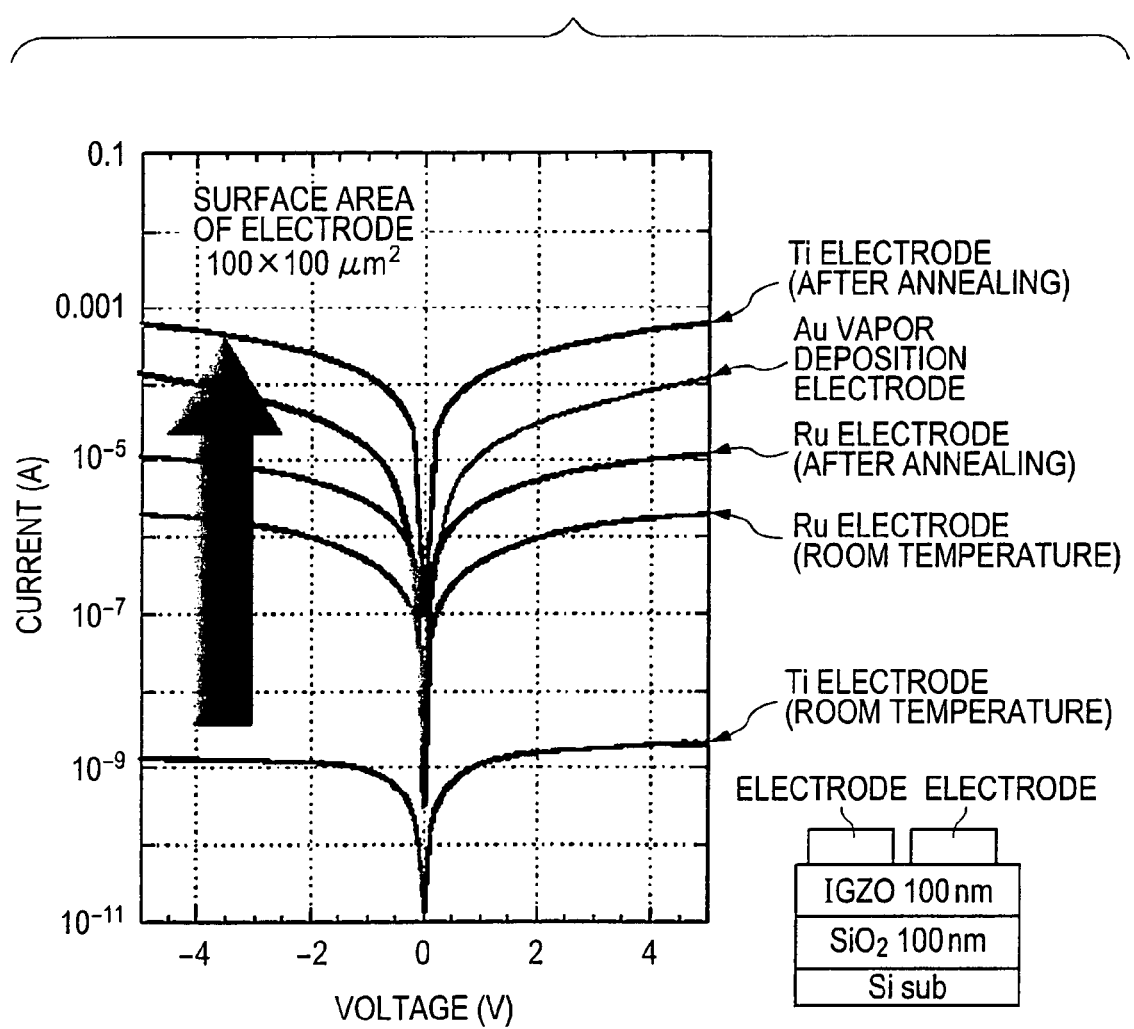
FIG. 22 is a diagram describing operation and effect of the semiconductor device of the present embodiment.

A result of a current-voltage property of InGaZnO and sputter electrodes of Ti and Ru at room temperature, an Au vapor deposition film and annealed Ti and Ru electrodes at 300° C. are shown in FIG. 22. The Ti electrode can form an ohmic contact by annealing, because resistance between InGaZnO and the electrode is lowered compared to the film formed at room temperature. In addition, the ohmic contact can also be formed using Ru and Au. The inventors confirm that the ohmic contact can also be formed when a Ta electrode and a W electrode are used.

Fourth Example

Figure 24:
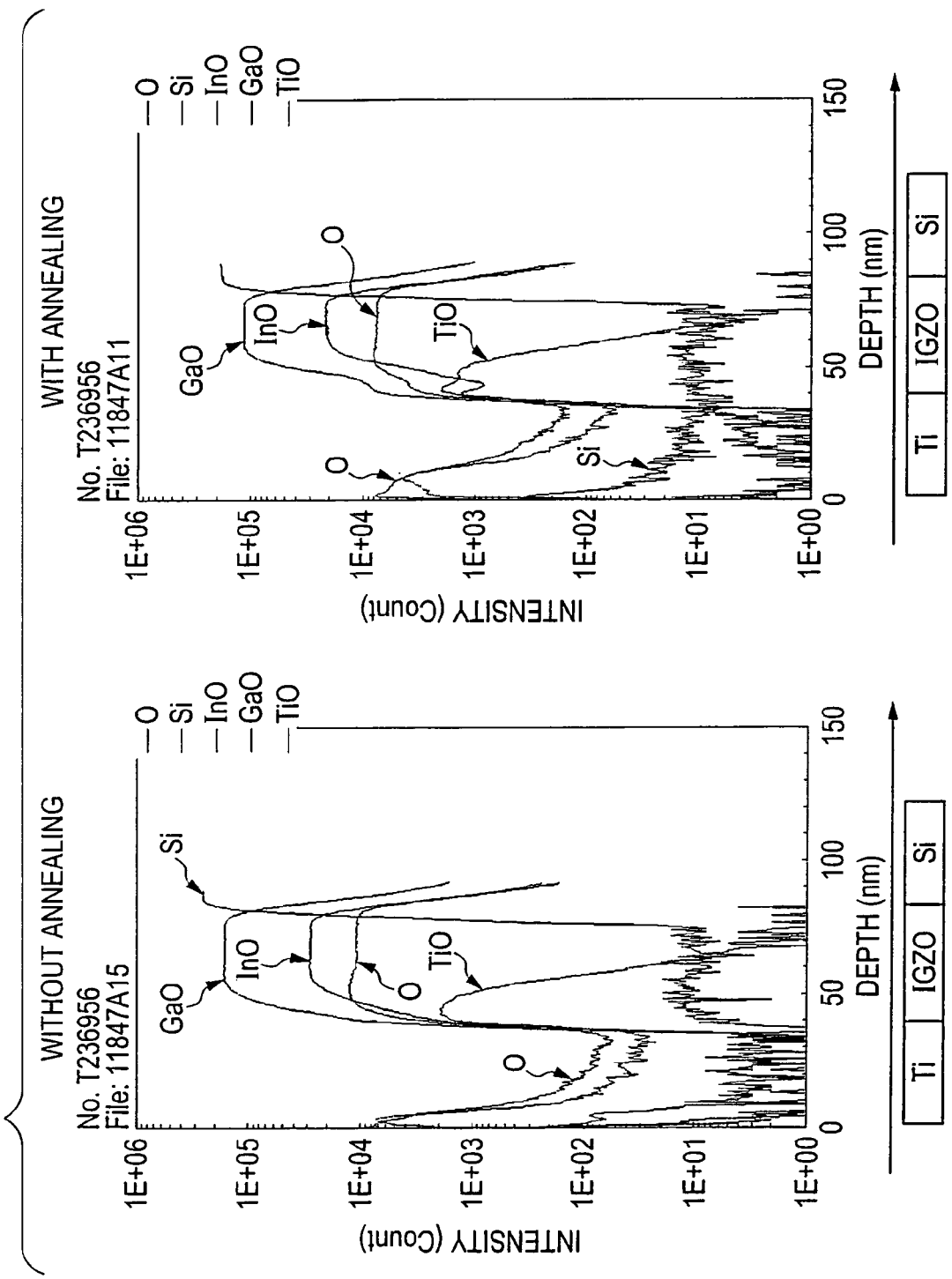
FIG. 24 is a diagram describing operation and effect of the semiconductor device of the present embodiment.

Subsequently, a cross-sectional TEM image of the stacked structure of Ti (film thickness: 100 nm)/InGaZnO (film thickness: 100 nm)/Si is shown in FIG. 23. From FIG. 23, it is found that a diffusion layer is formed in InGaZnO by annealing. In order to see elemental profile of a diffusion layer in detail, a result of analysis with SIMS (secondary ion mass spectrometry) corresponding to FIG. 23 is shown in FIG. 24. It is found that Ti diffuses into InGaZnO by annealing, and a film thickness thereof is approximately 5 nm to 8 nm. Formation of the diffusion layer of Ti in InGaZnO after annealing leads to decrease in resistance between Ti and InGaZnO, and formation of the excellent ohmic contact can be realized.

Fifth Example

Subsequently, a contact of Ti/InGaZnO after etching will be described. Here, contact etching of a multi-layer wiring is assumed. A sample in which $SiO_2$ over InGaZnO in the stacked structure of $SiO_2$ (film thickness: 100 nm)/InGaZnO (film thickness: 100 nm)/$SiO_2$ (film thickness: 100 nm) formed over the Si substrate is removed by dry etching using $CF_4$/Ar gas, and then an electrode of Ti (film thickness: 10 nm) is formed was used. Verification of an I-V property of this sample corresponds to verification of effect of etching treatment to the InGaZnO layer at the time of opening a source and a drain contact to InGaZnO, when a semiconductor element is formed in a multi-layer wiring.

Figure 25:
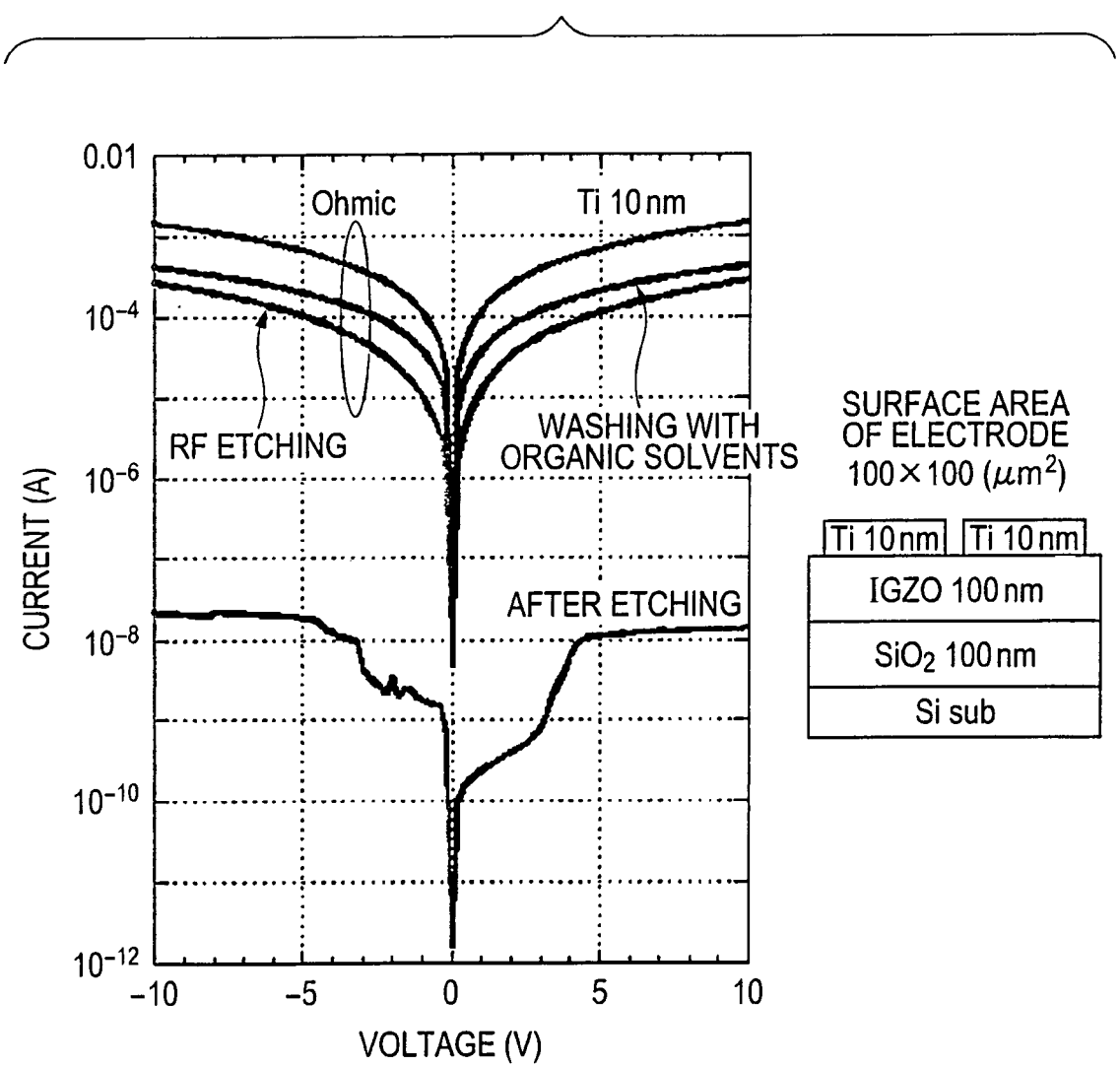
FIG. 25 is a diagram describing operation and effect of the semiconductor device of the present embodiment.
Figure 47:
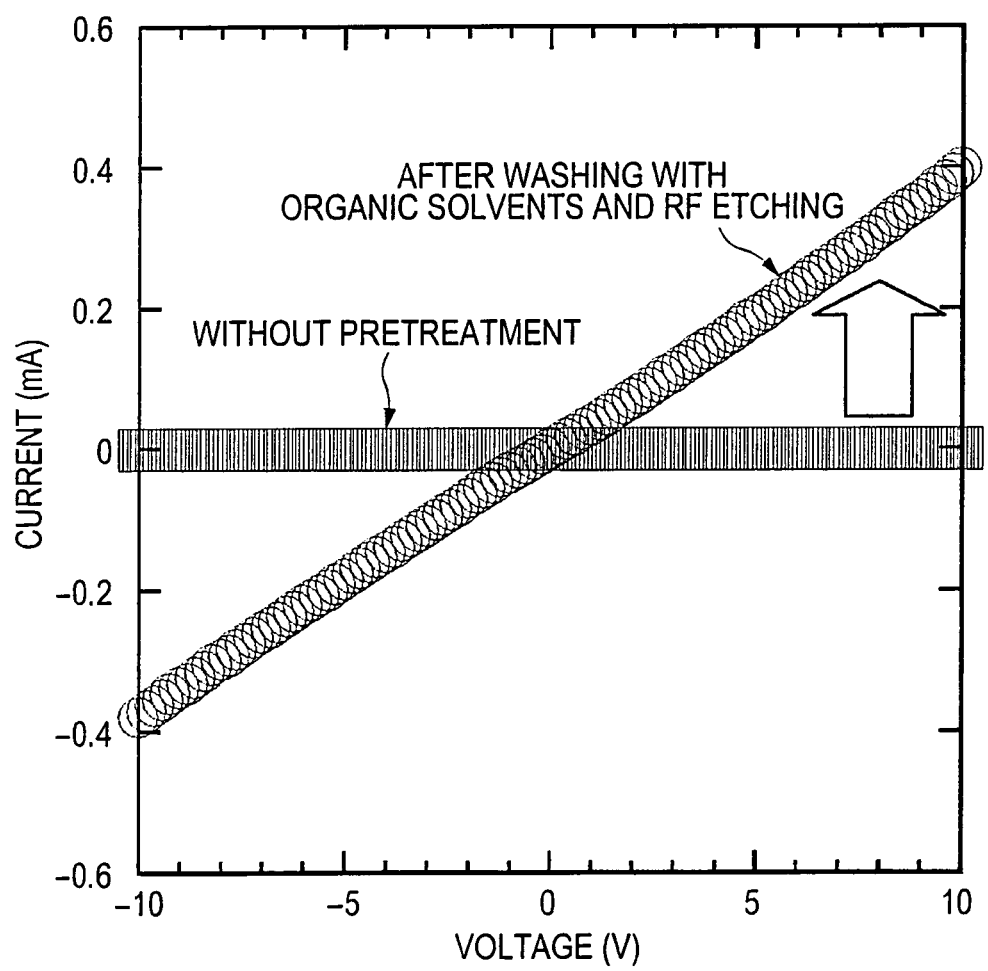
FIG. 47 is a diagram describing operation and effect of the semiconductor device of the present embodiment.

In a sample of Ti (film thickness: 10 nm)/InGaZnO (film thickness: 100 nm)/$SiO_2$ (film thickness: 100 nm)/Si substrate, the above-described etching to a stacked structure of $SiO_2$ (film thickness: 100 nm)/InGaZnO (film thickness: 100 nm)/$SiO_2$ (film thickness: 100 nm) formed over the Si substrate was performed. Thereafter, I-V properties of (1) a sample of Ti (film thickness: 10 nm) is formed without other treatment and (2) a sample of Ti (thickness: 10 nm) is formed after washing with an organic solvent or RF etching treatment after the etching are shown in FIG. 25. In addition, a I-V property of a sample in which both washing with an organic solvent and RF etching treatment are performed after the etching is shown in FIG. 47. It is found that a sample in which an InGaZnO film surface having an insulating property is formed by dry etching at the time of contact opening over InGaZnO and a Ti electrode is formed after the etching without other treatment cannot obtain an ohmic contact of Ti/InGaZnO. On the contrary, it is found that, when the washing with an organic solvent and the RF etching treatment is performed, an insulating property of the InGaZnO surface after etching which corresponds to the contact etching is improved and an ohmic contact of Ti/InGaZnO is formed. By these processes described above, the ohmic contact can be formed by the Ti electrodes of the source and the drain to the semiconductor element using an InGaZnO channel layer formed in the multi-layer wiring. Ti also functions as a diffusion prevention metal of the wiring layer.

The inventors confirm that, when Ta, Ru or W is applied instead of Ti, and when oxides or nitrides of Ti, Ta, Ru or W is applied, similar results are also obtained.

Sixth Example

Subsequently, a result of investigation of a dry etching process of a InGaZnO channel will be described.

One example of process cross-sectional diagram of the present invention in relation to a dry process of the InGaZnO channel is shown in FIGS. 26A and 26B. First, as shown in FIG. 26A, a process in which a hard mask $SiO_2$ (SiN or SiOH may also be used) and a resist is used and dry etching is terminated at the InGaZnO film is performed. Subsequently, as shown in FIG. 26B, InGaZnO is patterned by using the hard mask $SiO_2$ as a mask, and dry etching is terminated at an insulating film (SiN) which is an underlayer of InGaZnO to form micropattern of HM-SiO$_2$/InGaZnO. In the process of FIG. 26B, InGaZnO cannot be processed using SiO$_2$ as the hard mask, if a selectivity ratio of HM-SiO$_2$/InGaZnO is not high. Consequently, high selectivity is essential. Moreover, process allowance by over-etching after the process of InGaZnO becomes larger by increasing in the selectivity ratio of InGaZnO/SiN in a SiN process. As a result, complete elimination of SiN caused by the over-etching of the InGaZnO patterning process is easily prevented.

First, the dry etching of InGaZnO was investigated. In the etching using Cl$_2$ gas, which has a high metal-etching property, an etching rate of the InGaZnO film was 19.2 nm/min. On the other hand, when the dry etching was performed using mixed gas of BCl$_3$, which is reduction gas, and Cl$_2$, which has the high metal-etching property, an etching rate of the InGaZnO film was 27.6 nm/min.

Subsequently, an etching rate of SiN is suppressed and the selectivity ratio of InGaZnO/SiN was improved by introducing N$_2$ which is the element contained in SiN. As a result, a selectivity ratio of 1.6 was obtained. A selectivity ratio of SiO$_2$/InGaZnO under the same conditions was 1.7. The above results are summarized in FIG. 27. It was found that microfabrication with the dry etching of InGaZnO using hard mask SiO$_2$ shown in FIGS. 26A and 26B by using the high selectivity ratio condition shown in FIG. 27. Since InGaZnO/SiN also has the high selectivity ratio, dry etching of InGaZnO using SiN as a hard mask is also possible in a similar fashion.

Seventh Example

Figure 28A:
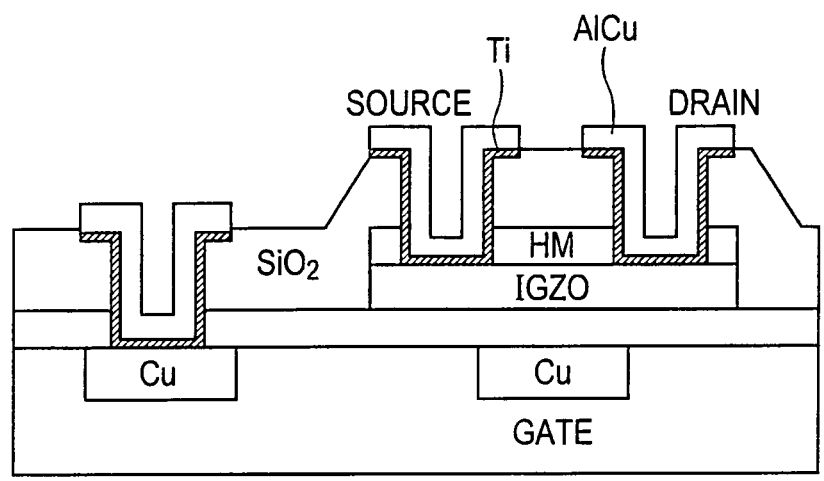
FIGS. 28A and 28B are diagrams describing operation and effect of the semiconductor device of the present embodiment.
Figure 28B:
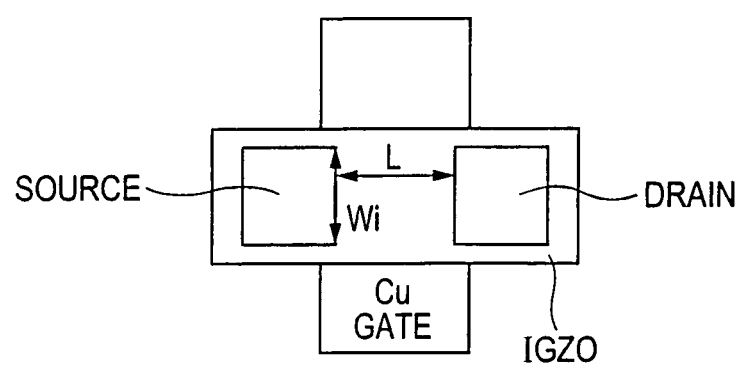

Subsequently, a MOS transistor using InGaZnO channels which is actually prepared will be described. First, a cross-sectional structure of the transistor and a transistor pattern are shown in FIGS. 28A and 28B. A basic structure is similar to the structure shown in FIG. 7. Particularly, in FIGS. 28A and 28B, InGaZnO is used as a semiconductor layer and SiN or SiO$_2$ is used as a hard mask located over the semiconductor layer. A source and a drain contact are Ti electrodes (Ti hard metal)/InGaZnO and AlCu is used for a contact wiring. Here, "L" shown in FIG. 28B indicates a distance between the source and the drain, and "Wi" indicates a width of the source and the drain (this aforementioned precondition is similar to all of Examples described below).

The hard mask (SiN or SiO$_2$) is formed by a plasma CVD method at 200° C. InGaZnO is formed by a sputtering method at 300° C. SiN acting as a diffusion prevention film and a gate insulating film is formed by the plasma CVD method at 350° C. These temperatures are corresponding to a temperature of the multi-layer wiring process. The gate electrode of FIGS. 28A and 28B uses a Cu wiring and has a back-gate type structure. SiN is formed using SiH$_4$ gas and NH$_3$ gas and SiO$_2$ is formed using SiH$_4$ gas and N$_2$O gas by the plasma CVD method.

Figure 29:
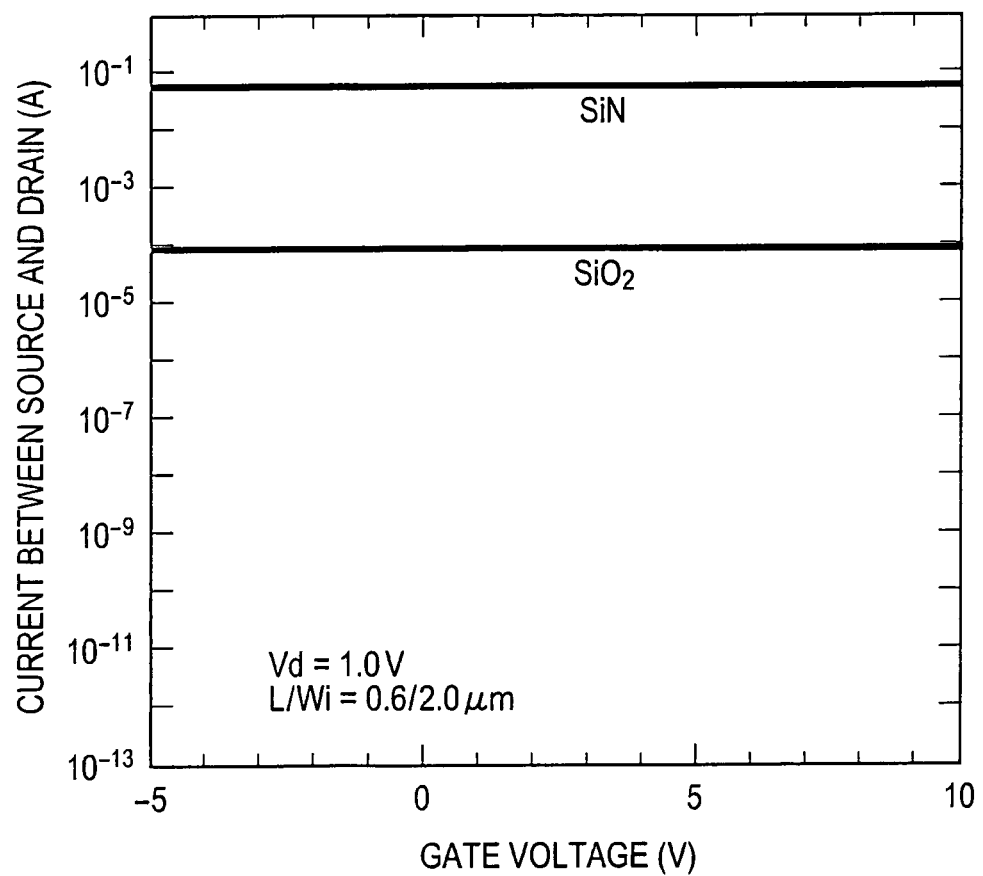
FIG. 29 is a diagram describing operation and effect of the semiconductor device of the present embodiment.

Plotted lines in relation to current between the source and the drain(hereinafter referred to as "Id") and gate bias (hereinafter referred to as "Vg") when SiN or SiO$_2$ is used as the hard mask are shown in FIG. 29. While the formation of SiN uses gases having strong reduction action (SiH$_4$, NH$_3$), SiO$_2$ is formed by using gasses having oxidation action (N$_2$O gas) and SiH$_4$. As a result, decrease in resistance with reduction action of the channel is suppressed to some extent. However, it is found that, when the hard mask (SiN or SiO$_2$) over InGaZnO is directly formed by the CVD method without pretreatment, the InGaZnO film may loose semiconductor properties due to decrease in resistance of the InGaZnO film by reducing the InGaZnO channel with SiH$_4$ and NH$_3$.

Eighth Example

Figure 30:
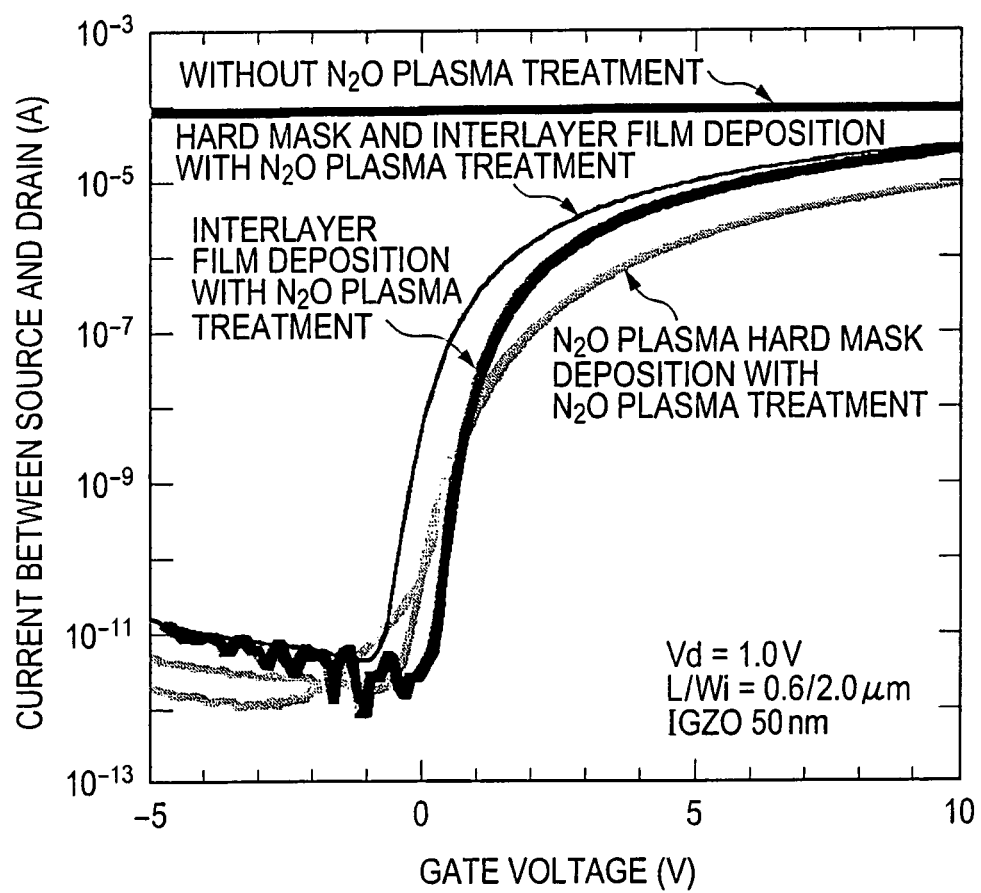
FIG. 30 is a diagram describing operation and effect of the semiconductor device of the present embodiment.

Subsequently, transistor properties of the semiconductor element were compared. N$_2$O plasma treatment dependence of the transistor properties is shown in FIG. 30. The longitudinal axis indicates current per channel width. Description in the drawing is as follows. "N$_2$O plasma interlayer film" indicates that in-situ N$_2$O plasma pretreatment was performed at the time of forming an interlayer film (a third insulating layer). "N$_2$O plasma hard mask" indicates that in-situ N$_2$O plasma pretreatment was performed at the time of formation of the hard mask. "N$_2$O plasma hard mask+interlayer film" indicates that in-situ N$_2$O plasma pretreatment was performed at the time of formation of the interlayer film (the third insulating film) and forming the hard mask.

From FIG. 30, it is found that deterioration of semiconductor properties of the InGaZnO channel is suppressed and a switching property is obtained by the N$_2$O plasma treatment. The N$_2$O plasma treatment is performed at the time of hard mask formation or after dry etching for pattern formation of InGaZnO (at the time of interlayer film formation). Thereby, suppression effect of the deterioration or recovery effect from the deterioration of semiconductor properties of an oxide semiconductor is obtained. As described above, in the N$_2$O plasma treatment at the time of hard mask formation, an oxidized state of the InGaZnO channel can be stabilized. Consequently, the deterioration of the semiconductor properties is possibly suppressed. In addition, N$_2$O plasma treatment after dry etching process of the InGaZnO pattern has a suppression effect for reduction action at the time of interlayer film formation. Moreover, in the dry etching process of the InGaZnO pattern, reductive damage may be introduced from a side wall of InGaZnO by BCl$_3$ gas. However, the semiconductor properties of InGaZnO can be recovered and deterioration of the properties can be suppressed by oxidation of the InGaZnO channel by the N$_2$O plasma treatment after the process.

In transistor properties in FIG. 30, in relation to a level of performing the N$_2$O plasma treatment, a switching property of an off-state current of proximally 10 pA/μm and on-state current of approximately 1 μA/μm is obtained at Vg of 3.3 V and Vd of 1.0 V.

Figure 31:
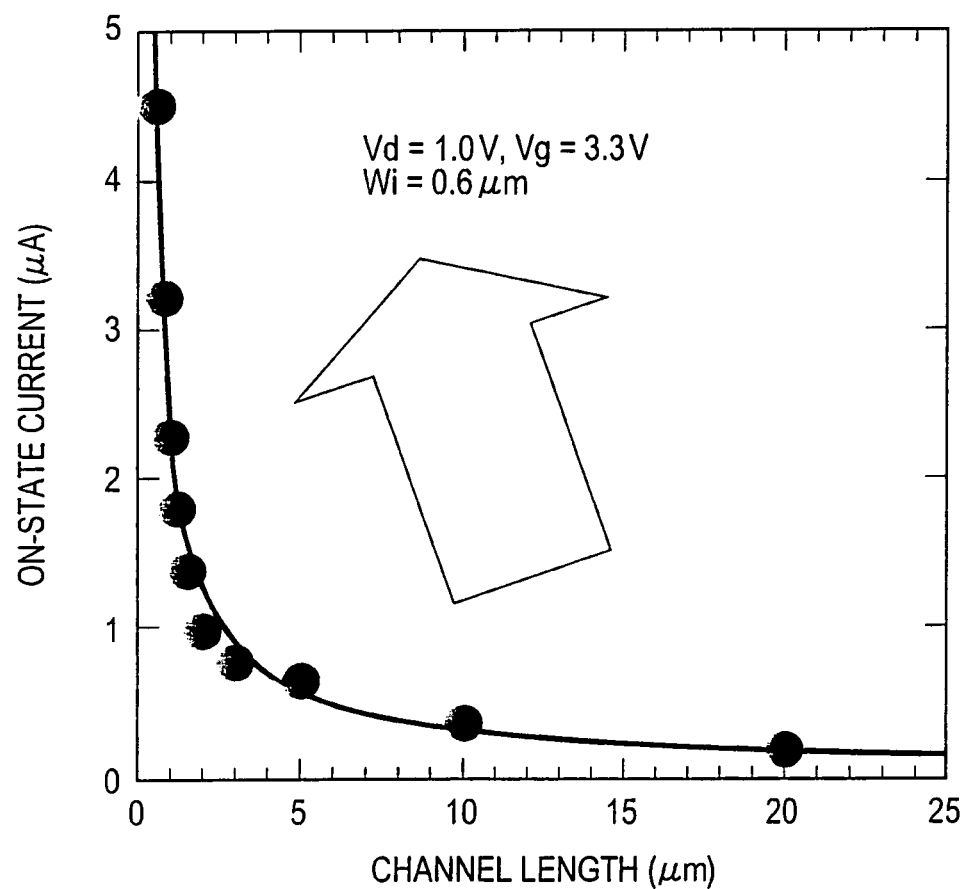
FIG. 31 is a diagram describing operation and effect of the semiconductor device of the present embodiment.

Channel-length dependence of on-state current is shown in FIG. 31. The on-state current at Vg being equal to 3.3 V and Vd being equal to 1.0 A is plotted. Operation power is increased and the on-state current is substantially increased by formation of a microscopic channel length. For example, when L is equal to 20 μm, on-state current is approximately 0.15 μA, while, when microscopic L is equal to 0.6 μm, the on-state current is approximately 4.5 μA. Consequently, the on-state current of the microscopic channel length increases approximately 30 times. By forming very fine InGaZnO channel by dry etching using the hard mask SiO$_2$, the on-state current of the transistor can be increased.

By dry etching of an oxide semiconductor layer using a hard mask, microfabrication of a back-gate type oxide semiconductor element can be performed. Moreover, by in-situ N$_2$O plasma treatment at the time of hard mask and interlayer film formation, deterioration of semiconductor properties of the oxide semiconductor element can be prevented and the microscopic oxide semiconductor element can be formed in the multi-layer wiring.

Ninth Example

Figure 39:
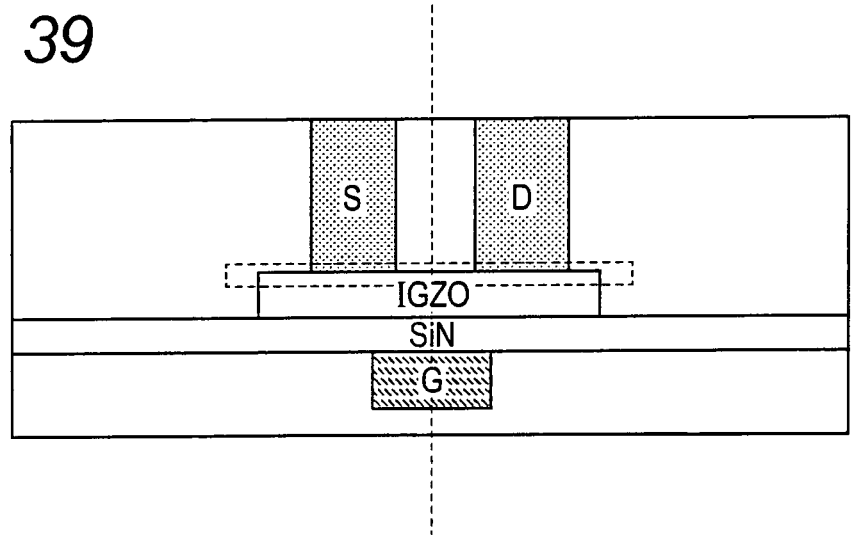
FIG. 39 is a diagram describing operation and effect of the semiconductor device of the present embodiment.
Figure 40:
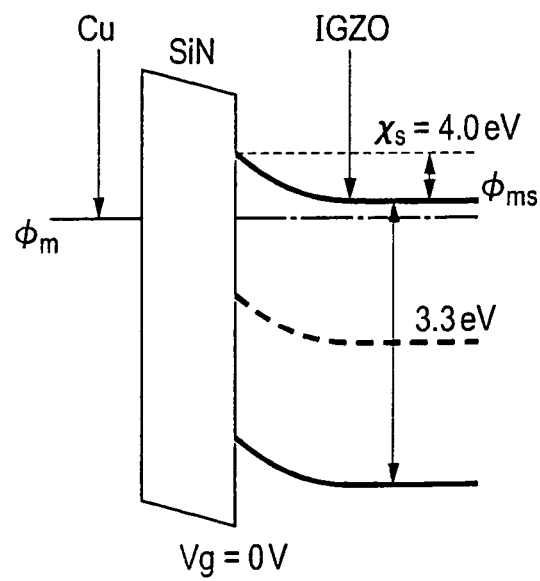
FIG. 40 is a diagram describing operation and effect of the semiconductor device of the present embodiment.

Subsequently, a band-chart in a Cu back-gate type transistor structure of a gate (referred to as "G" in the diagram), a gate insulating film (referred to as "SiN" in the diagram), an oxide semiconductor channel layer (referred to as "IGZO" in the diagram) shown in FIG. 39 is shown in FIG. 40. In addition, a band chart in the direction of the aforementioned transistor structure of the source (referred to as "S" in the diagram), the oxide semiconductor channel (referred to as "IGZO" in the diagram) and a drain (referred to as "D" in the diagram) is shown in FIG. 41.

Figure 44:
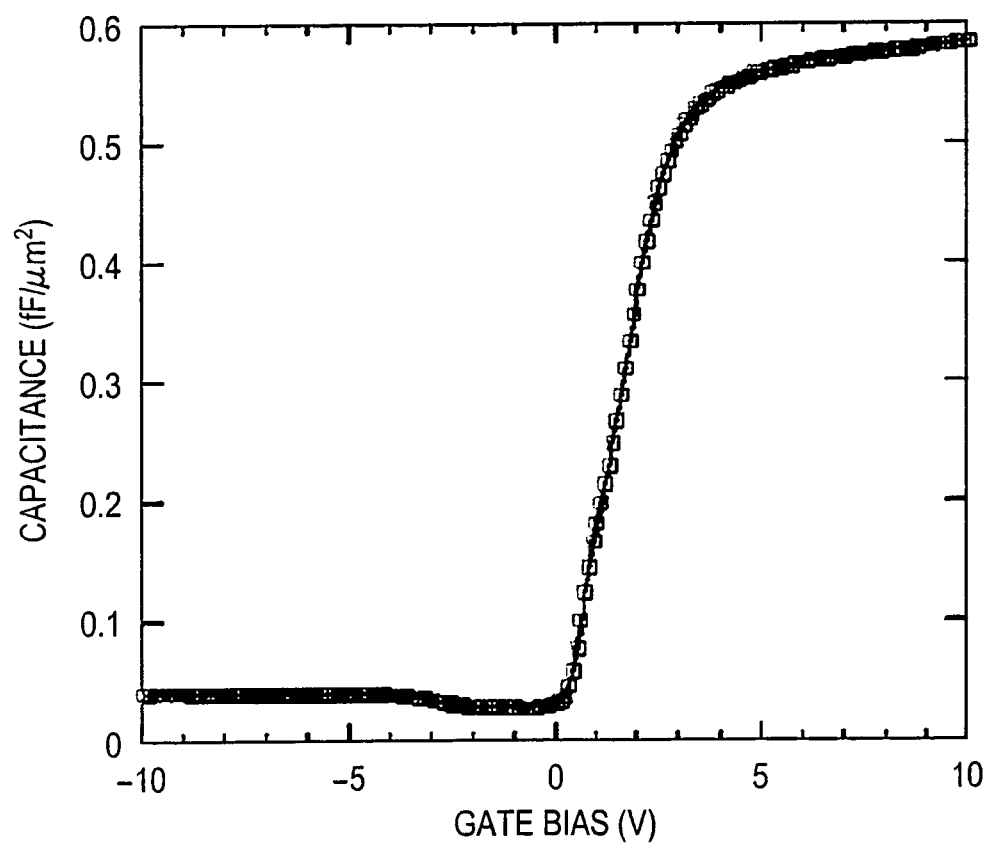
FIG. 44 is a diagram describing operation and effect of the semiconductor device of the present embodiment.

In FIG. 40, a band bending caused by work function difference $\phi_{ms}$ is formed so that a work function of a gate material and Fermi potential of a oxide semiconductor channel layer are made to be the same level. Particularly, when the work function of the gate material is deeper, a depletion layer is formed in the oxide semiconductor channel layer at a gate bias of 0 V and a off-state is generated. When a Cu electrode is used as the gate and IGZO is used as the oxide semiconductor channel layer, a work function of Cu is equal to 4.68 eV, an electron affinity of IGZO being equal to 4.0 eV, and a work function of IGZO being equal to approximately 4.05 eV to 4.2 eV. Since the work function of Cu has deeper level, the band bending as shown in FIG. 40 is formed and the off-state is formed at the gate bias of 0 V. Carrier induced in the gate is increased with applying positive gate bias, and thereby the transistor becomes on state and functions as a transistor having an on-off property. In other words, this transistor can be used as a signal switch or a power source switch. Occurrence of such modulation action can be confirmed from a result of C-V measurement shown in FIG. 44. FIG. 44 is a diagram showing Cu gate bias dependence of a gate capacity in a structure corresponding to the band chart shown in FIG. 40. From FIG. 44, the carriers are depleted at the time of application of negative bias and the carriers are accumulated with application of positive bias. Thereby, it is found that the modulation action is obtained by the gate bias along the band chart of FIG. 40. This is the same meaning in which a carrier concentration in the channel can be controlled by the modulation action of the gate. Consequently, transistor performance is obtained. Therefore, the aforementioned transistor can be used as a signal switch or a power source switch.

Figure 48:
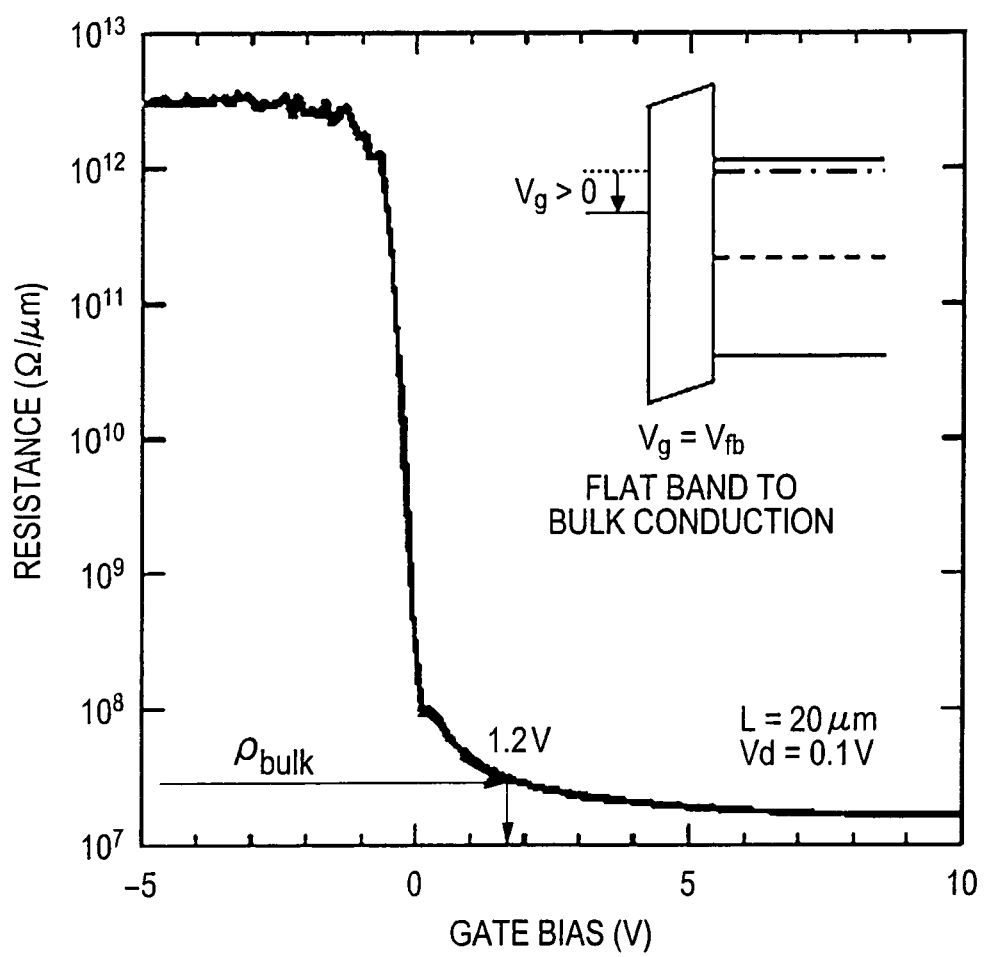
FIG. 48 is a diagram describing operation and effect of the semiconductor device of the present embodiment.

The gate bias dependence of resistance between a source and a drain of the transistor pattern is shown in FIG. 48. The transistor uses a pattern of long channel (L=20 μm), resistance between the source and the drain is almost channel resistance. Here, since modulation of resistance may possibly be caused by the gate bias, depletion of carriers when the gate bias is negative (high resistance state) and accumulation of carriers with application of positive gate bias (low resistance state) possibly occurs. A flat band state is corresponding to a state in which band bending is not generated in the channel, in other words, corresponding to a bulk conduction state of the channel. Here, ρ is equal to 0.1 Ωcm, which is a calculated value of the balk resistance, is extrapolated to this graph. An intersection point of this line and the gate bias is corresponding to the flat band voltage of 1.2 V. The transistor can be said to have a normally-off state, which is an off state when the gate bias is not supplied.

Figure 41:
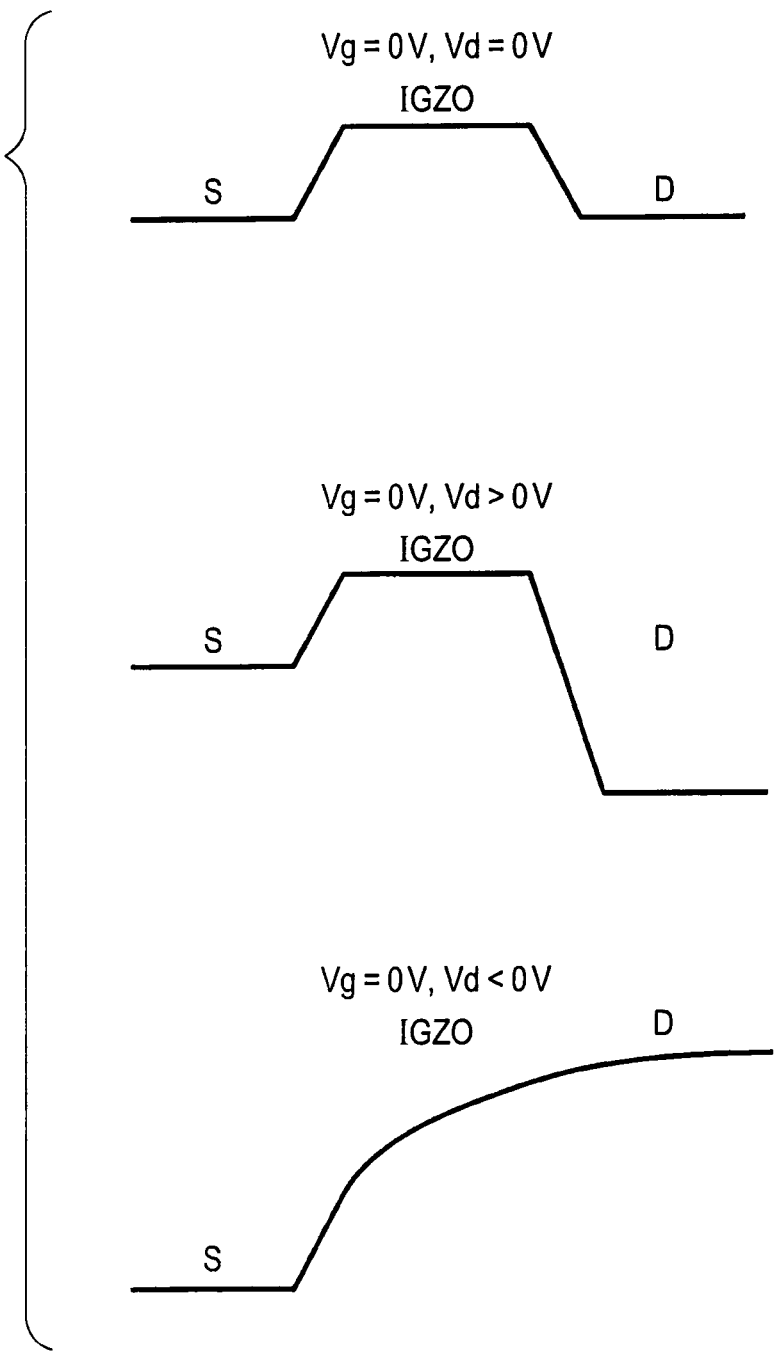
FIG. 41 is a diagram describing operation and effect of the semiconductor device of the present embodiment.

Subsequently, FIG. 41 shows a band chart when voltage is not applied to a gate and a source in the case that an ohmic junction is formed in the source and the drain, and the channel layer. By the band bending as shown in FIG. 40, a conduction band of the IGZO channel is raised in the high energy side by the difference between the electron affinity of the IGZO channel and the work function of the gate. Accordingly, when the contact part of IGZO and the source and the drain is the ohmic junction, a barrier is formed between the source, the oxide semiconductor channel and the drain in the state that voltage is not applied to the source and the drain. This is the barrier which is formed by the band bending of IGZO formed by the work function deeper than the channel of the back gate Cu. Particularly, when the gate does not exist, a part between the source, the oxide semiconductor channel and the drain only functions as a common resistive element. Since the barrier is formed between the source and the, and the IGZO channel drain by the Cu back gate structure, a height of the barrier is modulated, in other words, resistance between the source and the drain is modulated by application of the drain bias when application voltage to the source and the drain is 0 V. Accordingly, the back gate type transistor functions as a diode having rectification property between the source and the drain by drain voltage.

Figure 42:
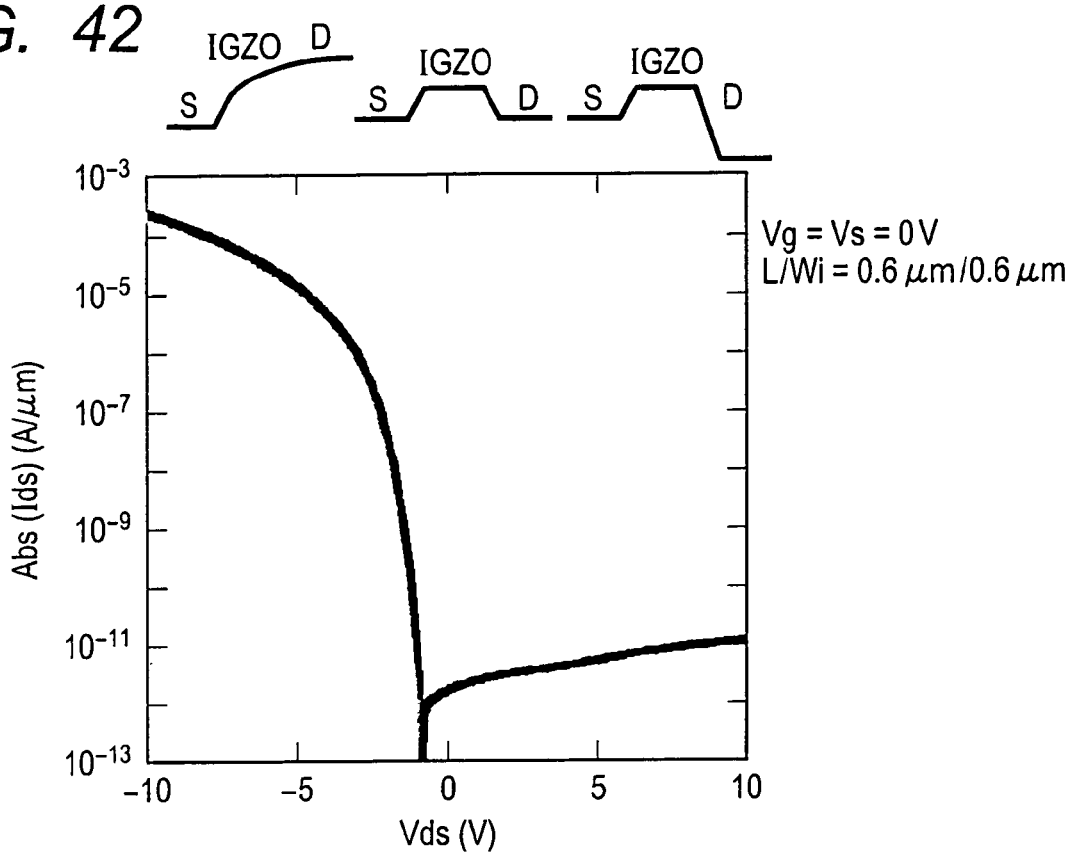
FIG. 42 is a diagram describing operation and effect of the semiconductor device of the present embodiment.

A logarithmic plotting of an absolute value of the current between the source and the drain, and the drain bias dependence is shown in FIG. 42 at L/Wi of 0.6 μm/0.6 μm. When the drain voltage (Vds) is positively applied, the current hardly flows because the conduction band of the drain lowers and the barrier between the drain and the channel becomes high. On the contrary, it is found that the barrier between the drain and the channel becomes small with negatively applying the drain voltage (Vds), and a large amount of current flows. Particularly, this diode has a property of approximately 6 digits in a ratio of off-state current at 0 V and on-state current at the drain voltage Vds of −5 V.

Figure 43:
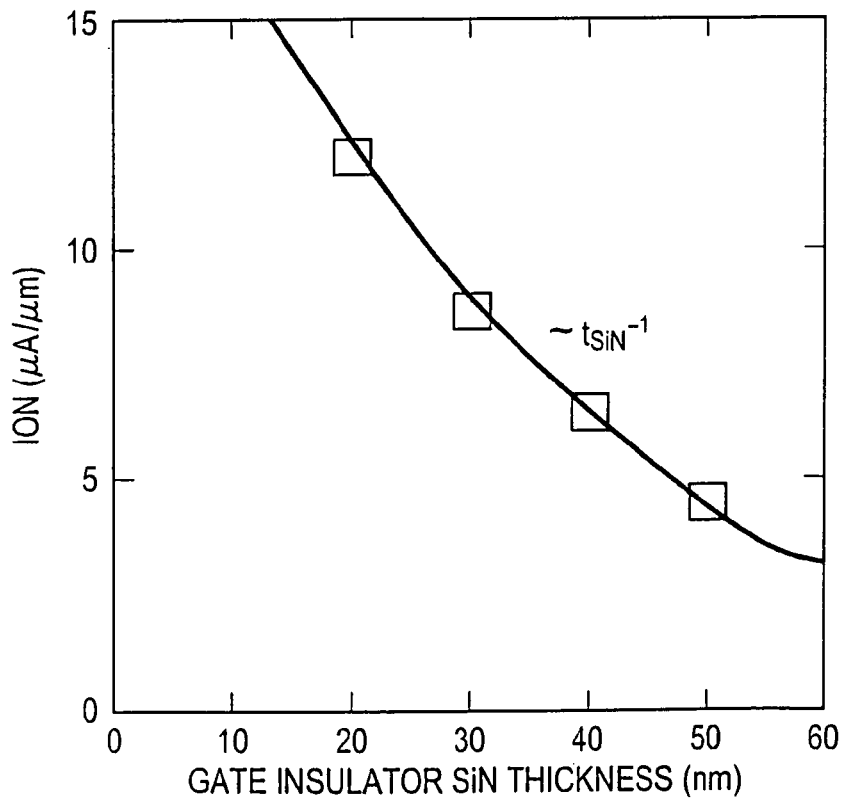
FIG. 43 is a diagram describing operation and effect of the semiconductor device of the present embodiment.

Subsequently, in a transistor structure shown in FIG. 39, when a thickness of the gate insulating film (referred to as "SiN" in the diagram) are set to 20 nm, 30 nm, 40 nm and 50 nm, film thickness dependence of the on-state current and the gate insulating film (referred to as "SiN" in the diagram) at Vds of 1 V and Vg of 3.3 V is shown in FIG. 43. It is found that higher capacity of the gate capacity can be obtained by forming thinner gate insulating film and induced carriers increase depending on the gate capacity. It is found that the gate capacity is inversely proportional to the thickness of the gate insulating film, and from FIG. 43, the on-state current is also improved in approximately proportional to about −1 power of the thickness of the gate insulating film. The inventors also confirm that a gate leak current is $10^{-11}$ A or lower, which does not depend on the film thickness of the gate insulating film.

Figure 45:
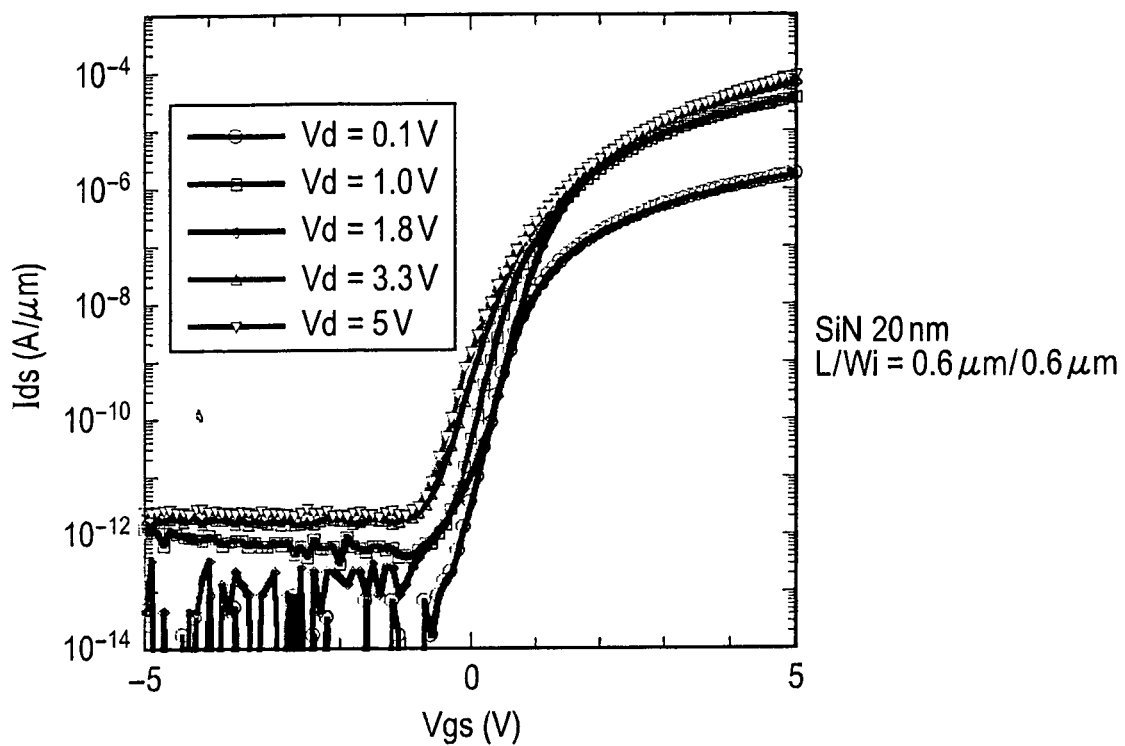
FIG. 45 is a diagram describing operation and effect of the semiconductor device of the present embodiment.
Figure 46:
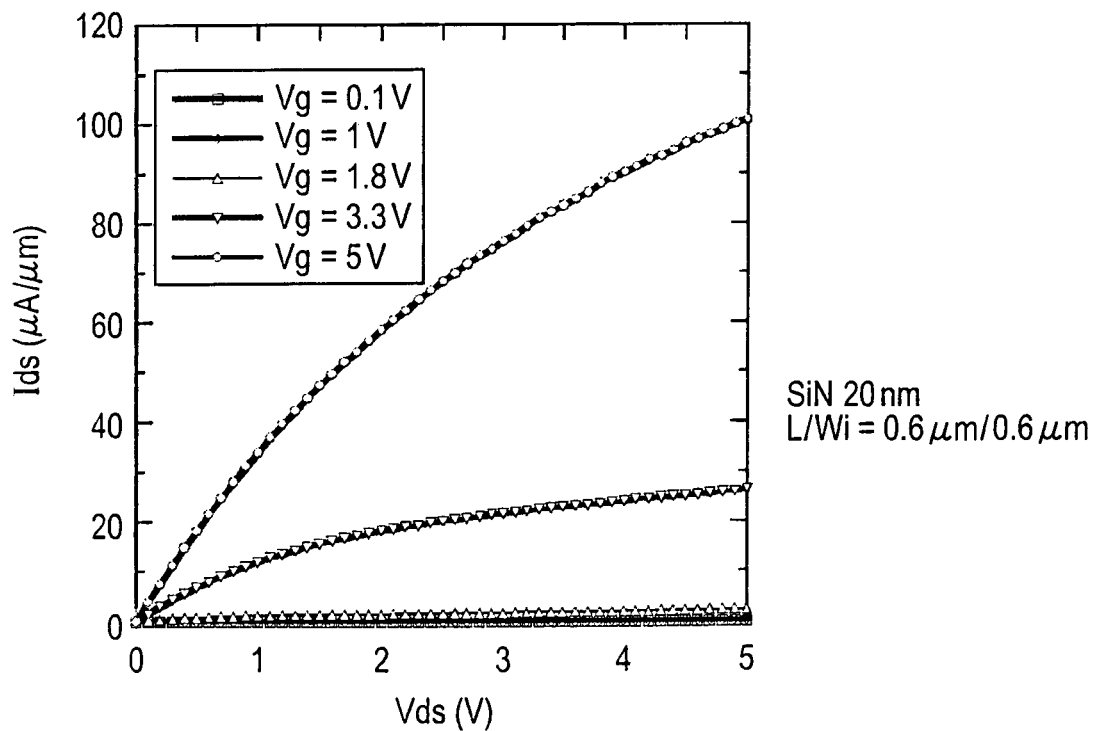
FIG. 46 is a diagram describing operation and effect of the semiconductor device of the present embodiment.
Figure 59:
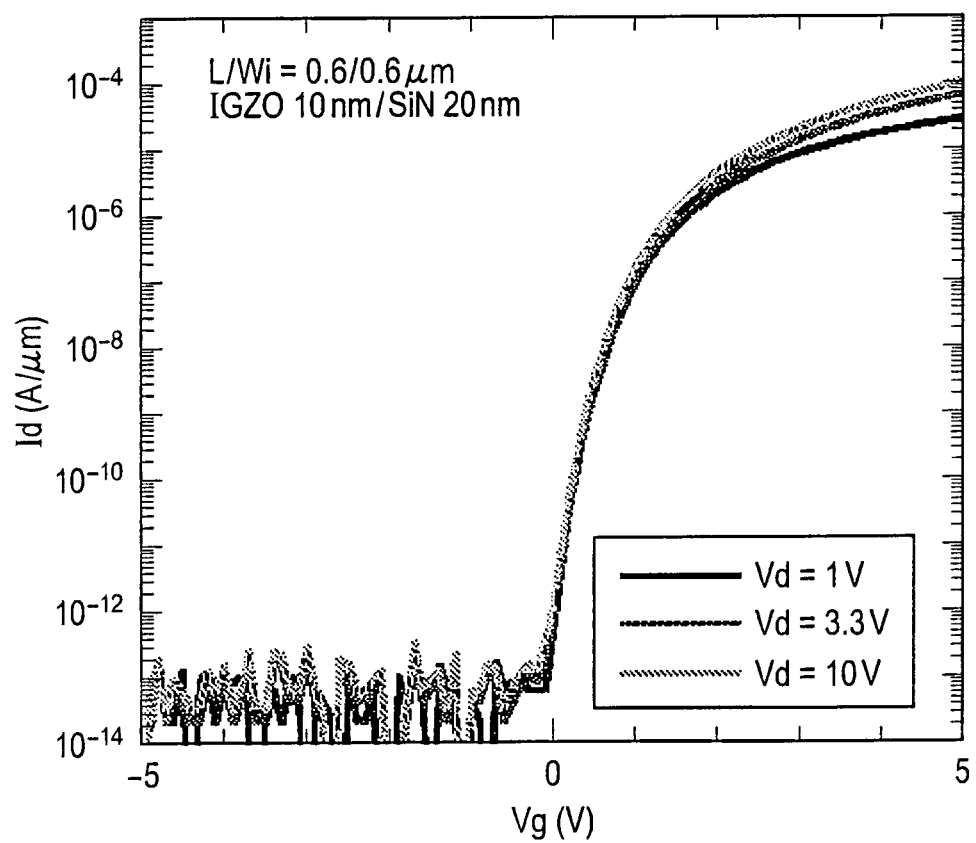
FIG. 59 is a diagram describing operation and effect of the semiconductor device of the present embodiment.

Subsequently, the transistor properties at SiN of 20 nm, L/Wi of 0.6 μm/0.6 μm are shown in FIG. 45, FIG. 46 and FIG. 59. FIG. 45 and FIG. 59 show Vd dependence of Id-Vg plotting and FIG. 46 shows Vg dependence of the Id-Vd plotting. From these diagrams, even a thinned gate insulating film such as SiN having a thickness of 20 nm has no gate leak, and very high efficient transistor performance can be confirmed. Accordingly, the transistor formed in a wiring functions as a power source switch and a signal switch having high efficiency.

Tenth Example

Figure 51:
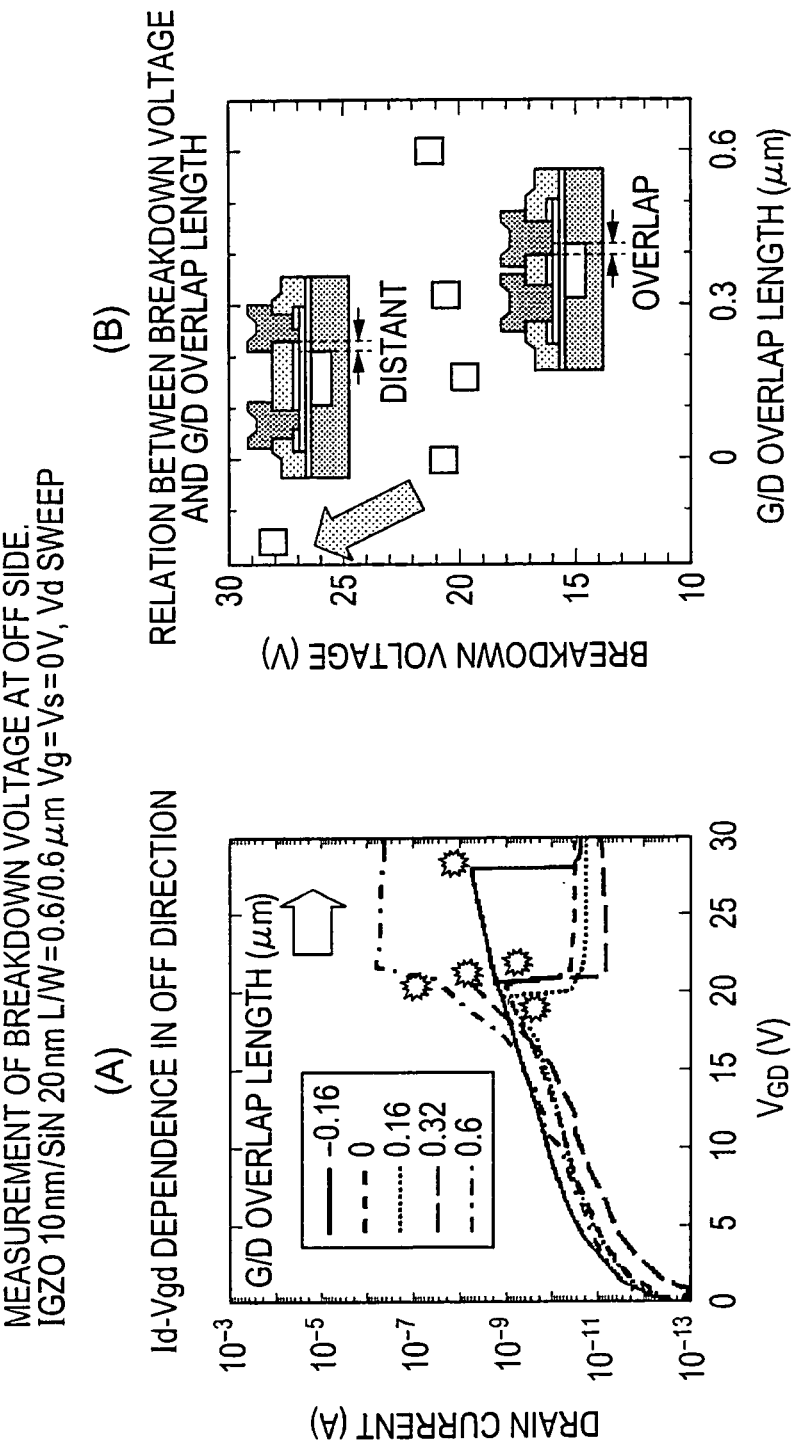
FIG. 51 is a diagram describing operation and effect of the semiconductor device of the present embodiment.

Subsequently, in the semiconductor device having a configuration of shown in FIGS. 49A and 49B, breakdown voltage dependence of the gate insulating film to overlapping size in a plan view of the gate electrode 210 and the first contact region 185' (or the second contact region 185") is shown in FIGS. 51A and 51B. In the diagram, "G/D Overlap length" indicates a distance between the edge of the gate electrode 210 and the edge of the first contact region 185' (or the second contact region 185") in a plan view (d shown in FIG. 49A). When the gate electrode 210 and the edge of the first contact region 185' (or the second contact region 185") is overlapped in a plan view, the value thereof is positive, while when is not overlapped, the value thereof is negative.

As can be seen from FIG. 51A, it is found that when the "G/D Overlap length" has a positive value, the semiconductor device breaks around 20 V, while when the "G/D Overlap length" has a negative value (−0.16 μm in the drawing), the semiconductor device does not break until around 27 V.

Difference in the breakdown voltage is caused as follows. When the "G/D Overlap length" is a positive value, Vd is directly applied to the gate insulating film in an overlapped part between the drain (the first contact region 185' or the second contact region 185") and the gate (the gate electrode 210), while in a structure having no overlapped part, the electric field intensity applied to the gate edge is reduced.

Figure 53:
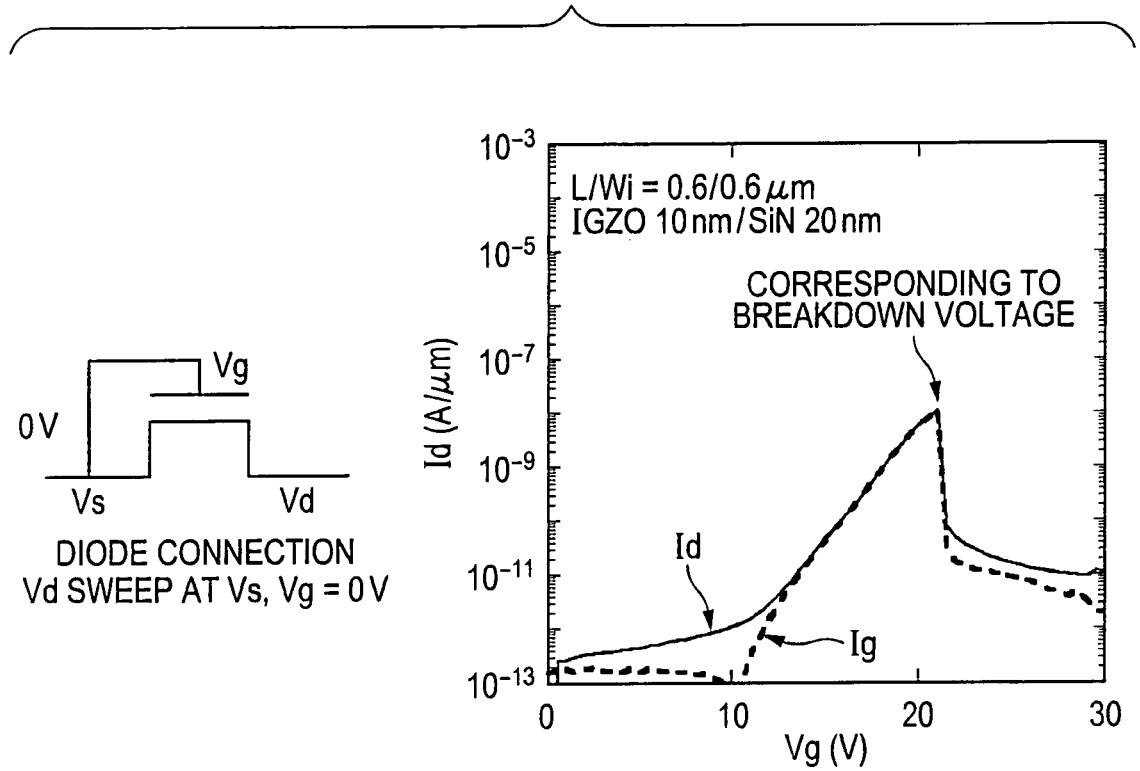
FIG. 53 is a diagram describing operation and effect of the semiconductor device of the present embodiment.

Subsequently, a relation between the drain voltage at the time of diode connection, and off-leak current and gate-leak current of the drain is shown in FIG. 53. It is found that, the gate leak increases with application of the drain voltage and the drain breakdowns simultaneously occur at places where the gate insulating film breakdown occurs. Accordingly, it is found that breakdown voltage of the device of the semiconductor element of the present invention corresponds to the breakdown voltage of the gate insulating film.

Figure 54:
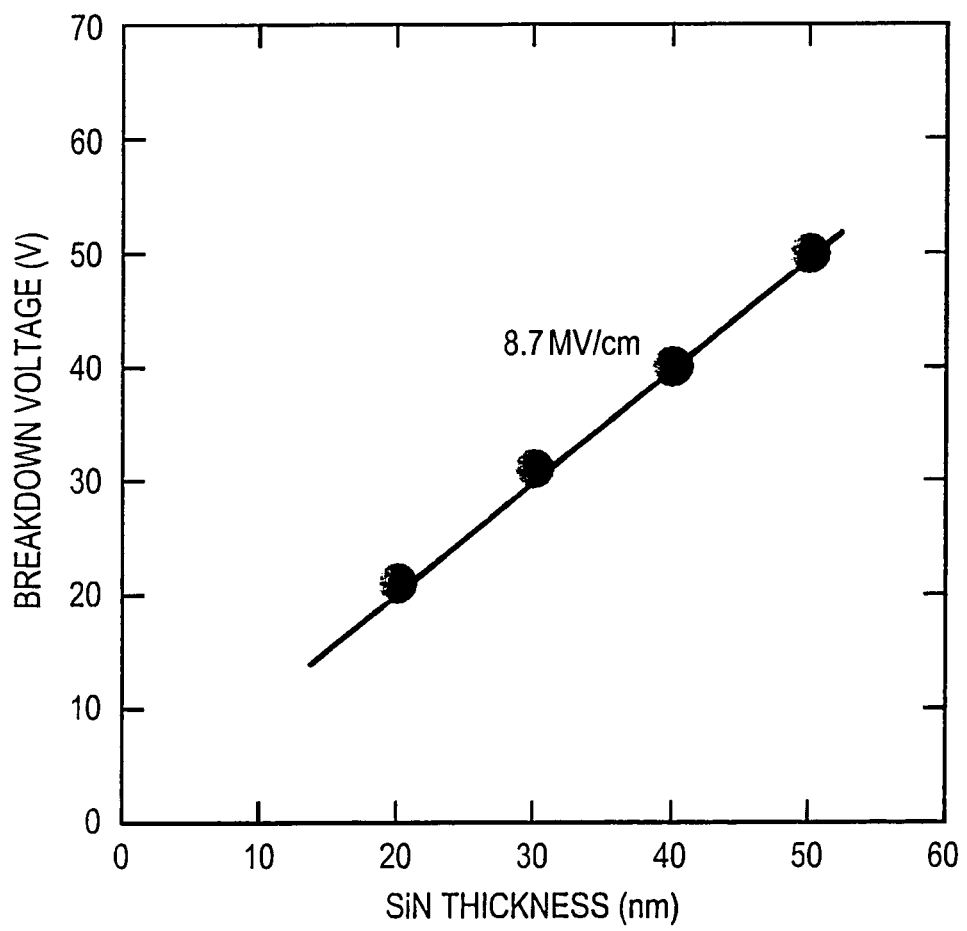
FIG. 54 is a diagram describing operation and effect of the semiconductor device of the present embodiment.

Subsequently, a relation between a thickness of a cap film and gate insulating film SiN and the breakdown voltage of the device is shown in FIG. 54. It is found that, as the SiN becomes thicker, breakdown voltage of the device is improved. This shows that the device breakage is caused by the gate insulating film breakage. When the plotting in FIG. 54 is linearly approximated, breakdown electric field intensity is 8.7 MV/cm. Consequently, the semiconductor element of the present invention can be said to have the high breakdown voltage of the device. It is also possible that a transistor having further high breakdown voltage can be realized by forming a thicker gate insulating film. The device breakdown is not caused by the drain breakdown. Consequently, a high breakdown voltage property is realized even in a structure of short distance between the source and the drain, in other words, the structure having short channel length. Generally, the distance between the source and the gate is widely separated in order to enhance the drain breakdown voltage. On the contrary, in the device of the present invention, since the gate breakdown voltage determines the device breakdown voltage, the high breakdown voltage property can be realized with the distance between the source and the gate remaining in very short. In a microdevice having a channel length L of 0.6 μm and a gate width of 0.6 μm, the above-described high breakdown voltage transistor can be formed in the wiring layer and can be formed in reduced area and low cost. When a further microscopic structure is formed, the high breakdown voltage described in the present invention can be realized.

Figure 55:
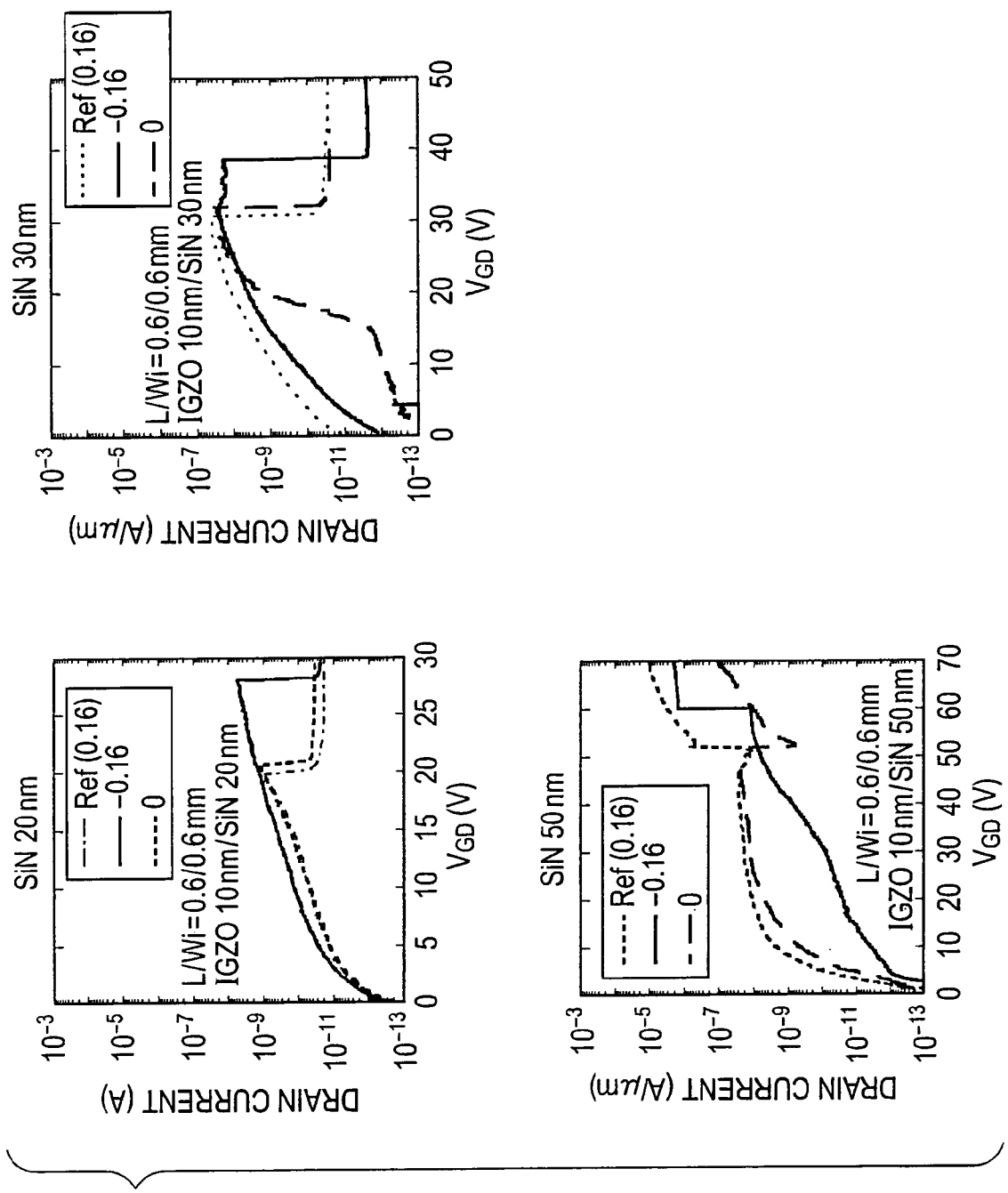
FIG. 55 is a diagram describing operation and effect of the semiconductor device of the present embodiment.

Subsequently, a relation between the off-state current of the drain and drain voltage when design between the gate edge and a drain edge is changed is shown in FIG. 55. As the design, a structure having an overlapped amount of 0.16 μm (FIG. 56A), a structure having an amount of 0 μm (FIG. 56B), and structure of a gate edge and a drain edge being separated by 0.16 μm (FIG. 56C) are used as shown in FIGS. 56A, 56B and 56C.

Figure 56A:
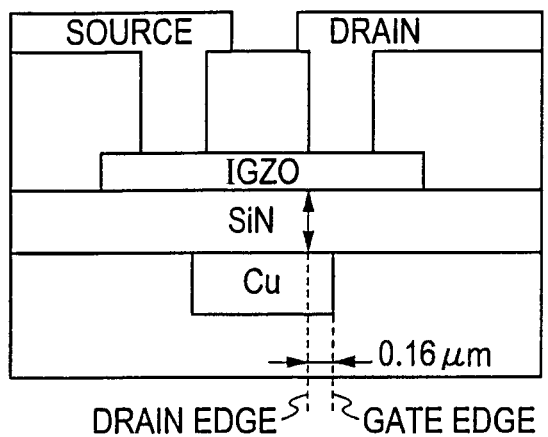
FIGS. 56A, 56B, and 56C are diagrams describing operation and effect of the semiconductor device of the present embodiment.
Figure 56B:
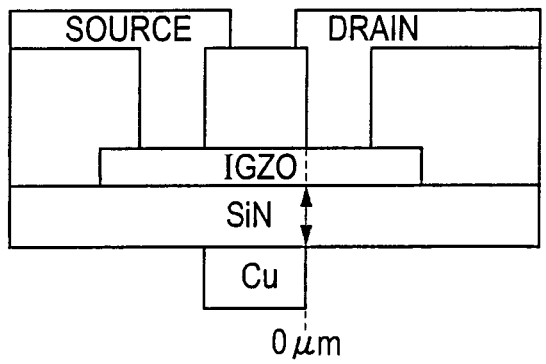
Figure 56C:
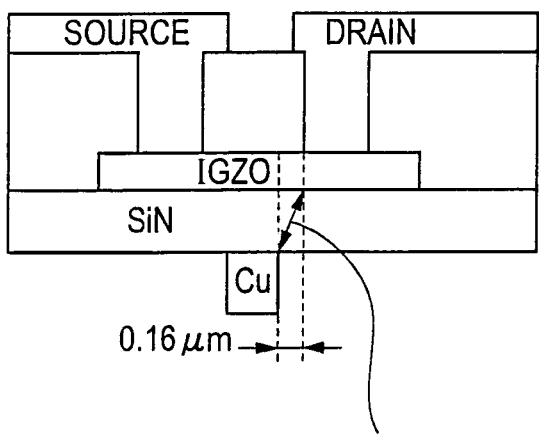

Resulting data of a structure shown in FIG. 56A is shown in FIG. 55 as "Ref (0.16)". Resulting data of a structure shown in FIG. 56B is shown in FIG. 55 as "0". Resulting data of a structure shown in FIG. 56C is shown in FIG. 55 as "−0.16".

It is found that breakdown voltage is the same in a structure in which a distance between the gate edge and the drain edge is not changed, in other words, a structure in which the closest distance is corresponding to a thickness of the SiN film (0, Ref (0.16)). On the contrary, it is found that breakdown voltage of a structure in which the gate edge and the drain edge are separated (−0.16) is shifted to higher voltage than the breakdown voltage of other structures. This is possibly because the electric field intensity applied to the gate edge is reduced at the time of applying drain voltage by separating the drain, and thereby voltage which can be applied to the drain becomes high until the voltage reaches voltage corresponding to the breakdown voltage of the gate insulating film. In the investigation of FIGS. 55A, 55B and 55C, the source and the drain is symmetrically separated from the gate. However, a similar reducing effect of the electric field which is applied to the gate edge at the time of drain voltage application is obtained in a structure in which an overlap exists only between the gate and the source and an overlap is not exist between the gate and the drain. Consequently, a similar improving effect of the breakdown voltage can be possibly obtained. In other words, the effect of the present invention is realized if the distance between the drain and the gate and does not depend on an overlap design between the gate and the source is only widely separated. The wider the distance between the drain and the gate, the lower the electric field intensity applied to the gate edge. Consequently, the breakdown voltage can be substantially improved depending on the distance between the drain and the gate.

Figure 57:
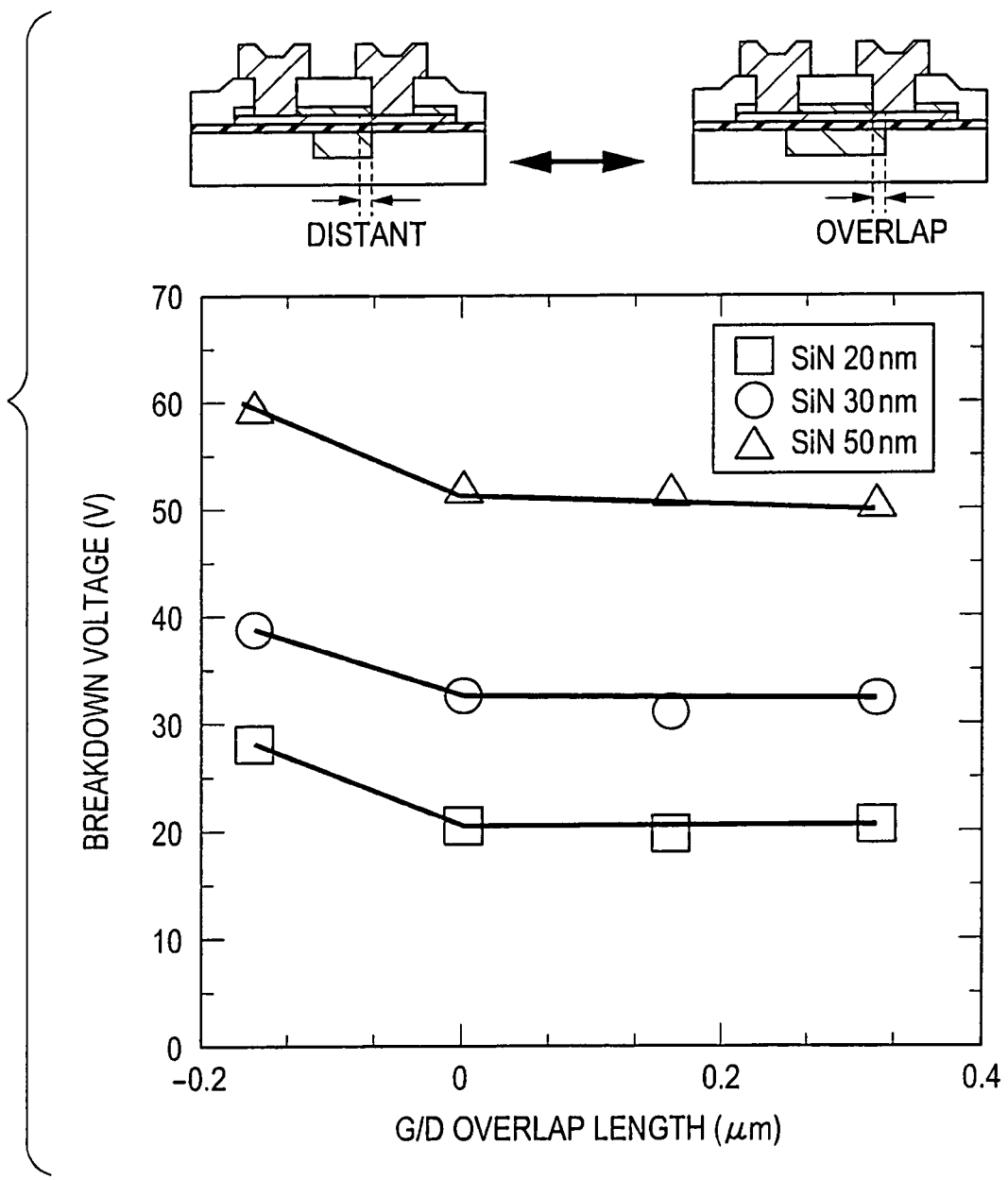
FIG. 57 is a diagram describing operation and effect of the semiconductor device of the present embodiment.

Subsequently, a relation between the overlap design of the gate and the drain and the drain breakdown voltage is plotted in the graph in each film thickness of SiN in FIG. 57. Data of FIG. 57 correspond to data shown in FIG. 51B, and FIG. 57 shows the data when the film thickness of SiN is changed. From the aforementioned data, it is clear that the breakdown voltage is improved by the distance between the drain and the gate. Further improvement effect of the breakdown voltage is possibly obtained by further widely separating the distance between the drain and the gate.

According to the above description, following inventions are also disclosed.

First Invention

A semiconductor device including: a transistor formed over a Si substrate (an on-substrate element); a multi-layer wiring; and a semiconductor element formed in the multi-layer wiring layer (a wiring layer element); in which the semiconductor element (the wiring layer element) has a function of switching operation operated by a first voltage signal inputted from the transistor (the on-substrate element) to a gate terminal which the aforementioned semiconductor element (the wiring layer element) has through the multi-layer wiring; and in which an operation of supplying higher voltage than the voltage of the first voltage signal to an external device coupled to a terminal which the aforementioned semiconductor element (the wiring layer element) has is controlled by the switching operation.

Second Invention

A semiconductor device including: a transistor formed over a Si substrate (an on-substrate element); a multi-layer wiring; and a semiconductor element formed in the multi-layer wiring layer (a wiring layer element); in which the semiconductor element (the wiring layer element) has a function of switching operation operated by a second voltage signal supplied from an external device coupled to a terminal which semiconductor element (the wiring layer element) to a gate terminal which the aforementioned semiconductor element (the wiring layer element) has through the multi-layer wiring; and an operation of supplying lower voltage than the voltage of the second voltage signal to the transistor (the on-substrate element) coupled to a terminal which the aforementioned semiconductor element (the wiring layer element) has through the multi-layer wiring is controlled by the switching operation.

What is claimed is:

1. A semiconductor device comprising:
   in a first region over a semiconductor substrate:
   a first insulating layer located over the semiconductor substrate;
   a first wiring embedded into the surface of the first insulating layer;
   a second insulating layer located over the first insulating layer;
   a third insulating layer located over the second insulating layer; and
   a via and a second wiring embedded into the second insulating layer and the third insulating layer through a barrier metal and coupled to the first wiring, and
   in a second region over the semiconductor substrate:
   the first insulating layer located over the semiconductor substrate;
   a gate electrode embedded into the surface of the first insulating layer;
   the second insulating layer located over the first insulating layer;
   a semiconductor layer located over the second insulating layer;
   the third insulating layer located over the semiconductor layer; and
   a first electric conductor and a second electric conductor embedded into the third insulating layer so as to sandwich the gate electrode in a position overlapped with the semiconductor layer in a plan view through a barrier metal and coupled to the semiconductor layer through the barrier metal.

2. The semiconductor device according to claim 1,
   wherein at least one of a first contact region of the barrier metal contacting to the first electric conductor and the semiconductor layer and a second contact region of the barrier metal contacting to the second electric conductor and the semiconductor layer is not overlapped with the gate electrode in a plan view.

3. The semiconductor device according to claim 2,
   wherein one of the first contact region and the second contact region is overlapped with the gate electrode in a plan view and the other is not overlapped with the gate electrode in a plan view.

4. The semiconductor device according to claim 1,
   wherein the device comprises a plurality of the second regions;
   wherein at least one of a first contact region of the barrier metal contacting to the first electric conductor and the semiconductor layer and a second contact region of the barrier metal contacting to the second electric conductor and the semiconductor layer are not overlapped with the gate electrode in a plan view in a primary second region; and
   wherein both of the first contact region and the second contact region are overlapped with the gate electrode in a plan view in a secondary second region.

5. The semiconductor device according to claim 1,
   wherein the semiconductor layer is an InGaZnO layer, an InZnO layer, a ZnO layer, ZnAlO layer or a ZnCuO layer.

6. The semiconductor device according to claim 1,
   wherein a hard mask comprising one or more of SiN, $SiO_2$ and SiCOH is formed over the semiconductor layer; and
   wherein the first electric conductor and the second electric conductor embedded through the barrier metal penetrates the hard mask.

7. The semiconductor device according to claim 6,
   wherein the hard mask stacks two or more layers of a layer comprising SiN, a layer comprising $SiO_2$, and a layer comprising SiCOH.

8. The semiconductor device according to claim 6,
   wherein the hard mask and the semiconductor layer have approximately the same planar shape.

9. The semiconductor device according to claim 1,
   wherein the barrier metal comprises one or more elements selected from a first group consisting of Ti, Ta, Ru and W.

10. The semiconductor device according to claim 1,
    wherein the via, the second wiring, the first electric conductor and the second electric conductor are comprised of the same material.

11. The semiconductor device according to claim 10,
    wherein the via, the second wiring, the first electric conductor and the second electric conductor comprise Cu; and
    wherein the barrier metal comprises one or more elements selected from the first group consisting of Ti, Ta, Ru and W.

12. The semiconductor device according to claim 10,
    wherein the via, the second wiring, the first electric conductor and the second electric conductor comprise Al; and
    wherein the barrier metal comprises one or more elements selected from the first group consisting of Ti, Ta, Ru and W.

13. The semiconductor device according to claim 1,
    wherein the gate electrode is embedded into the first insulating layer with contacting to the second insulating layer; and
    wherein the first wiring and the gate electrode are comprised of the same material.

14. The semiconductor device according to claim 13,
    wherein the first wiring and the gate electrode comprise Cu.

15. The semiconductor device according to claim 1, further comprising:
    an on-substrate element including an on-substrate gate electrode formed over the semiconductor substrate through a gate insulating film; and a source and a drain formed by doping impurity into the semiconductor substrate; and
    wherein a first wiring layer element including the gate electrode, the second insulating layer, the semiconductor layer, the barrier metal, the first electric conductor and the second electric conductor formed in the second region, and the on-substrate element are electrically coupled.

16. The semiconductor device according to claim 15,
    wherein the first wiring layer element has a function which acts as switching operation caused by a first signal inputted from the on-substrate element electrically coupled to the gate electrode of the first wiring layer element to the aforementioned gate electrode, and supplies higher voltage to a first device coupled to the first wiring layer element than the voltage of the first signal by the aforementioned switching operation.

17. The semiconductor device according to claim 16,
    wherein the first electric conductor of the first wiring layer element is electrically coupled to a first voltage power source which supplies higher voltage than the voltage of the first signal; and
    wherein the second electric conductor of the first wiring element is electrically coupled to the first device.

18. The semiconductor device according to claim 17,
wherein the first contact region of the barrier metal contacted to the first electric conductor and the semiconductor layer are not overlapped with the gate electrode in a plan view.

19. The semiconductor device according to claim 18,
wherein a second contact region of the barrier metal contacted to the second electric conductor and the semiconductor layer are overlapped with the gate electrode in a plan view.

20. The semiconductor device according to claim 15, further comprising:
a second wiring layer element which acts as switching operation caused by a second signal inputted from a second device electrically coupled to the gate electrode of the second wiring layer element to the aforementioned gate electrode, and supplies lower voltage to the on-substrate element than the voltage of the second signal by the aforementioned switching operation.

21. The semiconductor device according to claim 20,
wherein a first electric conductor of the second wiring layer element is electrically coupled to a second voltage power source which supplies lower voltage than the voltage of the second signal; and
wherein the second electric conductor of the second wiring layer element is electrically coupled to the on-substrate element.

* * * * *